(12) United States Patent
Noguchi et al.

(10) Patent No.: US 7,359,274 B2
(45) Date of Patent: *Apr. 15, 2008

(54) SEMICONDUCTOR MEMORY DEVICE

(75) Inventors: Mitsuhiro Noguchi, Yokohama (JP); Akira Goda, Yokohama (JP); Hiroyuki Nitta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/678,632

(22) Filed: Feb. 26, 2007

(65) Prior Publication Data

US 2007/0140036 A1 Jun. 21, 2007

Related U.S. Application Data

(60) Continuation of application No. 11/074,801, filed on Mar. 9, 2005, now Pat. No. 7,184,356, which is a division of application No. 10/696,028, filed on Oct. 30, 2003, now Pat. No. 6,882,592.

(30) Foreign Application Priority Data

| Jul. 31, 2003 | (JP) | ............................. 2003-204508 |
| Sep. 19, 2003 | (JP) | ............................. 2003-328742 |

(51) Int. Cl.
*G11C 8/00* (2006.01)
(52) U.S. Cl. .................. 365/230.03; 365/205; 365/233
(58) Field of Classification Search ........... 365/230.03, 365/205, 233, 189.05
See application file for complete search history.

(56) References Cited

U.S. PATENT DOCUMENTS

| 5,627,786 | A | 5/1997 | Roohparvar |
| 6,028,788 | A | 2/2000 | Choi et al. |
| 6,166,973 | A | 12/2000 | Shinozaki |
| 6,269,034 | B1 | 7/2001 | Shibuya |
| 6,421,272 | B1 | 7/2002 | Noguchi |
| 6,421,294 | B2 | 7/2002 | Hidaka |
| 6,438,066 | B1 * | 8/2002 | Ooishi et al. ............... 365/233 |
| 6,496,428 | B2 | 12/2002 | Ohno et al. |
| 6,507,520 | B2 | 1/2003 | Tsujikawa et al. |

(Continued)

FOREIGN PATENT DOCUMENTS

JP    63-279488    11/1988

(Continued)

*Primary Examiner*—David Lam
(74) *Attorney, Agent, or Firm*—Oblon, Spivak, McClelland, Maier & Neustadt, P.C.

(57) ABSTRACT

A semiconductor memory device includes: a memory cell array having a plurality of data select lines disposed in parallel with each other, a plurality of data transfer line disposed in parallel with each other to intersect the data select lines, and electrically rewritable memory cells laid out at cross portions between the data select lines and data transfer lines; a data select line driver for driving the data select lines of the memory cell array; a sense amplifier circuit connected to the data transfer lines of the memory cell array, for performing data read of memory cells selected by one of the data select lines; and a control circuit used for timing control of data read of the memory cell array, for outputting at least two types of timing signals as being different in accordance with a selected data area of the memory cell array.

17 Claims, 35 Drawing Sheets

U.S. PATENT DOCUMENTS

| | | |
|---|---|---|
| 6,567,328 B1 | 5/2003 | Higuchi |
| 6,882,592 B2 | 4/2005 | Noguchi et al. |

FOREIGN PATENT DOCUMENTS

| | | |
|---|---|---|
| JP | 08-007581 | 1/1996 |
| JP | 11-339486 | 12/1999 |
| JP | 2000-021190 | 1/2000 |
| JP | 2000-76880 | 3/2000 |
| JP | 2000-357395 | 12/2000 |
| JP | 2001-067894 | 3/2001 |
| JP | 2001-167592 | 6/2001 |
| JP | 2001-176290 | 6/2001 |
| JP | 2001-344156 | 12/2001 |
| JP | 2002-150783 | 5/2002 |
| JP | 2002-216470 | 8/2002 |
| JP | 2002-269994 | 9/2002 |
| JP | 2002-373496 | 12/2002 |

* cited by examiner

SEMICONDUCTOR MEMORY DEVICE

CROSS-REFERENCE TO RELATED APPLICATIONS

This application is a continuation of and claims the benefit of priority under 35 USC § 120 from U.S. application Ser. No. 11/074,801 filed Mar. 9, 2005, now U.S. Pat. No. 7,184,356, which in turn is a division of and claims the benefit of priority under 35 USC §120 from U.S. Pat. No. 10/696,028, filed Oct. 30, 2003, now U.S. Pat. No. 6,882,592, and is based on and claims the benefit of priority under 35 USC §119 from Japanese Patent Application No. 2003-204508, filed on Jul. 31, 2003 and prior Japanese Patent Application No. 2003-328742, filed on Sep. 19, 2003, the entire contents of which are incorporated herein by reference.

BACKGROUND OF THE INVENTION

1. Field of the Invention

This invention relates to an electrically rewritable semiconductor memory device.

2. Description of the Related Art

Various types of electrically rewritable non-volatile semiconductor memory devices including electrically erasable programmable read-only memory (EEPROM) chips have been developed. Memory cells of the type having metal oxide semiconductor field effect transistor (MOSFET) structures are such that each cell stores as digital bit information electrical charge which was injected from a channel into a charge accumulation or storage layer through an insulative film by the flow of a tunnelling current, wherein the information thus stored is readable by measurement of a change in conductance of the MOSFET in accordance with the amount of such electrical charge. "NAND" type EEPROMs and "AND" type EEPROMs, inter alia, are the ones with cell units each made up of a serial or parallel combination of a plurality of memory cells. These NAND/AND-EEPROMs are capable of more significantly reducing the number of select transistor gates than that of memory cells, thus offering an ability to much increase the resulting on-chip integration density.

Large-capacity NAND-EEPROMs are typically arranged to have a plurality of cell units laid out in a row direction (that is, data select line direction) and a column direction (i.e. data transfer line direction). A group of the cell units aligned in the row direction constitutes a cell block, which generally becomes a unit for "all-at-a-time" or "all-at-once" data erase. Additionally, the memory cell array of a NAND-EEPROM chip is typically designed to include a normal cell array that is used to perform ordinary or regular data storage and a redundant cell array used for execution of defective column replacement. The redundant cell array is disposed at a one end portion of the normal cell array along the data select line direction. A data select line driver is provided to drive data select lines of each cell block. Regarding this driver, a scheme has been proposed for subdividing driver circuitry into portions which are alternately disposed on the opposite sides of the memory cell array, in order to facilitate on-chip layout design while at the same time equalizing skews between data select lines. In this respect, a typical approach using this concept is disclosed, for example, in Published Unexamined Japanese Patent Application No. 2000-76880 ("JP-A-2000-76880").

Prior known data select line layout schemes and circuit configurations employable in NAND-EEPROM chips are disclosed, for example, in Japanese patent documents JP-A-2000-76880 and JP-A-2001-150784. As for sense amplifier and redundancy circuit arrangements, teachings are found in JP-A-2001-167592 and JP-A-2000-21190 and also in U.S. Pat. No. 6,421,272. A technique for setting an initial setup data storage area in the cell array is disclosed in JP-A-2001-176290.

Increasing the integration density of memory cell array by miniaturizing the cell size of NAND-EEPROM chips while lengthening data select lines for common connection of the control gates of memory cells, the data select lines (gate wiring leads) increase in electrical resistance, resulting in an increase in delay of voltage signal transmission on such on-chip lead wires—namely, "wire delay"—becomes greater. Due to this, a need is felt to specifically design timing pulse signals used to drive the data select lines during read and write sessions in such a way as to provide a specific length of time period required for enabling successful execution of any intended read/write operations relative to all the memory cells as laid out along the data select lines. Unfortunately, this serves as a bar for acceleration of read/write operations. This wire delay problem will be discussed in detail below.

See FIG. 41. This diagram illustrates part of a NAND-EEPROM chip, which includes NAND cell units 49a to 49c that are driven by a single data select line driver 2. The cell units 49a-49b are included in a normal cell array 100 for execution of ordinary data storage, while the other cell units 49c are in a redundant cell array 101. These normal cell array 100 and redundant cell array 101 are operatively associated with data select lines (word lines) WL0 to WL15 and select gate lines SSL and GSL, which are driven by the data select line driver 2 that is laid out on one side of the normal cell array 100.

Here, an explanation will be given under an assumption that a data select line WL14 is presently selected during data reading. This selected data select line WL14 is applied a read voltage Vref that is necessary for cell data determination, whereas the remaining, non-selected data select lines WL0-WL13 and WL15 are given a pass voltage Vread which is required to cause memory cells to turn on without regard to whether the cell data of interest is a logic "0" or "1".

FIG. 42 shows the waveforms of voltage signals appearing at circuit nodes A and B on one nonselected data select line WL15 and also at nodes C and D on the selected data select line WL14 during reading. The voltage waveforms of the other nonselected data select lines WL0-WL13 are almost the same as those of the nonselected data select line WL15. The nodes A and C are the ones that are in close proximity to the data select line driver 2 within the normal cell array 100; and the nodes B, D are the furthest nodes from the data select line driver 2 within the redundant cell array 101.

A voltage of the node A on the data select line WL15 is adjacent to the data select line driver 2 so that it starts up from ground potential GND at a timing t0 and then potentially rises up to Vread almost at timing t1' as indicated by a broken line in FIG. 42. The node B on the same data select line WL15 is far from the data select line driver 2 so that the lead wire's CR time constant is large in value; thus, node B potentially starts up from GND at timing t0 and thereafter rises up to Vread at timing t1, with a delay from timing t1' as indicated by solid line.

In a case that the capacitance between the data select line of interest and a substrate is the most dominant one among all the capacitances of the data select lines concerned, a ratio of (t1'−t0) to (t1−t0) becomes substantially equal to a ratio of a squared value of the length of a portion of data select line which extends from the data select line driver 2 to node A versus a squared length of another portion of the data select line spanning from data select line driver 2 to node B. Hence, as the data select line increases in length, the delay time of potential rise-up increases in proportion to a squared value of the length thereof.

The selected data select line WL14 is kept at the read voltage Vref that is lower in potential than the pass voltage Vread, in responding to receipt of an output of the data select line driver 2. However, at the time of rise-up of pass voltage Vread, the data select line WL14 increases in potential by the presence of capacitive coupling from its neighboring data select lines WL15 and WL13. As shown in FIG. 42, while this voltage increase at the node C near data select line driver 2 is less, the node D that is far from data select line driver 2 is such that its voltage rise-up becomes larger because the wiring capacitance and wire resistance of data select line driver 2 of the neighboring data select lines WL15 and WL13 become larger in value.

At the node A, after the timing t1', the voltage Vread of data select lines WL13 and WL15 is held at a constant value. Due to this, the data select line WL14 exhibits no further voltage increment and is discharged through the data select line driver 2. The node C returns almost to Vref at timing t2'; and the node D returns almost to Vref at timing t2 with a delay therefrom. In a case that the capacitance between the data select line and substrate is the most dominant one among all the data select line capacitances, a ratio of (t2'–t1') to (t2–t1) is substantially equal to a ratio of a squared value of the length of a portion of data select line which extends from the data select line driver 2 to node C versus a squared length of another portion of data select line spanning from data select line driver 2 to node D. Hence, as the data select line increases in length, the delay time of the rise-up of a potential variation of data select line WL14 increases in proportion to the squared value of its length. Since the current of a memory cell is determinable by a difference between the memory cell's threshold voltage and the read voltage Vref, it is necessary to measure the memory cell current exactly after this read voltage Vref becomes constant.

Thereafter, letting the pass voltage Vread drop down to ground potential GND at timing t3, the reading is ended. At this time, the node A of data select line WL15 near the data select line driver 2 potentially decreases to GND at timing t4', while the node B far from data select line driver 2 drops down to GND at timing t4 with a delay therefrom. In case the capacitance between the data select line and substrate is the most dominant among all the capacitances of the data select lines, a ratio of (t4'–t3) to (t4–t3) becomes substantially equal to a ratio of a squared value of the length of a portion of data select line which extends from the data select line driver 2 to node A versus a squared length of another portion of the data select line spanning from data select line driver 2 to node B. Thus, the longer the data select line, the greater the delay time of potential rise-up in a way proportional to the squared value of its length.

As apparent from the foregoing discussion, a time range T2 necessary for memory cell readout of the NAND cell unit 49c that is far from the data select line driver 2 is from t2 to t3; and a time range T1 required for memory cell readout of the NAND cell unit 49a that is near data select line driver 2 is from t2' to t3. Unfortunately with prior art read methods for merely reading the cell units 49a to 49c together at a time, the actual read time is limited to the read time range T2 of NAND cell unit 49c. Thus a longer read cycle time is required.

Although specific pulses during reading are indicated in FIG. 42, the same goes with writing—that is, those memory cells of a NAND cell unit distant from the data select line driver 2 require consumption of longer rise-up and fall-down time periods of a write pulse voltage. Thus, a long write cycle time should be required, which is limited to the memory cells furthest from data select line driver 2.

Further, when using memory cells (spare column) within the redundant cell array 101 to replace a column that includes a defective memory cell or cells within the normal cell array 100, there is a possibility that a defective column of the NAND cell unit 49a nearest to the data select line driver 2 is replaced with a column of the NAND cell unit 49c furthest from data select line driver 2. Hence, it is required to secure or "reserve" large timing margins to thereby guarantee that the intended read and write operations are executable both in the memory cells of the NAND cell unit 49c furthest from the data select line driver 2 and in those of the NAND cell unit 49a nearest to this driver 2.

Having stated above, in semiconductor memory chips of the type having a matrix layout of multiple cell units each having a serial or parallel combination of memory cells, an increase in number of cell units with an increase in length of data select lines does not come without accompanying a penalty: an unwanted increase in time margins as required until settlement of potential stabilization of read and write pulse voltages at certain memory cells far from the data select line driver operatively associated therewith, because of voltage transfer delays occurring due to the presence of capacitive coupling between data select lines and the CR time constant of these data select lines. This makes it difficult to speed up the write and read operations. Furthermore, in the case where the spare column of redundant cell array is used to replace a defective column within the normal cell array, it should be strictly required to settle increased timing margins in such a way as to enable successful achievement of read and write operations at both the memory cells furthest from the data select line driver and those nearest thereto.

SUMMARY OF THE INVENTION

According to one aspect of the present invention, there is provided a semiconductor memory device including:

a memory cell array having a plurality of data select lines disposed in parallel with each other, a plurality of data transfer line disposed in parallel with each other to intersect the data select lines, and electrically rewritable memory cells laid out at cross portions between the data select lines and data transfer lines;

a data select line driver for driving the data select lines of the memory cell array;

a sense amplifier circuit connected to the data transfer lines of the memory cell array, for performing data read of memory cells selected by one of the data select lines; and a control circuit used for timing control of data read of the memory cell array, for outputting at least two types of timing signals as being different in accordance with a selected data area of the memory cell array.

DETAILED DESCRIPTION OF THE EMBODIMENTS

Embodiments of this invention will be explained with reference to the accompanying drawings below.

In the embodiments set forth below, the term "on" of a transistor (i.e., MISFET) refers to a state that the channel between source and drain is electrically conductive by application of a gate voltage higher than the threshold voltage of the transistor. The term "off" refers to a state that the channel between source and drain is electrically non-conductive and thus shut off by application of a gate voltage lower than the threshold voltage of the transistor. The "threshold voltage" of the transistor should be interpreted to mean a gate voltage at which a current flowing between the source and drain becomes equal to: 40 nA×(channel width)/(gate length).

Also note that in the embodiments below, the logic levels are equivalent to those of complementary metal oxide semi-conductor (CMOS) logic circuitry employing a CMOS inverter formed of an N-channel MOS (NMOS) transistor with positive threshold voltage and a P-channel MOS (PMOS) transistor with negative threshold voltage. Except as otherwise provided in the description, the logic "H" is within a range of positive voltages higher than the threshold voltage of NMOS transistors (for example, ranging from 0.5 to 15V), whereas the logic "L" is a level less than the threshold voltage. Although in the embodiments stated below the voltage values corresponding to "H" and "L" are sometimes indicated by "Vcc" and "GND" (or "Vss") respectively, these may be any voltages that fall within a range of from Vcc/2 to Vcc and a range of Vcc/2 to 0V, respectively, where Vcc is the power supply voltage. Even when using transistors with negative threshold voltages, these transistors are designed so that their threshold voltages fall within a variable range of the gate voltage.

Embodiment 1

Figure 1:
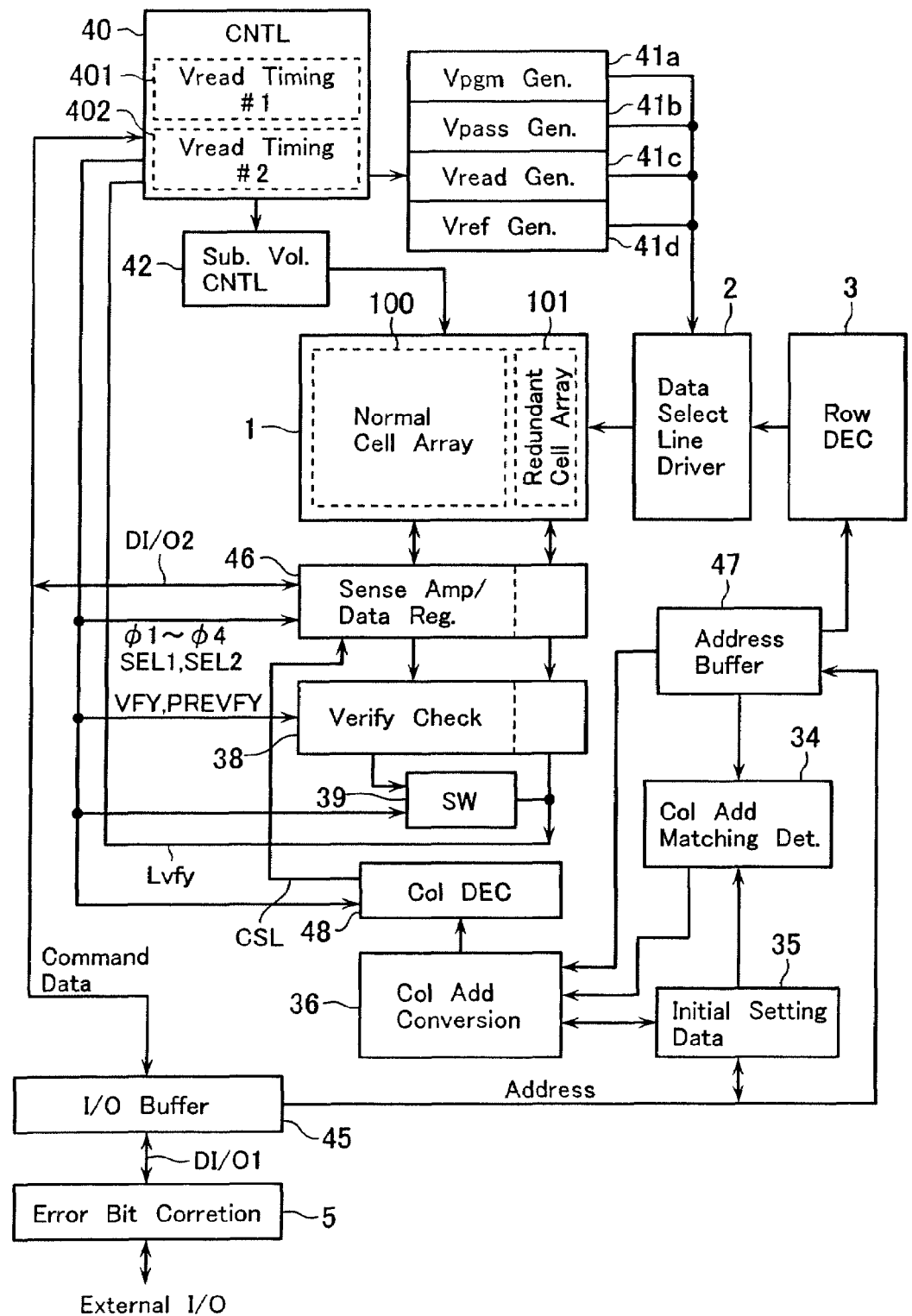
FIG. 1 is a diagram showing, in functional block form, a configuration of an electrically erasable programmable read only memory (EEPROM) chip in accordance with an embodiment of this invention.

FIG. 1 illustrates, in functional block form, an internal configuration of an electrically erasable programmable read-only memory (EEPROM) chip in accordance with an embodiment of the invention.

The illustrative EEPROM includes a memory cell array 1. The memory cell array 1 has a main cell array 100 which is referred to as a "normal data area" (first area) for storing therein the data as given from external input terminals I/O. The memory cell array 1 also has a redundant cell array 101 which is used as a "redundant area" (second area). The redundant cell array 101 is laid out on one end side of the normal cell array 100 along the row direction—that is, at a specific location in close proximity to a data select line driver 2 which drives data select lines of the memory cell array 1.

In the case of this embodiment, the redundant cell array 101 is a "redundant area" for use as a spare column cell area used for replacement of a column of the normal cell array 100 which includes a defective memory cell or cells, an error correcting code (ECC) recording area for recording ECC of the data being written into the normal cell array 100, and a flag storage area for storing entire erase and write states of the memory cells. Note that this invention is effective in the case of inclusion of at least one of these redundant areas or regions.

A sense amplifier circuit 46 is provided for detecting or sensing data of data transfer lines of the memory cell array 1 or alternatively for holding write data therein. The sense amplifier circuit 46 also functions as a data register and is generally made up of data latch circuits as will be described in detail later. The sense amplifier circuit 46 is connected through an internal data line DI/O2 to a data input/output buffer 45. Electrical interconnection between them is controlled by an output of a column decoder 48, which receives an address signal from an address buffer 47 via a column address conversion circuit 36, thereby enabling achievement of writing of the data as given to the data input/output buffer 45 into the memory cell array 1 and also passing readout data to the data input/output buffer 45.

A row decoder 3 is provided to perform memory cell selection of the memory cell array 1, more specifically, to provide control of the data select lines and select gate lines (block select lines) in a way as will be described later. A data select line driver 2 is typically a switch circuit which is responsive to receipt of an output of the row decoder 3 for applying various kinds of output voltage signals to a data select line and/or a select gate line associated with a memory cell that is subjected to writing or reading. In this embodiment the data select line driver 2 is disposed only at one end side of the memory cell array 1 in the row direction—that is, on the redundant cell array 101 side.

A substrate potential control circuit 42 is provided to control the potential level of a p-type substrate (or alternatively a p-type semiconductor well region) in which the memory cell array 1 is formed, and especially is arranged to output during data erasing an erase voltage which is potentially raised or "boosted" so that its potential is higher than or equal to 10V. A high voltage generation circuit 41 (including circuit modules 41*a* to 41*d*) is operable to generate a variety of kinds of voltages used for writing and reading of the memory cell array 1. More specifically, the high voltage generator circuit 41 has a Vpgm generator circuit 41*a* for generating a write or "program" voltage Vpgm which is potentially boosted from the power supply voltage and which is given to a presently selected memory cell when performing data write, a Vpass generator circuit 41*b* for producing a write-use intermediate voltage (pass voltage) Vpass to be given to non-selected memory cells in data write sessions, a Vread generator circuit 41*c* for generating a read-use intermediate voltage (pass voltage) Vread to be given to nonselected memory cells during data reading, and a Vref generator circuit 41*d* for giving a read voltage Vref used to perform determination or judgment of the threshold voltage of a selected cell during reading.

The high voltage generator circuit 41 is under the control of a control circuit 40 in such a way that any required voltage output is applied to the data select line driver 2 in each state of write, erase and read. The write voltage Vpgm is a voltage with its potential higher than or equal to 6V and yet less than or equal to 30V. The write pass voltage Vpass is a voltage with its potential ranging from 3 to 15V. The read pass voltage Vread is a voltage with a potential ranging from 1 to 9V. In the case of the NAND type memory cell array, the pass voltage Vread is designed as a specific voltage which is potentially higher by approximately 1V than an upper limit of the threshold voltage for logic "0" data write. This is desirable in order to permit the flow of a sufficiently increased amount of read cell current while at the same time lowering any possible disturb at nonselected cells. The read voltage Vref is set at a midway point of the threshold voltage distributions of data "1" and "0" at the time of ordinary or regular reading, sometimes called the "normal" read. For example, in the case of data storage with data "1" as a negative threshold voltage state and with data "0" as a positive threshold voltage state, the read voltage Vref at the time of normal reading may be set at 0V. During write-verify-read, this read voltage Vref is set at a lower limit value of the threshold voltage distribution of "0" data.

The control circuit 40 performs the above-noted control for high voltage generation and also performs read operation control and write and erase sequence control based on command input. For the purpose of this, various kinds of timing control signals are supplied from the control circuit 40 to the sense amplifier circuit 46 and verify check circuit 38 and others. In this embodiment the control circuit 40 is arranged to include two different types of read timing circuits 401 and 402 in order to provide controls so that the pass voltage Vread being output from the Vread generator circuit 41*c* differs in time width in a way responding to which one of the storage areas is presently selected within the memory cell array 1 during reading.

In the entire embodiments described hereinafter, preparing the above described two types of timing circuits, it is possible to selectively read out the redundant cell array with a higher-speed than the normal cell array even if data column lengths of continuously read out data from the normal cell array and redundant cell array are set as being equal to the prior art.

The verify check circuit 38 is a circuit operable to determine or "judge" the completion of a write operation in response to a result of verify-read for verification of a present data write state. Data write is such that a write cycle including a write pulse voltage application operation and its following verify-read operation will be repeated until writing of all the cells to be selected simultaneously is completed. The verify check circuit 38 is the one that is used to determine whether writing of every selected cell is completed as a result of the verify-read. In the case of this embodiment, a verify check output Lvfy is a signal which is at "Low" or "L" level when the writing of all the selected cells is completed and which goes to "High" or "H" level when a write-deficient cell remains.

The control circuit 40 is responsive to receipt of this verify check output, Lvfy, for terminating a presently executed write sequence or alternatively performing control of the next write cycle. The verify check circuit 38 includes a check output terminal unit that has a plurality of verify check output terminals corresponding to the normal cell array 100 in the memory cell array 1 and an output terminal corresponding to the redundant cell array 101. These terminals are commonly connected together by a check output line, in which a switch element 39 is provided for selective disconnection between the multiple check output terminals corresponding to the normal cell array 100 and the output terminal corresponding to the redundant cell array 101. The functionality of this switch element will be set forth in detail later.

In an initial setting data storage circuit (defective address storage circuit) 35, a defective column address or addresses is/are programmed in order to perform defective column replacement of the memory cell array 1. A column address identity detection circuit 34 is provided for performing detection of whether an input address coincides with or matches any one of the defective column addresses being presently held in the defective address storage circuit 35 to thereby adequately control the column address converter circuit 36.

An error bit correction circuit 5 is provided between the data output buffer 35 and the external I/O terminals.

Figure 2A:
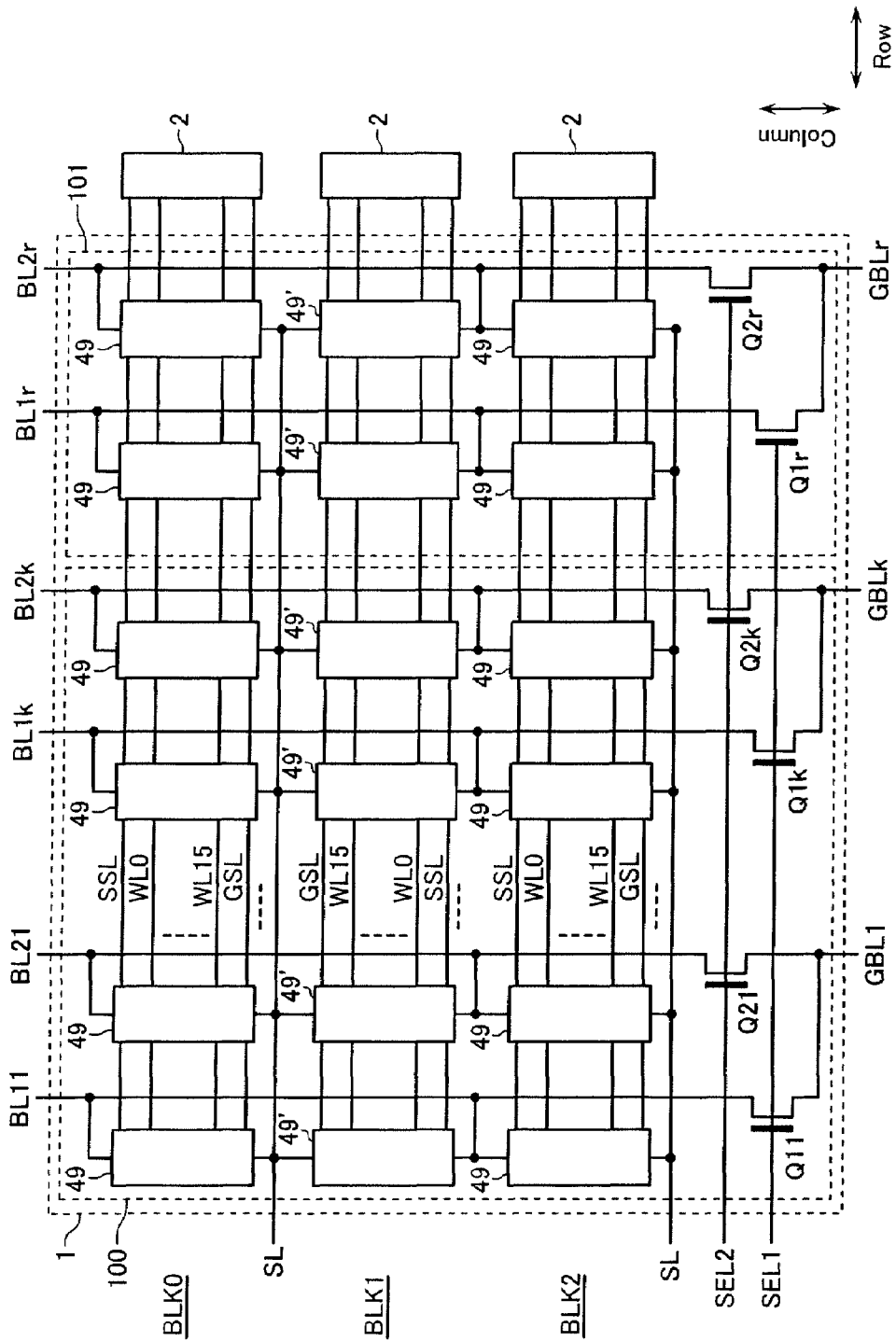
FIG. 2A is a diagram showing a configuration of a memory cell array of the EEPROM; and, FIG. 2B shows a configuration of circuitry including a sense amplifier circuit and a verify check circuit of the EEPROM.
Figure 2B:
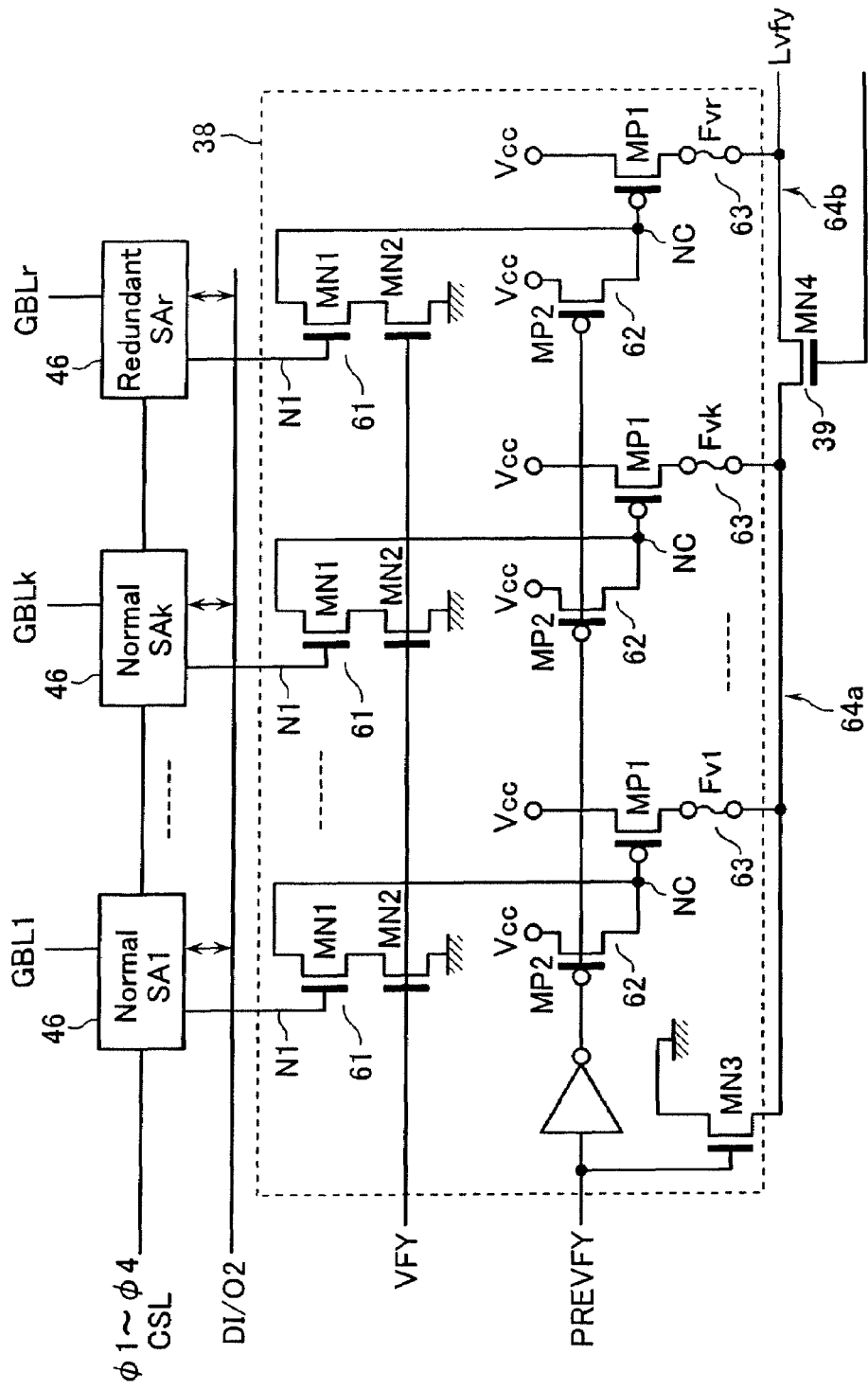

FIG. 2A depicts a more detailed configuration of part of the memory cell array 1, and FIG. 2B shows an internal configuration of circuitry including the verify check circuit 38 and its associated sense amplifier circuits 46. As shown in FIG. 2A, a matrix layout of rows and columns of cell units 49 and 49' is such that each cell unit includes a single or a plurality of pages therein and serves as a group of memory cells that are erasable simultaneously. Typically NAND type or AND type cell units are used. An example is that in case the erase time period of a page of memory cells is longer than the write time thereof as in flash memory cells with a charge storage layer, the individual cell unit is arranged to include therein a plurality of pages, all of which are erased together at a time. This is desirable because a write time per cell unit and an erase time per cell unit may be made equivalent in length to each other, thereby making it possible to improve performances of data transfer and erase rates on the system side.

Each row of cell units 49, 49' is associated with data select lines (word lines) WL0 to WL15 and select gate lines SSL and GSL. In this embodiment, cell units 49 and 49' aligned in a column direction are made equal in capacitance, although these cell units may be different in capacitance from each other. In this embodiment, the cell units 49, 491 make use of NAND cell units shown in FIG. 32. A plurality of memory cells M0 to M15 are connected in series, with their gates being driven by different data select lines WL0 to WL15, respectively. As shown in FIG. 2A, on the right side of the data select lines WL0-WL15 with such multiple cell units 49, 49' connected thereto, data select line drivers 2 are disposed for driving these data select lines. A group of those cell units 49, 49' that are coupled to the data select lines being connected to a single data select line driver 2 makes up a cell block BLK (BLK0, BLK1, . . . ) which becomes a range of all-at-once data erase—that is, all memory cells within this range are erasable together at a time. Accordingly, the memory cell array 1 is subdivided or partitioned into a plurality of cell blocks BLK in the direction of data transfer lines BL.

Figure 32:
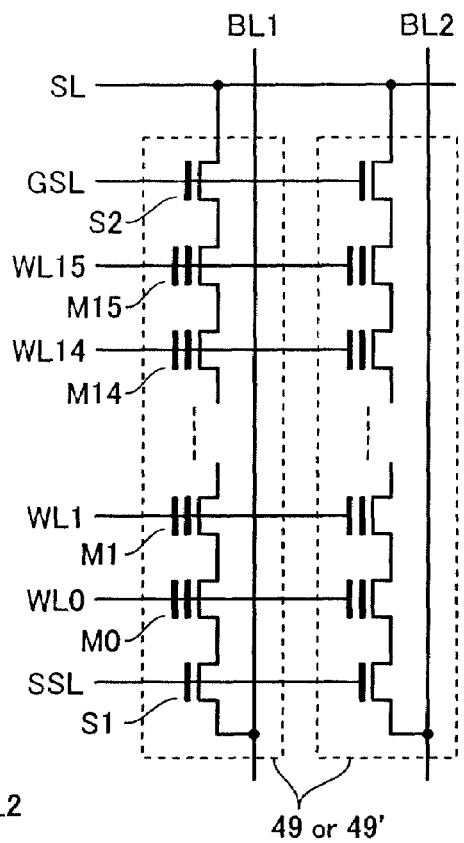
FIG. 32 is an equivalent circuit diagram of a cell unit of the NAND type, which is employable in the respective embodiments stated above.

As shown in FIG. 32, the individual cell unit 49 or 49' has its one end which is connected to a first data transfer line (bit line) BL through a select gate transistor S1 and the other end which is connected to a second data transfer line (source line) SL via another select gate transistor S2. Data transfer lines BL are provided to cross over or "intersect" the data select lines WL0-WL15 at right angles. Select gate transistors S1 and S2 are respectively connected at their gates to select gate lines SSL and GSL for block selection use, which extend in parallel with the data select lines WL0-WL15.

The memory cells M0-M15 within each cell unit 49, 49' are formed at respective cross-points or intersections between the data transfer line BL and data select lines WL0-WL15, wherein each cell is capable of storing data and being read independently of the others. In the case of this embodiment the memory cells M0-M15 are transistors each of which has a charge storage layer and indicates a data bit based on the amount of electrical charge being presently accumulated on such charge storage layer. As this embodiment supports the applicability to flash memories, all the memory cells within the cell unit 49 or 49' are erased at a time—say, all-at-once erased—so that every cell is set in the "1" data state with a negative threshold voltage; thereafter, a "0" data write operation is performed for letting any necessary memory cell become higher in threshold voltage, in accordance with the write data.

Figure 35:
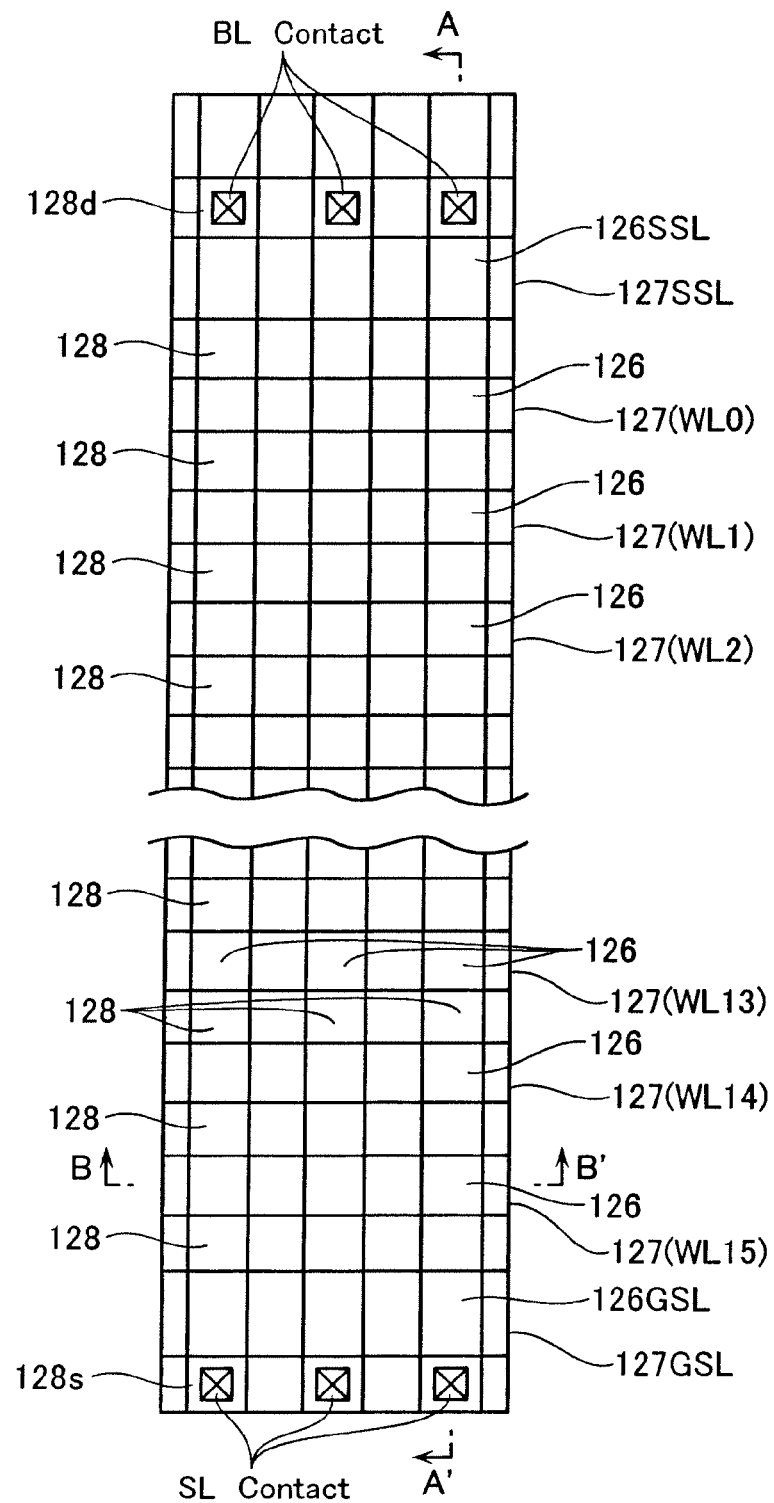
FIG. 35 is a plan view of the NAND type cell unit.
Figure 36:
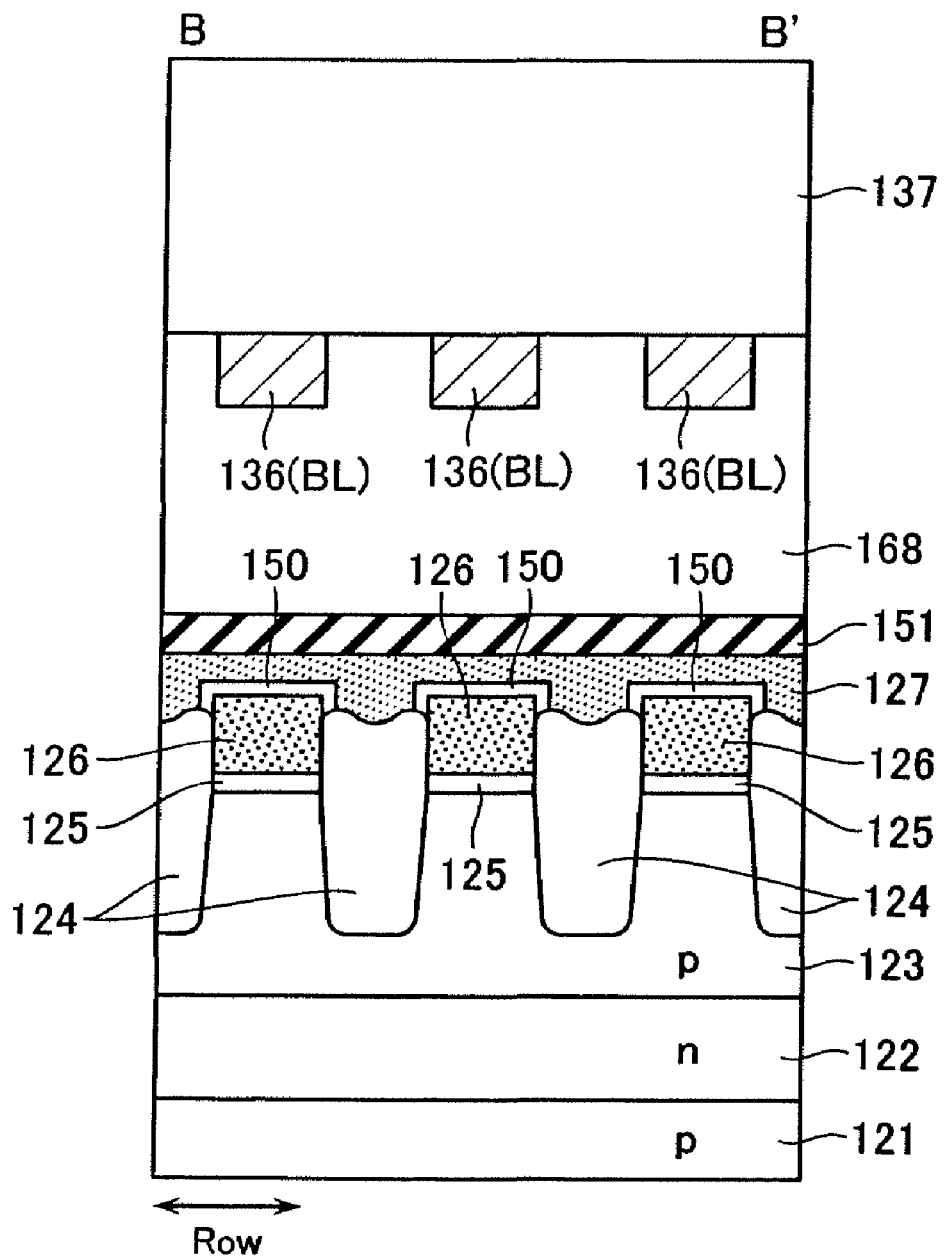
FIG. 36 is a cross-sectional diagram of the cell unit of FIG. 35 as taken along line B-B' in the case of using floating gate type memory cells.
Figure 37:
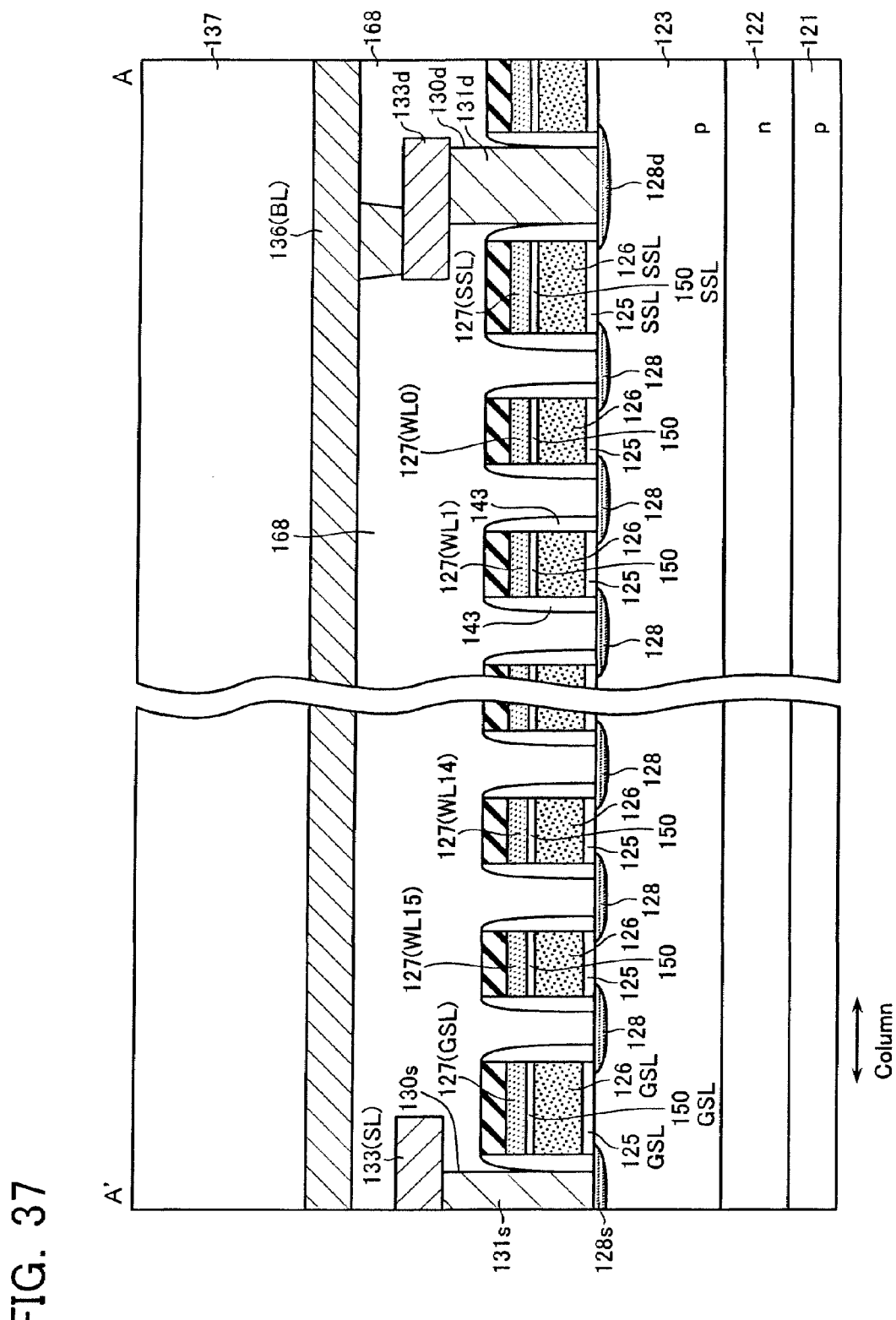
FIG. 37 is a sectional diagram of the FIG. 35 cell unit as taken along line A-A' in the case of using the floating-gate memory cells.

A practically reduced NAND cell unit configuration is shown in FIGS. 35 to 37. FIG. 35 illustrates a layout of parallel portions of three adjacent cell units in the row direction. Here, only the planar structure underlying control gates 127 is depicted in order to facilitate the understanding of cell structures. Non-volatile memory cells, each of which is formed of a MOS transistor having its charge storage layer 126, are formed on a semiconductor well region of p-type conductivity in a silicon substrate. These memory cells are connected at their control gates 127 to the data select lines (word lines) WL0-WL15, respectively. To select a single cell unit from among the plurality of cell units disposed along a data transfer line (bit line) BL and then connect it to the data transfer line, the select gate transistors S1, S2 are connected at their gate electrodes to the select gate lines SSL and GSL respectively.

The select gate lines SSL and GSL are formed by a conductor of the same layer as the control gates 127 and charge storage layers 126 of the memory cells and are provided and disposed in parallel with the data select lines WL. Although in this embodiment the cell unit 49 is arranged to have two select gate transistors, similar results are obtainable with at least one of them provided. Also note that while one specific example with the cell unit 49 including sixteen (16) memory cells is shown herein, the number of those memory cells to be connected to a data transfer line and data select lines may be set at two or greater. Generally, it is desirable from a view point of address decode designs that the cell number be set to $2^N$ (where, "N" is a positive integer).

FIGS. 36 and 37 are cross-sectional views of the cell array structure shown in FIG. 35, as taken along line B-B' and A-A', respectively. The illustrative cell array is formed in a p-type semiconductor well region 123 of a silicon substrate 121, wherein this well 123 is from $10^{14}$ to $10^{19}$ cm$^{-3}$ in boron (B) concentration. Practically in the p-type well 123, patterned floating gates 126 (including the select transistor gates 126SSL, 126GSL) for use as charge storage layers are formed so that each has its underlying tunnel gate dielectric film formed of a silicon oxide film (or alternatively, oxynitride film) 125 with a thickness of about 3 to 15 nanometers (nm). The floating gates 126 are made of polycrystalline silicon or "poly-silicon" with a chosen impurity—phosphorus (P) or arsenic (As)—doped to a concentration ranging from $10^{18}$ to $10^{21}$ cm$^{-3}$.

The individual floating gate 126 is formed in an element formation region of the p-type well 123 which is partitioned by an element isolation dielectric film 124 made of silicon oxide in such a manner that the gate is self-aligned therewith. This self-aligned gate structure is obtainable, for example, by a method having the steps of depositing on the entire surface of p-type well 123 both the tunnel dielectric film 125 and a polysilicon film for later use as the floating gates 126, and thereafter, patterning these deposited films. This patterning is achievable by performing etching until the p-well 123 is etched to a depth of 0.05 to 0.5 micrometers (µm). Thereafter, the element isolation insulator film 124 is buried. Whereby, the floating gates 126 are formed to have an almost flat surface without any stir-step-like configurations.

Control gates 127 (including select transistor gates 127SSL and 127GSL) are insulatively formed over the floating gates 126 (including block insulator films 150SSL and 150GSL of select transistor portions) respectively, with a block insulating film 150 interposed between each floating gate 126 and its associative control gate 127. The block insulator film 150 is formed of any one of a 5 to 30 nm thick silicon oxide film, oxynitride film, and a multilayer of silicon oxide films with a silicon nitride film sandwiched therebetween. The individual control gate 127 has a stacked structure of a polysilicon film with a chosen impurity—e.g. phosphorus, arsenic, or boron—doped to a concentration of $10^{17}$ to $10^{21}$ cm$^{-3}$ or a tungsten silicide (WSi) film plus a polysilicon film. Alternatively the control gate 127 may be a stacked structure of a conductive film made of NiSi, MoSi, TiSi or CoSi and a polysilicon film. The stacked structure is 10 to 500 nm in thickness. Control gates 127 are each formed to continuously extend up to a cell block boundary in the cross-section of FIG. 36 to thereby ensure that each control gate is commonly owned or "shared" by neighboring cell units as shown in FIG. 35. These control gates are for use as the data select lines WL0-WL15.

The p-type well 123 is electrically separated and isolated by an n-type silicon region 122 from the p-type semiconductor substrate 121 so that a voltage is applicable to p-well 123 in a way independent of the substrate 121. This is desirable in order to reduce charge pump circuitry loads during data erasing to thereby suppress electrical power consumption. The memory cell gate structure used in this embodiment is such that its sidewall is covered with the element isolation insulator film 124 as shown in FIG. 36. Accordingly, no side faces of the floating gates 126 are exposed by etching prior to formation of the control gates 127. Thus it is possible to preclude accidental contact of control gates 127 with p-type well 123 in the element isolation region. This in turn eliminates or at least greatly suppresses unwanted creation of parasitic transistors otherwise occurring due to gate electric field concentration and/or threshold voltage reduction at the boundary or interface between p-well 123 and element isolation insulator film 124. A further advantage lies in an ability to lessen or avoid threshold voltage reduction otherwise occurring due to the electric field concentration, which is known as "side walk" phenomena in the semiconductor device art. This makes it possible to obtain memory cells with enhanced reliability.

As shown in FIG. 37, a sidewall dielectric film 143 is formed on the both sides of a respective one of the patterned multilayer gate electrode. The sidewall film 143 is formed of a silicon nitride film (or silicon oxide film) with its thickness of about 5 to 200 nm. In addition, n-type diffusion layers 128 are formed in certain surface portions of p-type well 123 between neighboring stacked gate electrodes in such a manner that each diffusion layer 128 is self-aligned with its associated gate electrodes and is for use as a source or drain. Each combination of these diffusion layer 128 and charge storage layer 126 plus control gate 127 constitutes a floating gate type EEPROM cell with the amount of charge accumulated on the charge storage layer 126 as an information amount. This memory cell has its gate length which preferably is less than or equal to 0.5 µm and yet greater than or equal to 0.01 µm—that is, the gate length ranges from 0.01 to 0.5 µm. The n-type diffusion layer 128 is formed to have a depth of from 10 to 500 nm to ensure that the resultant surface concentration of a chosen impurity—for example, phosphorus, arsenic or antimony—ranges from $10^{17}$ to $10^{21}$ cm$^{-3}$.

A serial combination of a plurality of memory cells—namely, NAND cell string—is arranged with each n-type diffusion layer 128 shared by neighboring memory cells. The select transistor gates 126SSL and 126GSL are each formed of the same layer as the floating gate electrodes 126. The gate length of these gate electrodes 126SSL-126GSL is longer than that of the memory cells. Preferably the gate length is designed to range from 0.02 to 1 µm, by way of example. With this gate length design, it is possible to attain significant ON/OFF ratios at the time of block selection and at the time of nonselection, thereby making it possible to prevent occurrence of failures to complete successful writing and reading operations, i.e. write and read errors.

An n-type diffusion layer 128$d$ which is formed outside of the select gate transistor's gate 127SSL is connected through a contact plug 131$d$ to its associated data transfer line (bit line BL) 136, which is made of tungsten, tungsten silicide, titanium, titanium nitride or aluminum. The data transfer line 136 is formed to continuously extend in a direction perpendicular to the drawing sheet of FIG. 36 to reach the memory cell array boundary so that this line 136 is shared by multiple cell units laid out in the column direction. An n-type diffusion layer 128$s$ is formed on one side of the gate 127GSL of the remaining select gate transistor, which layer 128$s$ is connected via a contact plug 131$s$ to a source line (SL) 133. The source line SL is formed to continue in the direction at right angles to the drawing sheet of FIG. 37 up to the memory cell array boundary so that line SL is sharable by neighboring cell units.

Optionally the source line 133 made of metals or else may be replaced with an extended portion of the n-type diffusion layer 128$s$, which is patterned to continuously extend from layer 128$s$ up to the memory cell array boundary. The contact plugs 131*d* and 131*s* are formed in such a manner that contact holes 130*d* and 130*s* are filled with conductive material, such as for example impurity-doped polysilicon of n-type or p-type, tungsten, tungsten silicide, Al, TiN and Ti. An interlayer dielectric (ILD) film 168 is formed to fill gaps between these source line SL and bit line BL and also between these lines and memory cells. ILD film 168 may be made of $SiO_2$ or SiN. The bitline BL is covered or coated at its top surface with a protective layer 137 formed of a dielectric film, which is made for example of $SiO_2$, SiN, polyimide or else. Although not specifically depicted in FIGS. 36-37, upper-level wiring leads made of W, Al or Cu are formed on or above the dielectric protective film 137.

As shown in FIGS. 2A and 2B, the normal cell array 100 has even-numbered data transfer lines BL11 to BL1k and odd-numbered data transfer lines BL21-BL2k. These lines BL11-BL1k and BL21-BL2k are selectively connected to sense amplifiers (normal sense amps SA1-SAk) by select transistors Q11-Q1k and Q21-Q2k, which are driven by select signals SEL1 and SEL2, respectively. Similarly, data transfer lines BL1r and BL2r of the redundant cell array 101 are selectively connectable to a sense amplifier (redundant sense amplifier SAr) 46 by select transistors Q1r and Q2r, which are driven by the select signals SEL1 and SEL2, respectively.

Although in FIG. 2A the redundant cell array 101 is shown to have only one odd-numbered data transfer line and only one even-numbered data transfer line in order to simplify the explanation only, a greater number of spare data transfer lines may be prepared. Letting the data transfer line number of normal cell array 100 be 2k, k is generally set equal to $2^n$ (i.e. k=$2^n$), where n is a positive integer. One representative example is that the total number "2k" of the data transfer lines of normal cell array 100 is set at 512 or more, while letting about 1 to 10% of these data transfer lines be assigned to the redundant cell array 101. This is done in order to fabricate highly integrated memories with increased cell occupancy ratios at low costs.

The verify check circuit 38 has level detection circuits 61 each of which is operable to detect a present level of a node N1 of a sense amplifier 46 associated therewith during write-verify, and decision circuits 62 each of which determines or "judges" whether write is completed in response to an output signal of its corresponding detection circuit 61 indicative of the presence or absence of discharge of a check node NC. Connected to the check node NC is the gate of a PMOS transistor MP1 with its source coupled to the supply voltage Vcc. The PMOS transistor MP1 has its drain which is connected to a decision output line 64*a*, 64*b* through a fuse element (Fv1 to Fvk, Fvr) 63 used for defective column replacement. Also connected to the check node NC is a PMOS transistor MP2 which is controlled by a control signal PREVFY as sent from the control circuit 40 to precharge the check node NC at Vcc.

The individual level detector circuit 61 has a serial combination of NMOS transistors MN1 and MN2 between the check node NC and ground terminal GND. The NMOS transistor MN1 has a gate which is connected to an output node N1 of its associative sense amplifier 46, while NMOS transistor MN2 has a gate which is controlled by a control signal VFY that is supplied from the control circuit 40.

Practically at the node N1 of sense amp 46, a "H" output is obtained in a case where the intended writing is not performed sufficiently. At the time of verify-read after a write operation, receipt of the control signal PREVFY (="H") results in the check node NC being set at Vcc while letting each of the output lines 64*a* and 64*b* be precharged to Vss. And, when the detector circuit 61 is made active or "activated" by a verify control signal VFY (="H") which is to be supplied with a delay from the arrival of the control signal PREVFY, the NMOS transistor MN1 is kept nonconductive (i.e. off) in case the cell of interest is written sufficiently (N1="L"); thus, the check node NC is hardly discharged. Accordingly, when all of the cells are sufficiently written, the decision output line 64 (64*a*, 64*b*) retains "L" level. In case an insufficiently written cell is present (N1="H"), the NMOS transistor MN1 turns on. When the NMOS transistor MN2 turns on in responding to receipt of the control signal VFY, its corresponding check node NC is discharged to turn on the PMOS transistor MP1, resulting in a decision output of Lvfy="H" being obtained.

In this embodiment, an NMOS transistor MN4 that constitutes the switch element 39 is connected between the output line 64*a* to which respective terminals of fuses (Fv1 to Fvk) 63 corresponding to the normal cell array 100 are commonly connected together and the output line 64*b* to which a terminal of the fuse (Fvr) 63 corresponding to the redundant cell array 101 is connected. The NMOS transistor MN4 has its gate, to which a switch control signal is input from the control circuit 40. Although in FIG. 2B the fuse 63 corresponding to redundant cell array 101 consists of a single element, a plurality of fuse elements may be provided in case there are multiple redundant columns. In such case, the switch element 39 may be disposed between the plural fuses corresponding to these columns of redundant cell array 101.

As previously stated, whenever a defective column is found, certain one of the fuses Fv1-Fvk which corresponds to the defective column is cut off, while the fuse Fvr corresponding to redundant cell array 101 maintains its conductive state. Whereby, it becomes possible to replace the defective memory cell containing column within the normal cell array 100 with the column within the redundant cell array 101. When the switch element 39 is on, the verify check circuit 38 performs verify-check with respect to those memory cells which are being sensed by sense amplifiers 46 with fuses Fv1-Fvk, Fvr being presently in the conductive state.

On the other hand, in an operation mode which performs writing or reading of only the redundant cell array 101 in the memory cell array 1, let the switch element 39 turn off. This permits execution of verify check relative to those cells on the redundant cell array 101 side which are being sensed by the sense amp 46 with its associative fuse Fvr being presently in the conductive state, without regard to present states of the fuses Fv1-Fvk and write states of the memory cells of normal cell array 100.

As previously stated, the redundant cell array 101 is a specific memory space or storage area for use as an ECC record area of the data given to the normal cell array 100, a flag area for storage of all-at-once erase and write states of memory cells, and a spare column area used to replace a defective memory cell or cells on a per-column basis. By providing the switching element 39 at a boundary position of the verify check circuit output line between the redundant cell array 101 and normal cell array 100, it becomes possible to read the ECC storage area and/or flag area at high speeds without being affected from execution of the replacement of a defective memory cell of normal cell array 100 with that of redundant cell array 101.

In this embodiment (although the same goes with the other embodiments set forth below), in a case that the number of data bits, "n", to be read or written via an input/output port satisfies a relationship of $(2^{m-1}-m)<n\leq$ ($2^m$−m−1), where "m" is a natural number, at least (n+m) or more NAND unit cells 49 are laid out in the direction of data select lines WL, while using as a page a certain range of memory cells which are simultaneously selected by a single data select line. In the arrangements of FIGS. 2A and 2B, the sense amplifiers 46 are disposed so that one sense amplifier is associated with two bit lines either one of which is selected at a time.

Arranging the memory cells in this way, it is possible to detect a one-bit error of a page of read data of the normal cell array 100 by using Hamming codes for example and then obtain the location thereof. Generally, in case the number of data bits, "n", read via the input/output port is greater than [$2^{m-1}$−t×(m−1)−1] and yet less than or equal to ($2^m$−t×m−1), where "t" is a natural number, at least (n+m) or more cell units 49 are disposed in the data select line direction, while letting the range of those memory cells that are simultaneously selected by a single data select line be a single page.

In this case, the number of sense amplifiers corresponding to the normal cell array 100 for data storage is equal to the data bit number; the number of all parallel sense amplifiers is made equal to a total sum of the data bit number and the bit number of redundant cell array 101. At this time, it is desirable for error correction that the bit number of redundant cell array 101 is set at t×m bits or more. Preparing the memory cells in this way, it becomes possible to detect "t"-bit errors of data bits as read out in a series of sequences of the normal cell array 100 by use of Bose-Chaudhuri-Hocquenghem (BCH) coding schemes by way of example and also possible to detect the location thereof.

To make the explanation easily understandable, a data column prior to coding will be referred to as "information bits"; a bit or bits to be added after coding will be referred to as "test bit(s)"; and, a bit which follows the information bits in a decoded data column and which indicates an error position or location will be called "syndrome" hereinafter. As shown in FIG. 1, an error bit correction circuit 5 is disposed between the data input/output (I/O) buffer 45 and external I/O terminals. Desirably the error bit corrector circuit 5 is the circuitry that performs not only error correction of data but also both coding and decoding of such data. This circuitry is readily realizable by known cyclic reed solomon (RS) coding circuits or cyclic redundancy check (CRC) circuits.

The error bit corrector circuit 5 is operable to detect and correct any bit errors of a series of data bits as output from the data input/output buffer 45, and further specify the position of each bit error, which is then output to an appropriate external input/output terminal I/O. This error bit corrector circuit 5 may be designed, for example, to use known cyclic Hamming coding/decoding circuitry in cases where 1-bit error correctability is required. Obviously, other coding schemes may alternatively be used, such as currently available BCH coding, M-system coding, convolutional coding, difference set cyclic coding architectures, or possible combinations thereof. Note here that in order to reduce the number of data lines DI/O1 between the data I/O buffer 45 and error bit corrector circuit 5, it is desirable to employ specific types of cyclic coding techniques which permit entry of information bits in a time series fashion and which are capable of coding and decoding while reducing complexity of circuitry.

Examples of the convolutional coding scheme are 1-bit error correctable "Wyner-Ash" coding, burst error-correctable "Iwadare" coding, and "Hagelbarger" coding techniques. Additionally in this case, letting the constraint length thereof be shorter than the above-noted page length, it is possible to more quickly obtain an output of the first coming error correction information with respect to the decoding when compared to the case where coding is done by a single error correction code. With such an arrangement, when compared to an approach that codes the entirety of a page by a single error correction code, it is possible to quickly obtain the output of the first error correction information with respect to the decoding while at the same time lessening the ratio of a code bit length to information bit length to thereby enable achievement of efficient coding processing.

Although it is assumed here that the error bit corrector circuit 5 is formed of logic circuitry, this circuit 5 may be realized by software programs of a micro-code processor made up of more than one accumulator and one or more memory elements or, alternatively, hardware of a sequencer. Note that in cases where the error bit corrector circuit 5 is less in bit numbers of detection and error correction, it is desirable to realize this circuit by the hardware. This can be said because this approach offers an ability to output data while reducing the resultant on-chip circuit area and lessening clock delay. Regarding the considerations as to the decoder circuitry and error correction coding means, these should not be limited only to the illustrative embodiment but may stay effective with respect to all of the embodiments discussed later in the description.

Figure 3:
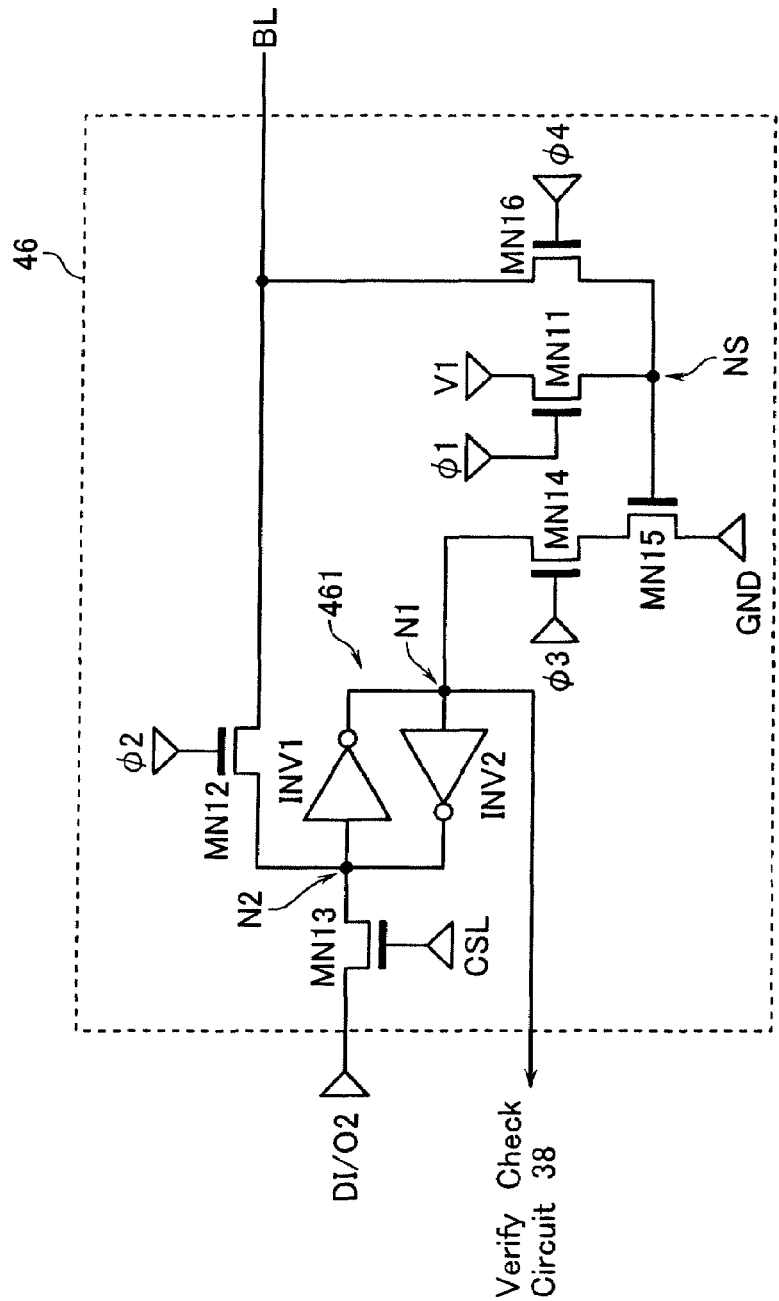
FIG. 3 is a diagram showing a detailed configuration of the sense amp circuit of the EEPROM.

Turning to FIG. 3, there is depicted a configuration of one sense unit of the sense amplifier circuit 46. The sense amp unit has a data latch (data register) 461 with inverters INV1 and INV2 input/output of which are cross-coupled. The data latch 461 has two nodes N1 and N2. One of these latch nodes, N2, is connected to an internal data line DI/O2 through an NMOS transistor MN13, which is controlled by a column select signal CSL. This latch node N2 is also connected to a bit line BL via an NMOS transistor MN12 controlled by a control signal $\phi 2$. The remaining latch node N1 is one to which a data sense result at sense node NS is transferred. Node N1 acts also as a sense result output node to the verify check circuit 38.

A sense node NS for sensing bitline data is connected to the gate of a sense-use NMOS transistor MN15. Sense node NS is connected to a data transfer line (bit line) BL through a clamping NMOS transistor MN16 which is controlled by a control signal $\phi 4$. Also connected to sense node NS is a precharge-use NMOS transistor MN11, which is controlled by a control signal $\phi 1$ in order to precharge sense node NS and data transfer line BL at a voltage V1. The sense-use NMOS transistor MN15 has its drain which is connected to the node N1 of data latch 461 via an NMOS transistor MN14 to be controlled by a control signal $\phi 3$.

Principles of write and read operations of this sense amplifier 46 are as follows. Write data is loaded from the internal data line DI/O2 to the node N2 through the NMOS transistor MN13. "H" or "L" level of this write data is transferred to a presently selected bit line BL via the NMOS transistor MN12. In response to the write data, the channel of a NAND cell unit is precharged, and it is followed by application of a write pulse voltage to a selected data select line, whereby writing of a selected cell is performed. Details of this process will be set forth in detail later.

At the time of readout, what is done first is an operation for precharging the sense node NS and bit line BL at the voltage V1. Thereafter, cell data is determined or "judged" by detecting whether the sense node NS and bitline BL are discharged or not by the selected cell. A sense result is retained at the data latch 461. While detailed explanations will be given later with respect to write and verify-read operations, the sense amplifier 46 of this embodiment is arranged so that a sense result with node N1 being set at "H" level is obtained only for an insufficiently written cell. The sense result of this node N1 is sent forth toward the verify check circuit 38 in the way stated supra and then subjected to determination of whether the write cycle is terminated.

Figure 4:
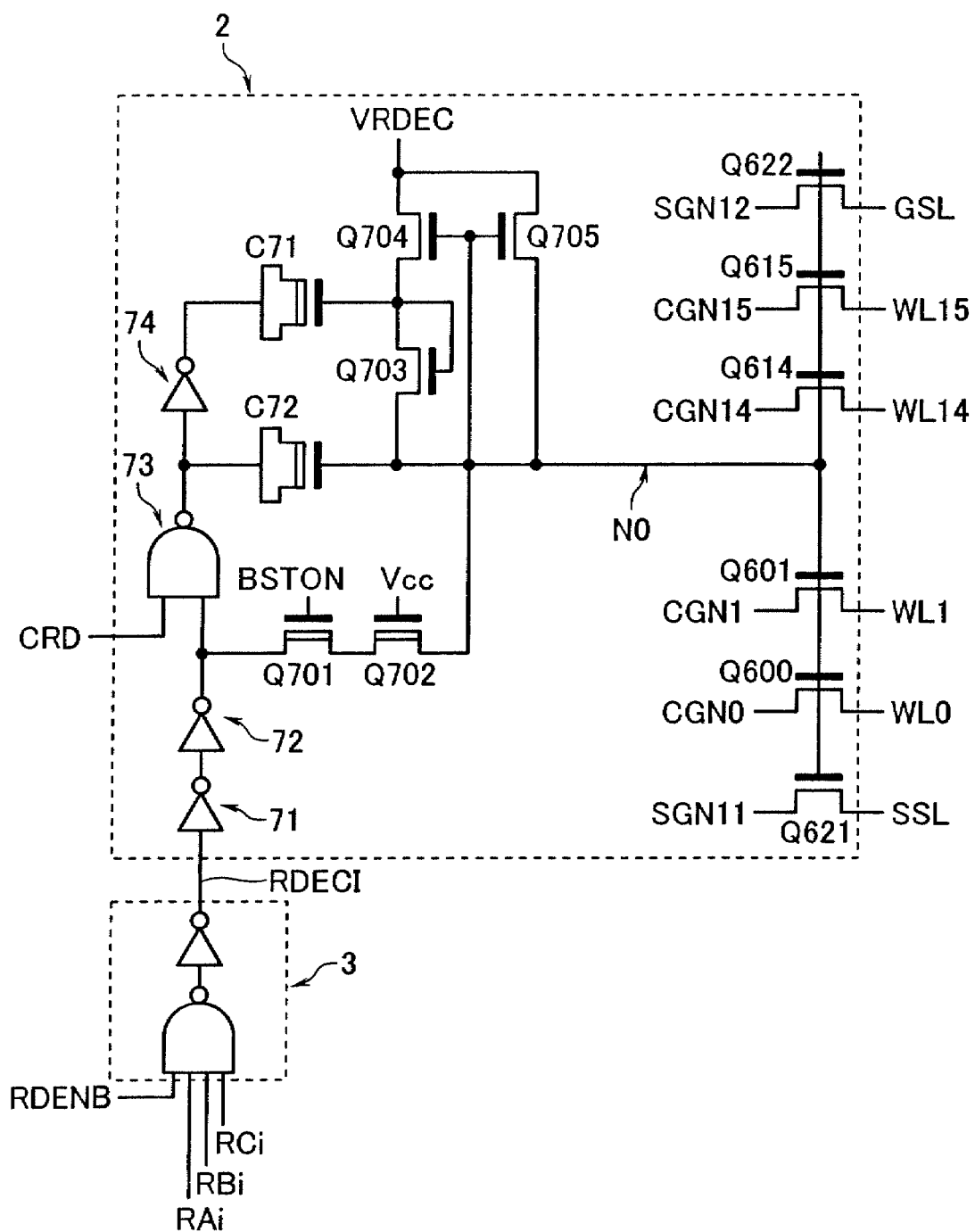
FIG. 4 is a diagram showing a configuration of a data select line driver of the EEPROM.

Referring next to FIG. 4, there is shown one practical configuration of circuitry including the data select line driver 2 and the row decoder 3 shown in FIG. 1. Row decoder 3 is a block address selecting circuit which is activated by an enable signal RDENB to detect that block addresses RAi, RBi, RCi are all at "H" level. As for a presently selected cell block, a block select signal RDECI becomes "H", which is for use as an activation signal of the data select line driver 2.

The block select signal RDECI is transferred to a node N0 through depression-type (D-type) NMOS transistors Q701 and Q702 having their gates controlled by a control signal BSTON and power supply voltage Vcc, respectively. The supply voltage Vcc is potentially set to range from 1 to 5V; for example, set at 3.3V. These transistors Q701-Q702 are high-voltage transistors with increased voltage withstanding capabilities, each of which is arranged so that its threshold voltage is less than or equal to 0V and yet higher than or equal to −2V—typically, set at −1V. Enhancement-type (E-type) NMOS transistors Q600-Q615 and Q621-Q622 which are driven by the node N0 constitute an array of driver transistors that drive the data select lines WL0-WL15 and select gate lines SSL and GSL, respectively. These driver transistors also are high-voltage transistors with the threshold voltage of each being set to range from 0 to 2V; typically, set at about 0.6V.

A circuit part including E-type NMOS transistors Q704-Q705 and intrinsic type (I-type) NMOS transistor Q703 along with MOS capacitors C71-C72 and inverter 74 makes up a switch circuit which utilizes charge pump circuitry for transferring a voltage VRDEC as output from a high-voltage generator circuit toward the node N0 without any voltage drop. Practically the voltage VRDEC is any one of specific voltages in accordance with the mode of an operation being presently performed, such as write or "program" voltage Vpgm which is generated from the Vpgm generator circuit 41a of FIG. 1, pass voltage Vpass as generated from the Vpass generator circuit 41b, pass voltage Vread generated from the Vread generator circuit 41c, and the supply voltage Vcc. The threshold voltage of I-type NMOS transistor Q703 is set to range from −0.5 to 1V; for example, at about 0.2V. These switch circuits also are made up of high-voltage transistors.

The capacitors C71 and C72 are MOS capacitors using D-type NMOS transistors. When "H" is transferred to the node N0 with respect to a presently selected cell block, the NMOS transistor Q704 with its drain applied the voltage VRDEC behaves to turn on, causing this voltage VRDEC to be sent to node N0 through this NMOS transistor Q704 and diode-coupled NMOS transistor 703. Charge pump actions are controlled by a NAND gate 73, to which a block select output RDECI and oscillation (square-wave) input signal CRD are input.

When the block select signal RDECI is at "H" level, a oscillation output appears at an output of NAND gate 73. By this oscillation output, charge pumping is performed at the part of mutually adversely-driven capacitors C71 and C72 and NMOS diode Q703. As a result, the voltage VRDEC is sent to node N0 without experiencing any voltage drop equivalent to the threshold voltages of MOS transistors Q703-704. Letting the threshold voltage of NMOS transistor Q705 be Vth, the voltage of node N0 is suppressed to less than or equal to VRDEC+Vth.

Transistors Q600-Q615 and Q621-Q622 with their gates commonly driven by the node N0 are driver transistors which drive the data select lines WL0-WL15 and select gates SSL and GSL within a cell block, respectively. These driver transistors turn on, whereby the voltages are given to their one-side terminals CG0-CG15 and SGN11-SGN12 in accordance with an operation mode are transferred to the data select lines WL0-WL15 and select gate lines SSG and GSL, respectively.

Data read/write and erase operations of the EEPROM chip of this embodiment will be explained while looking at the data select line driver 2. Assume that a word line WL1 of a presently selected cell unit is selected at the time of data reading. In this case, a terminal CGN1 connected thereto is potentially set at a read voltage Vref. The read voltage Vref is set to an intermediate or "middle" potential level (e.g., 1V) between the threshold voltages corresponding to the logic "0" and "1" levels of a memory cell. Those terminals CGN0 and CGN2-CGN15 which are connected to the remaining non-selected data select lines are each set at a pass voltage Vread (e.g., 4V), which is higher in potential than a maximal value of the "0" data threshold voltage of memory cell. The pass voltage Vread is also given to terminals SGN11 and SGN12 that are coupled to the select gate lines SSL and GSL.

During data read, the voltage VRDEC given to the driver circuit 2 is set at a specific potential level which is slightly higher in value than the pass voltage Vread. Additionally the control signal BSTON becomes at "L" level, thereby causing the node N0 and the input end of NAND gate 73 to be electrically isolated from each other. And, an oscillation output CRD passes through the NAND gate 73 with RDECI="H" being input thereto, whereby the charge pump circuit is rendered operative so that a voltage that is almost equal in potential to the voltage VRDEC is transferred to the node N0. As a result, the driver NMOS transistors Q600-Q615 and Q621-Q622 turn on, thereby causing the voltages of the terminals CGN0-CGN15 and SGN11-SGN12 to be applied to the data select lines WL0-WL15 and select gate lines SSL and GSL, respectively.

Whereby, a memory cell which is connected to the presently selected data select line WL1 turns on if data "1" so that the data transfer line BL decreases in potential. If data "0", the memory cell is held at an off state so that the data transfer line BL exhibits no such potential drop. Such potential change of this data transfer line is detected by the sense amplifier circuit 46 so that data is read out.

In the remaining, non-selected cell blocks, the block select signal RDECI is at "L" level during reading. Thus, node N0 is held at GND level to turn off transistors Q621, Q622, Q600 to Q615, whereby Vread or Vref is not transferred to block select lines SSL, GSL and word lines WL0 to WL15. As a result, data select lines being held lower in potential than the threshold voltage of the select gate transistors in the non-selected block, the potential of the data transfer lines BL is kept free from the influence of the threshold of memory cells in the non-selected block.

During data writing, a voltage of 0V is applied from the sense amplifier 46 to a data transfer line BL which is subjected to writing of logic "0" data, while the supply voltage Vcc is given to a data transfer line BL for "1" data write. The voltage Vcc is applied to the select gate line SSL on the data transfer line BL side, whereas the 0V is given to the select gate GSL on the common source line SL side. Further, the write voltage Vpgm is given to a presently selected data select line; the pass voltage Vpass is to the individual one of nonselected data select lines. Operations of the row decoder 3 and data select line driver 2 are principally the same as those during reading. Note that the voltage VRDEC is set at a specific potential level that is slightly higher in value than the write voltage Vpgm, which is then sent to the node N0. Whereby, the driver NMOS transistors Q600-Q615 turn on, causing the voltages of terminals CGN0-CGN15 to be given to the data select lines WL0-WL15, respectively. And, in a selected memory cell along the bit line BL that is given "0" data, electron injection takes places at the floating gate thereof resulting in the value of its threshold voltage being in a positive state. In a memory cell with "1" data given thereto, its channel underlying the floating gate increases in potential due to capacitive coupling from the control gate, whereby no electron injection occurs.

At the time of data erasing, the data select line BL and common source line SL are held electrically floating, and an erase voltage is given to the p-type well region in which the memory cell array is formed. The erase voltage typically ranges from 10 to 30V. At this time, all the data select lines of a presently selected cell block is set at 0V. Within the data select line driver 2, oscillation output CRD is not supplied during data erasing; thus, the node N0 is at Vcc when the control signal BSTON is at "H". Whereby, the driver NMOS transistors Q600-Q615 of the selected cell block turn on to cause the 0V voltage given in advance to the terminals CGN0-CGN15 to be applied to the data select lines WL0-WL15. This results in that electrons are drawn out of the floating gates so that the data of every memory cell is erased.

During data erase, the select gate lines SSL and GSL are precharged up to the power supply voltage Vcc and thus set in the electrically floating state. Whereby, when the erase voltage is given to the p-type well, the select gate lines SSL-GSL potentially increase due to the presence of their capacitive coupling with the p-well. Accordingly, a potential difference hardly generates between the block select gate and the channel; thus, any accidental destruction no longer occurs due to unwanted electron injection into the select gate transistor's oxide film.

As shown in FIG. 1, in this embodiment, the control circuit 40 is arranged to include two built-in read timing circuits 401 and 402. Suppose here that the timing circuit 401 is a circuit which generates and issues a timing signal that is the same in time as that in the prior art; and the timing circuit 402 is a high-speed read-use timing circuit which generates a timing signal that is shorter than that of circuit 401. These timing circuits 401-402 may be configured as shown in FIG. 5.

The timing circuits 401-402 are each arranged to utilize CR time constant circuitry for delaying rising and falling edges of a pulse signal to thereby generate the timing signal required. Letting a time constant (product of the values of a resistor R2 and capacitor C2) of timing circuit 402 be less than that (product of resistor R1 and capacitor C1) of timing circuit 401, it is possible to lessen the delay of an output with respect to rising and falling pulse edges of NAND gates G1 and G2. Additionally, setting a control input CTR at "H" level, it is possible to make the output of timing circuit 402 active; and setting the control input CTR at "L", it is possible to activate the output of timing circuit 401.

An "L" output of either one of the NAND gates G1-G2 is selected by a NAND gate G3 and is then output as a timing signal of "H". More specifically, it is possible by selection of "H", "L" of control input CTR to change a delay time of the output of an output node OUT with respect to rising and falling edges of a pulse signal being given to an input node IN so that the output delay time has one of two kinds of time lengths. These timing circuits 401-402 require no external clock signals and are capable of determining an appropriate delay time based on the CR time constant so that the resultant circuitry may be reduced in scale and in complexity.

Figure 5:
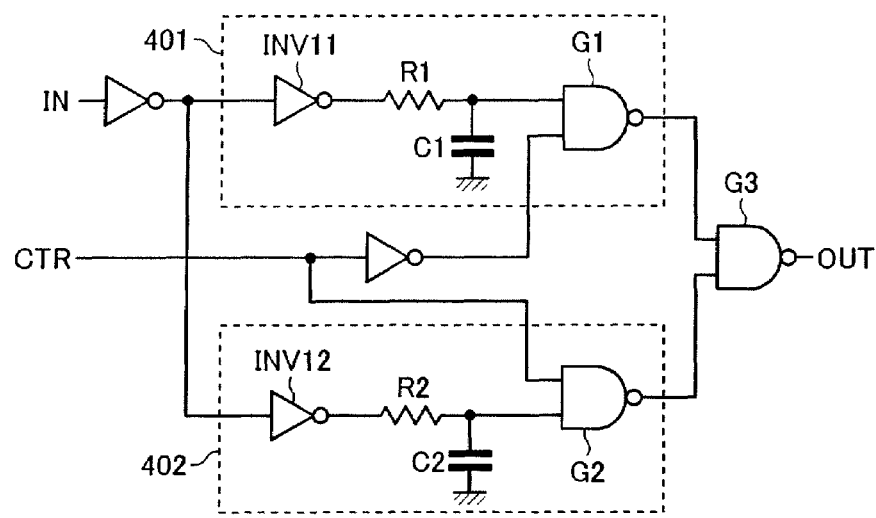
FIG. 5 is a diagram showing a configuration example of a read timing circuit of the EEPROM.
Figure 6:
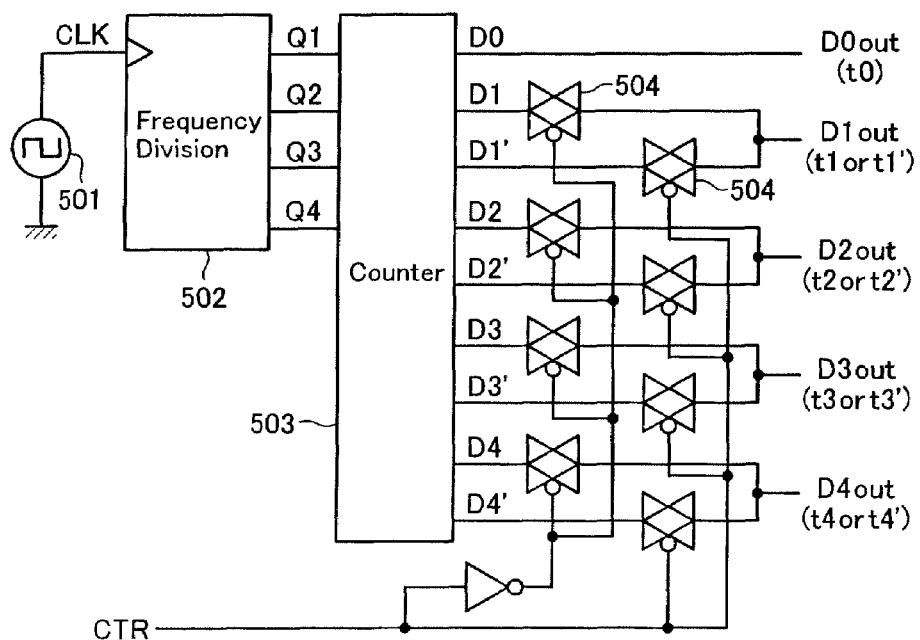
FIG. 6 is a diagram showing another exemplary configuration of the read timing circuit of the EEPROM.

See FIG. 6, which shows a timing circuit using a clock CLK, for realizing more accurately the functionality similar to that of the timing circuits 401-402 shown in FIG. 5. The clock CLK is generated from a clock generator 501 and is frequency-divided by a frequency divider 502. The clock generator circuit 501 may be an on-chip circuit that is formed inside the memory chip or alternatively an external circuit prepared outside of the memory chip. Frequency division outputs Q1 to Q4 of the frequency divider 502 are input to a counter 503. Frequency divider 502 and counter 503 are digital circuitry which counts up pulses of the clock signal CLK to thereby output pulses D0, Dx and Dx' that change in potential from "L" to "H" level or alternatively from "H" to "L" at certain timings t0, tx (x=1, 2, 3, 4) and tx' (x=1, 2, 3, 4) with a predetermined number of count values. These frequency divider 502 and counter 503 per se may be formed of currently available digital circuits that are well known among those skilled in the art.

The output timings tx and tx' of the outputs Dx and Dx' of the counter 503 are designed to satisfy a relationship of tx'<tx therebetween. This timing relationship of them corresponds to that of two types of read operation timings (t0, t1 to t4), (t0, t1'-t4') as will be explained later using FIGS. 10 and 11. The outputs Dx and Dx' are such that either one of them is selected by a bi-lateral switch 504 that is controlled by the control input CTR. As a result, D0out (at timing t0) and Dxout (timing tx or tx') are obtained. Using this timing circuitry, it is possible to generate two kinds of read timing signals at more accurate timings, which signals are required for a read operation to be later discussed using FIGS. 10-11.

Figure 7:
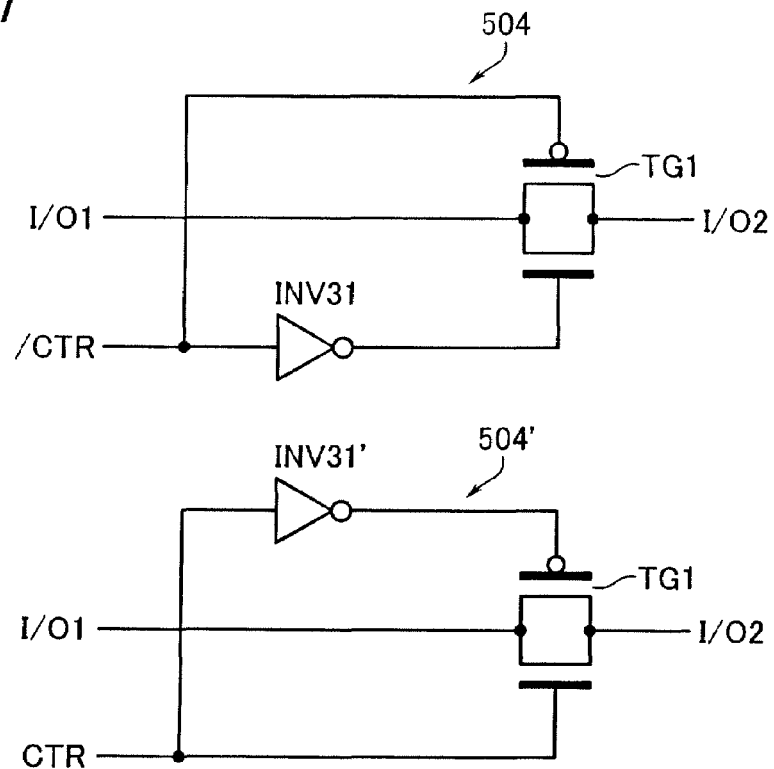
FIG. 7 is a diagram showing a configuration of a bilateral switch used in the circuit of FIG. 6.

It is not always required that the two types of timing circuits 401 and 402 within the control circuit 40 are configured of mutually separated "discrete" circuits as shown in FIG. 6 and may be designed to functionally generate two kinds of read timing signals, which are changed over by the control input CTR. A practical configuration example of the bilateral switch 504 shown in FIG. 6 is shown in FIG. 7. As shown herein, the bilateral switch 504 may be configured of a CMOS transfer gate TG1 and an inverter INV31. When a control input /CTR is at "L" level, nodes I/O1 and I/O2 are rendered conductive; when /CTR is at "H", these nodes I/O1 and I/O2 are made nonconductive—i.e., set in a shutoff state.

Figure 8:
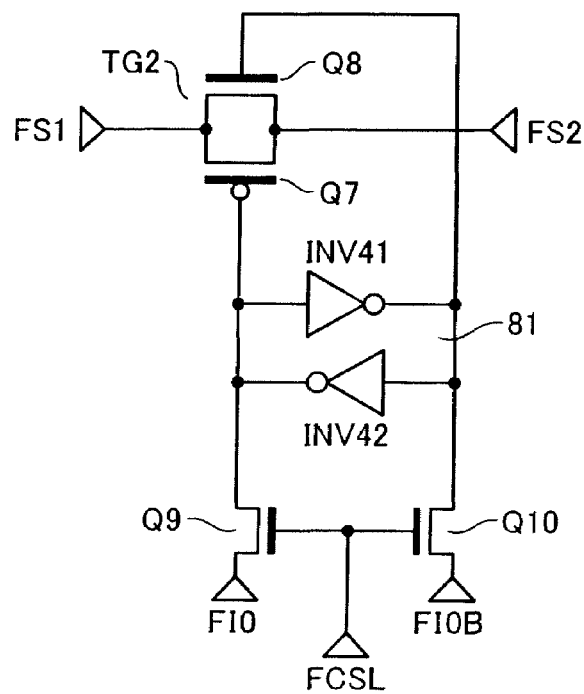
FIG. 8 is a diagram showing an alternative circuit example of a fuse used in the circuit of FIG. 2B.

The fuse elements in the defective address storage circuit 35 and verify check circuit 38 may typically be laser-blown fuses. The fuses of this type are formed by either conductor material, such as polysilicon or silicide, or metals for use as wiring leads. In place of such mechanical fuses, electrical fuse circuits are employable, one of which is shown in FIG. 8. This alternative circuit has a CMOS transfer gate TG2 disposed between fuse terminals FS1 and FS2 and a data latch 81 for control of turn-on and turn-off of the transfer gate TG2. Data for on/off-control of transfer gate TG2 is written into the data latch 81 through NMOS transistors Q9 and Q10 that are controlled by a control signal FSCL.

More specifically, in order to retain the control data for turn-on control of transfer gate TG2, supply inputs of "L" and "H" to terminals FIO and FIOB, respectively, and make a control signal FCSL change from "L" to "H" and then to "L" level. To hold at fuse latch 81 the control data for turn-off control of transfer gate TG2, input "H" and "L" to terminals FIO and FIOB, respectively, and make the control signal FCSL change to have "L", "H" and "L" in succession.

In this way, the substitute circuit using the storage element is employable as an alternative to the fuse element. With such the alternative circuit, it is possible to freely control electrical conduction and shutoff of a fuse without regard to the hysteresis thereof. Another advantage is that unlike mechanical fuses, it is no longer required to irradiate light rays and heat or flow a current between the fuse terminals FS1 and FS2 for fuse blowout/shutdown purposes, thereby making it possible to achieve circuitry with increased reliability.

Figure 9:
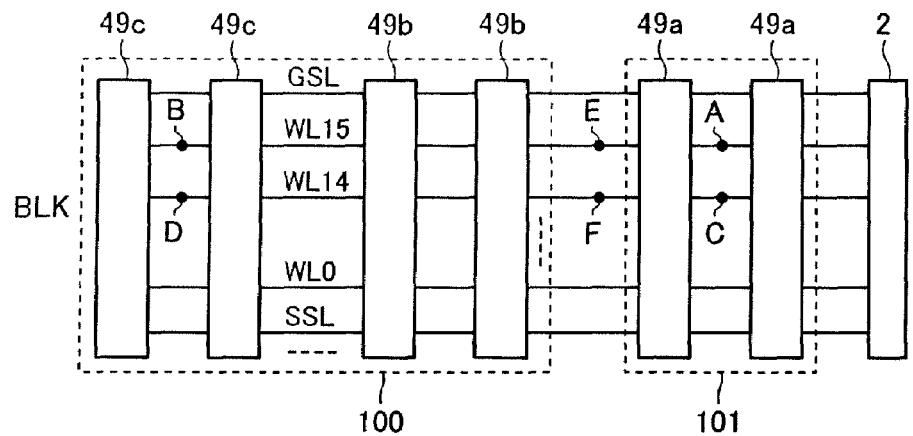
FIG. 9 is a diagram showing one cell block of the memory cell array for explanation of a write operation of the EEPROM.
Figure 10:
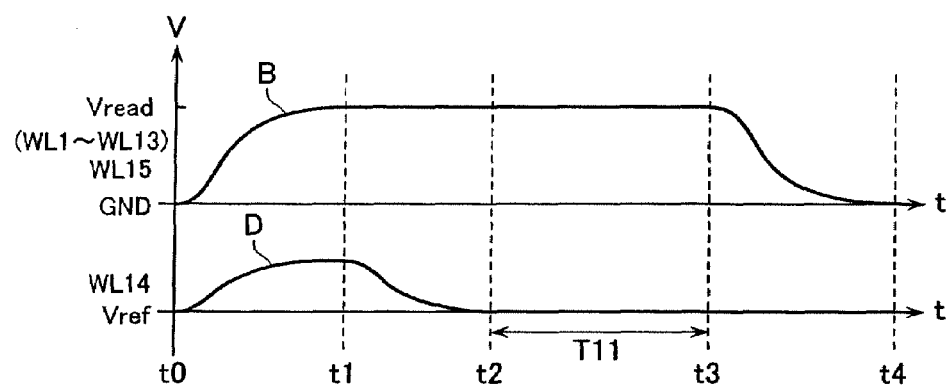
FIG. 10 is a diagram showing data select line voltage changes during a write-verify operation under an ordinary timing control scheme.
Figure 11:
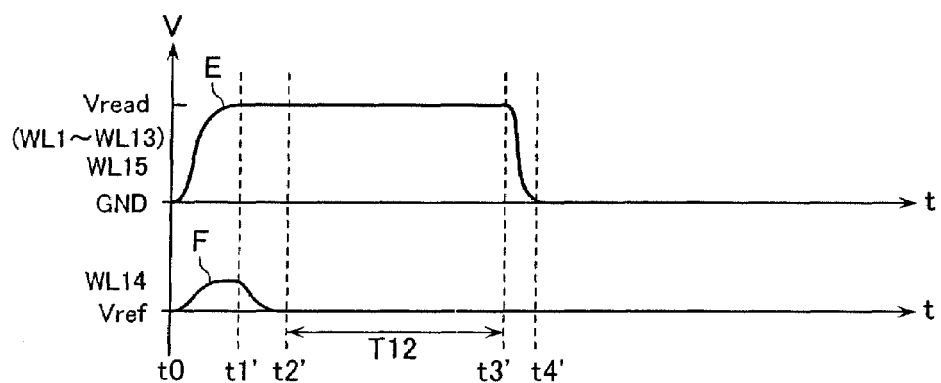
FIG. 11 is a diagram showing data select line voltage changes in a high-speed read mode.
Figure 42:
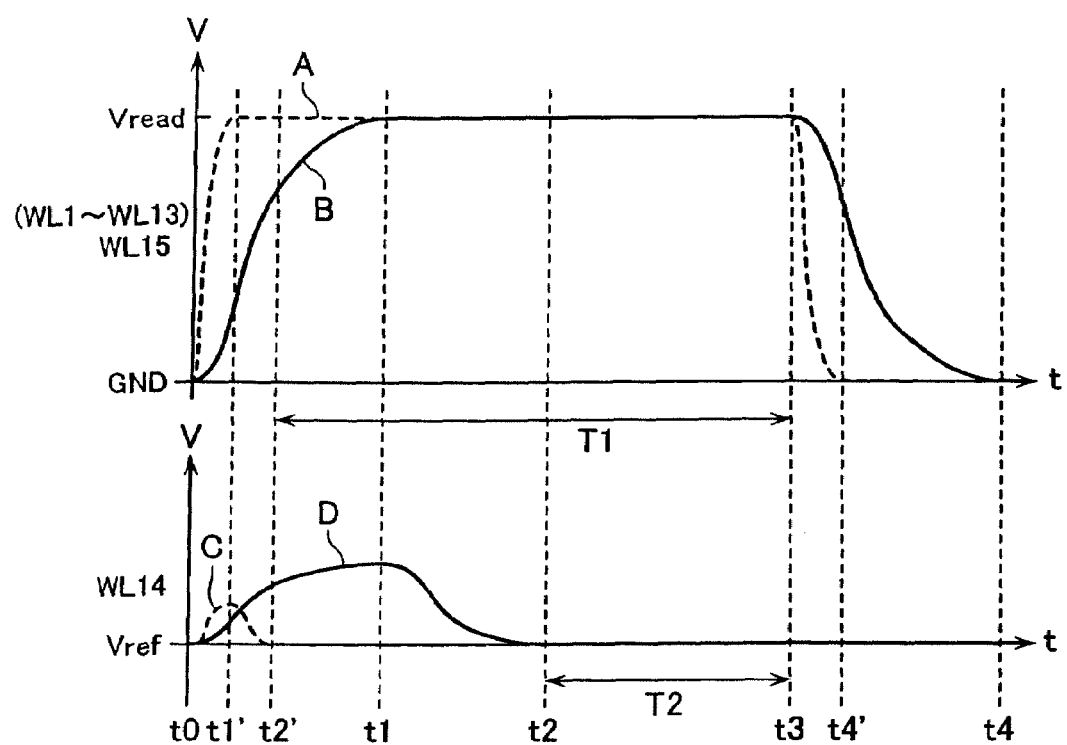
FIG. 42 is a diagram showing data select line voltage changes during a write-verify operation of the prior art EEPROM.

An explanation will next be given of a read operation of the EEPROM of this embodiment with reference to FIGS. 9 to 11. FIG. 9 shows one cell block BLK within the memory cell array 1 shown in FIG. 1, which is driven by a single data select line driver 2. FIGS. 10 and 11 show timing waveforms corresponding to the read timings in the prior art shown in FIG. 42. More specifically, FIG. 10 is the case where timing control is performed by the Vread timing circuit 401 to be applied to ordinary or "normal" data reading, while FIG. 11 is the case where the timing control is done by the other Vread timing circuit 402 to be applied to execute a high-speed data read operation when the redundant cell array 101 is selected.

FIGS. 10 and 11 both show voltage waveforms of a presently selected data select line WL14 and a non-selected data select line WL15 in case the data select line WL14 is selected and applied a read voltage Vref while giving a pass voltage Vread to the remaining, nonselected data select lines WL0-WL13 and WL15. Note that the voltage waveforms of FIG. 10 are ones of nodes B and D on the data select lines WL15 and WL14 within the normal cell array 100, which are furthest from the data select line driver 2. FIG. 11 shows voltage waveforms of node E and F at a boundary portion between the normal cell array 100 and redundant cell array 101 on the same data select lines WL15 and WL14.

The node E on the data select line WL15 is closer to the data select line driver 2 than the node B so that the pass voltage Vread rapidly rises up in potential at timing t0 and then reaches Vread almost at timing t1'. In contrast, the node B is far from the data select line driver 2, whereby this node potentially rises up more moderately than the node E so that it rises up to Vread at timing t1 after elapse of a longer time than the timing t1'. In cases where the capacitance between the data select line and the substrate is the most dominant one among all the capacitances of data select lines, the ratio of (t1'−t0) versus (t1−t0) becomes almost equal to the ratio of a squared value of the length of a data select line spanning from the data select line driver 2 to the node E to a squared value of the length of a data select line of from the data select line driver 2 to node B.

In other words, as the length of data select line increases, a delay time of potential rise-up likewise increases in a way proportional to a squared value of the line length. More practically, suppose that as in this embodiment, the redundant cell array 101 is disposed in close proximity to the data select line driver 2. If this is the case, when comparing the on-the-wire voltage signal transmission delay or "wire delay" at node E with that at node B, the former is less than or equal to $\{i/(i+j)\}^2 \times 100[\%]$, where "i" is the total number of columns of redundant cell array 101, and "j" is the total column number of normal cell array 100.

On the other hand, within a time period between the timings t0 and t1, a voltage of the data select line WL14 is controlled by an output of the data select line driver 2 so that this line is potentially held at the read voltage Vref which is lower than the pass voltage Vread; however, its voltage rises up due to the capacitive coupling between line WL14 and its neighboring data select lines WL15 and WL13. Regarding this voltage rise-up, the node D is greater than the node F near the data select line driver 2. This can be said because the capacitance and wire lead resistance of the data select lines WL15 and WL13 capacitively coupled to the node D become larger than those relative to the node F.

At timing t1', the data select line WL13 and the node E on data select line WL15 being kept constant in potential, no potential rise-up occurs at node F thereafter. As the data select line WL14 is discharged through the data select line driver 2, it returns almost to Vref at timing t2'. As for the node D, its voltage no longer rises up after timing t1 since the data select line WL13 and the node B on data select line WL15 become constant in potential at this timing t1; and, node D is discharged through data select line driver 2 so that it returns almost to Vref at timing t2.

In cases where the capacitance between the data select line and the substrate is the most dominant one among all the capacitances of data select lines, the ratio of (t2'−t1') to (t2−t1) becomes almost equal to the ratio of a squared value of the length of a data select line extending from the data select line driver 2 to the node F versus a squared value of the length of a data select line of from the data select line driver 2 to node D. In other words, as the length of data select line increases, a delay time of potential rise-up likewise increases in a way proportional to a squared value of the line length. More practically, suppose that as in this embodiment, the redundant cell array 101 is disposed adjacent to data select line driver 2. If this is the case, when comparing the on-the-wire signal transmission delay at node F with that at node D, the former is less than or equal to $\{i/(i+j)\}^2 \times 100[\%]$, where "i" is the total number of columns of redundant cell array 101, and "j" is the total column number of normal cell array 100.

As the cell current of a memory cell is determinable by a difference between the memory cell's threshold voltage and the read voltage Vref, it is required to measure the memory cell current exactly after read voltage Vref is potentially stabilized to stay at a constant potential level. Thus it is necessary that data readout of the cell within the cell unit 49c furthest from the data select line driver 2 is performed after the timing t2. Similarly the data readout of a memory cell in the redundant cell array 49a is required to get started after the timing t2'.

In the case of FIG. 10, after having established a certain time period or zone T11 required for cell current readout, let the pass voltage Vread drop down in potential from timing t3 to thereby complete the intended read operation. Similarly in FIG. 11, after having reserved a certain time zone T12 necessary for cell current read, let the pass voltage Vread drop down from timing t3' to thereby complete the read operation. While the node E of data select line WL15 adjacent to the data select line driver 2 decreases to ground potential GND at early timing t4' after timing t3', the node B far from data select line driver 2 takes a longer time from timing t3 to drop down to ground potential GND at timing t4.

In case the capacitance between the data select line and the substrate is the most dominant one among all the capacitances of data select lines, the ratio of (t4'−t3') to (t4−t3) is almost equal to the ratio of a squared value of the length of a data select line extending from the data select line driver 2 to the node E versus a squared value of the length of a data select line of from data select line driver 2 to node B. To be more specific, the longer the length of data select line, the more the delay time of potential rise-up in a way proportional to a squared value of the line length. More practically, suppose that as in this embodiment, the redundant cell array 101 is disposed near data select line driver 2. In this case, when comparing a lead wire delay at node F with that at node B, the former is less than or equal to $\{i/(i+j)\}^2 \times 100[\%]$, where "i" is the total number of columns of redundant cell array 101, and "j" is the total column number of normal cell array 100.

As apparent from the foregoing, in the case of reading the cell units 49a to 49c of FIG. 9 simultaneously, a relatively long read cycle time (t4–t0) is required as shown in FIG. 10 due to the fact that resultant read speed or rate is controlled and limited by the pulse delay times (t1–t0), (t2–t1) and (t4–t3) with respect to the cell unit 49c. On the other hand, in the case of guaranteeing data readout of the cell unit 49a within the redundant cell array 101 without guaranteeing read of any cell unit within the normal cell array 100, the read can be done in a shorter cycle time (t4'–t0) than the cycle time (t4–t0) as shown in FIG. 11. More specifically, when performing read of the redundant cell array 101 only, it is possible to reserve within a short cycle time the time zone T12 (=t3–t2) which is the same in length as the cell current-measurable time zone T11 (=t3'–t2') in the case of FIG. 10.

As apparent from the discussion above, using the timing circuit 410 in order to set up the timings t0 and t1 to t4 while alternatively using the timing circuit 402 for setup of the timings t0 and t1'–t4', it becomes possible to shorten the cycle time in the case of reading the redundant cell array 101. In other words, according to this embodiment, it becomes possible to install two data read modes with different minimum cycle times each of which is necessary for continuously read out plural column data of cell array 100.

Although in FIGS. 10-11 specific operation waveforms during reading are shown, the same goes with write events. More specifically, regarding a pulse falling time after completion of write pulse application, the cell unit 49c far from the data select line driver 2 is longer than the cell unit 49a near data select line driver 2. In view of this, prepare a write-use timing circuit which generates a write timing signal that is shorter in time than normal write timing signals. Using this timing circuit makes it possible to shorten a write cycle time in the case of writing data into only the redundant cell array 101 when compared to the case of writing data into all the cell arrays involved.

Further note that in this embodiment, the redundant cell array 101 is disposed in the proximity of the data select line driver 2. Accordingly, in the event that a defective column within the normal cell array 100 is replaced with a spare column within redundant cell array 101, the position of a column including a defective cell within normal cell array 100 and the position of a column within redundant cell array 101 as replaced by such defective column are such that the latter is more adjacent to the data select line driver 2 than the former without fail. Due to this, it is no longer required to provide large timing margins for defective column replacement purposes. This makes it possible to perform any intended operations at higher speeds, which in turn enables achievement of the EEPROM chip with increased reliability.

A system procedure for write and verify-read will next be explained while looking at the sense amplifier circuit 46 shown in FIG. 3.

Firstly, set the column select signal CSL at "H" level to turn NMOS transistor MN13 on, and write data given to internal data line DI/O2 is transferred to data latch 461. Write data "0" is sent to node N2 as "L" data, whereas write data "1" (i.e., write inhibition for retaining an erased state) is passed to node N2 as "H" data.

Thereafter, set the column select signal CSL at "L" level to turn NMOS transistor MN13 off. Subsequently, set control signal φ2 at "H" level, thereby causing data of node N2 to be sent to a presently selected data transfer line BL. Node N1 that is subjected to verify check is set at "H" when write data is "0"; and this node N1 is at "L" when the write data is "1". Thereafter, send the data transfer line voltage to the channel of a cell unit which is presently selected by temporarily setting its select gate line SSL at "H". Then, apply a write pulse voltage to a selected data select line, and writing is performed to the selected cell. After the write operation, set the select gate lines SSL and GSL at "L" level.

Subsequently, the procedure enters a write-verify-read operation. After having set control signal φ2 at "L" to turn NMOS transistor MN12 off, set control signals φ1 and φ4 at "H" to turn NMOS transistors MN11 and MN16 on, thereby precharging specific part that covers from sense node NS up to the selected data transfer line BL. More practically, upon application of V1=Vcc, φ1=Vcc+Vth, φ6=Vpre+Vth (Vth is the threshold voltage of NMOS transistor), the data transfer line is charged up to Vpre while sense node NS is charged at Vcc.

Then, set control signal φ4 at "L", apply "H" to select gate lines SSL and GSL of the selected cell unit, and give a read voltage Vref to the selected data select line, wherein the read voltage Vref is for use as a reference threshold level of write completion. With such voltage application, the data transfer line BL is discharged in a way pursuant to a present write state of the selected memory cell. More specifically, since the selected cell turns on when "0" write is not sufficiently performed and also when "1" write (i.e. write inhibition) is done, the data transfer line is discharged resulting in a decrease in potential. When "0" write is done sufficiently, the data transfer line exhibits no such discharge.

After a prespecified length of time has elapsed from the start-up of the data transfer line charging operation, set control signal φ1 at "L" to turn NMOS transistor MN11 off; set control signal φ4 at an appropriate potential level which permits NMOS transistor MN16 to turn on. Thus the electrical charge at sense node NS is transferred in accordance with a present potential level of the data transfer line. Whereby, when "0" write is not sufficiently performed and also when "1" write is done, the sense node NS potentially drops down to reach a potential level which is lower than or equal to the threshold voltage of NMOS transistor MN15. Alternatively when "0" write is done sufficiently, sense node NS is no longer charged up and thus retains a voltage higher than or equal to the threshold voltage of NMOS transistor MN15.

Then, when setting control signal φ3 at "H" to turn NMOS transistor MN14 on, a voltage of data latch N1 is determined in accordance with the voltage of sense node NS. In other words, in case "0" write is sufficiently performed, the electrical charge of node N1 is discharged, whereby node N1 changes from "H" to "L" level. In the case of "1" write, node N1 retains "L". When "0" write is failed to be sufficiently performed, node N1 holds "H".

In brief, the node N1 that issues an output for verify check use retains "H" level only when "0" write is not sufficiently performed yet. The "H" or "L" level of this node N1 is sent to the verify check circuit 38 and is then used for determination of write completion as discussed previously. Thereafter, set control signals φ3 and φ4 at "L" to turn NMOS transistors MN14 and MN16 off, thus terminating the verify operation.

Hereafter, whenever a write-deficient cell is present, the write pulse voltage application and its following verify-read will be repeated until such cell is judged to be written sufficiently. With the write control sequence, it is possible to again write or "rewrite" only those cells that are presently deficient in "0" write.

In this embodiment, in case data rewriting is performed with respect to only the redundant cell array 101 in the memory cell array 1, turn off the switch element 39 that is between the decision output lines 46a and 46b of the verify check circuit 38 shown in FIG. 2. Whereby, the output load of verify check circuit 38 becomes smaller, enabling enhanced acceleration of verify-read operations.

Figure 12:
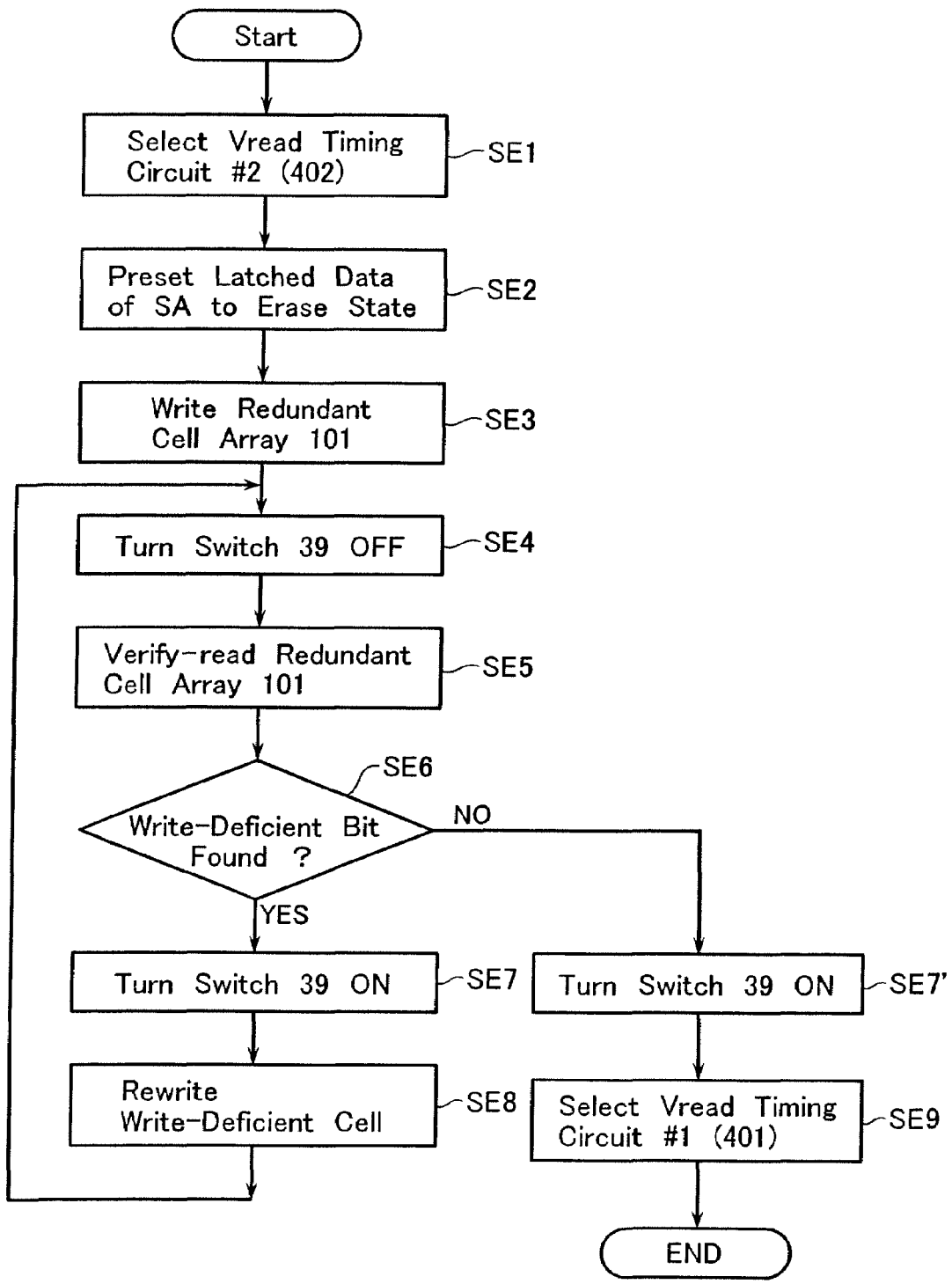
FIG. 12 is a flow chart for explanation of a write operation of the EEPROM.

FIG. 12 shows an operation flow for acceleration of data write relative to the redundant cell array 101. Upon startup of a write cycle, firstly at step SE1, select the timing circuit 402 and then set at an appropriate timing which permits high-speed readout of the redundant cell array 101. Then at step SE2, setting control signals φ1-φ2 and φ4 at "H" level, the sense amplifier 46 is preset so that the node N2 of data latch 461 is in the "H" state, i.e., an erase state (write inhibit state). By commonly forming the control lines of control signals φ1-φ2 and φ4 among all the sense amplifiers, it is possible to allow all of the sense amps to perform this preset operation at a time.

Next at step SE3, perform writing of the redundant cell array 101. More specifically, sequentially set the column select lines CSL at "H" level, and write data given to the data line DI/O2 is sent to each sense amplifier 46. As previously stated, in case the write data is a logic "0", "L" is transferred to the node N2 of sense amplifier 46. Based on the write data held in sense amplifier 46, write is performed to a selected cell of the redundant cell array 101 in the way stated supra.

Use of this sequence makes it unnecessary to transfer write inhibit data ("1" data) to sense amps corresponding to the normal cell array 100; thus, it becomes possible to load the write data at high speeds. After having discharged the output lines 64a-64b of verify check circuit 38 to ground potential GND, turn switch element 39 off (at step SE4). Thereafter, perform a verify-read operation with respect to the write data of redundant cell array 101 (step SE5).

Based on an output Lvfy of the verify check circuit 38, an attempt is made to determine whether a write-deficient cell is present in selected cells of the redundant cell array 101 (at step SE6). More specifically, the control circuit 40 determines write-deficient bits are absent if the verify check output Lvfy is at "L" level; if output Lvfy is at "H" level, controller 40 judges that at least one write-deficient bit is present. Since the switch element 39 is driven to turn off in the verify-read operation as stated previously, high-speed verify check is achievable.

In case a write-deficient bit is found, turn switch 39 on (at step SE7); then, perform rewriting of such write-deficient bit (step SE8). Thereafter, the write pulse application and verify-read operation will be repeated until any write-deficient cells are absent as described previously. In case no write-deficient cells are found, turn switch 39 on (step SE7') and then select the timing circuit 401 to return to the normal read timing, that is, the timing that permits reading of the data of normal cell array 100 (step SE9), followed by completion of the verify operation.

As discussed above, this embodiment is specifically arranged so that any sense amplifiers corresponding to the normal cell array 100 are forced to stay inoperative or "inactive" when performing data writing of the redundant cell array 101. Thus it is possible to lessen or minimize any possible delays in write and read events, which in turn makes it possible to perform the required data writing at higher speeds than the prior art. Further, power consumption and noise generated on the power supply line based on the operation of the normal cell array 100 are reduced. In addition, it is no longer necessary to redesign the memory cell structure and the multilayer structure of wiring layers, thus enabling achievement of high manufacturing yields and increased process reliability. Furthermore, even when a defective column within the normal cell array 100 is replaced by a spare column within the redundant cell array 101, it becomes possible to perform the intended read and write operations at high speeds.

It should be noted that, in this embodiment, it is not inevitable to provide the switch element 39 in the output line 64 of verify check circuit 38. In other words, the use of such switch 39 may be eliminated as far as the delay due to the capacitance and resistance of output line 64 falls within a permissible range. In such case, the operations at steps SE4, SE7 and SE7' become unnecessary.

Major effects and advantages of this embodiment are summarized as follows.

The redundant cell array 101 is disposed at a specific location which is closer to the data select line driver 2 than the normal cell array 100. Accordingly, the delay of data select lines stays less in influenceability with respect to writing and reading of redundant cell array 101. And this embodiment is arranged to further include the timing circuit 402 in addition to the ordinarily required timing circuit 401, which is for generating specific timing signals for realization of read cycles shorter than standard read cycles. With such an arrangement, it becomes possible to speed up the data write and read operations relative to redundant cell array 101.

Another advantage is that use of the above-stated cell array layout enables the redundant cell array 101 to improve in data readout reliability. This can be said because even when a leakage current flows in a data select line, the redundant cell array 101 in the proximity of the data select line driver 2 is less in resistance than the data select line so that array 101 is hardly influenced from and thus remains insensible to a voltage drop occurring due to such leakage current.

Embodiment 2

Figure 13:
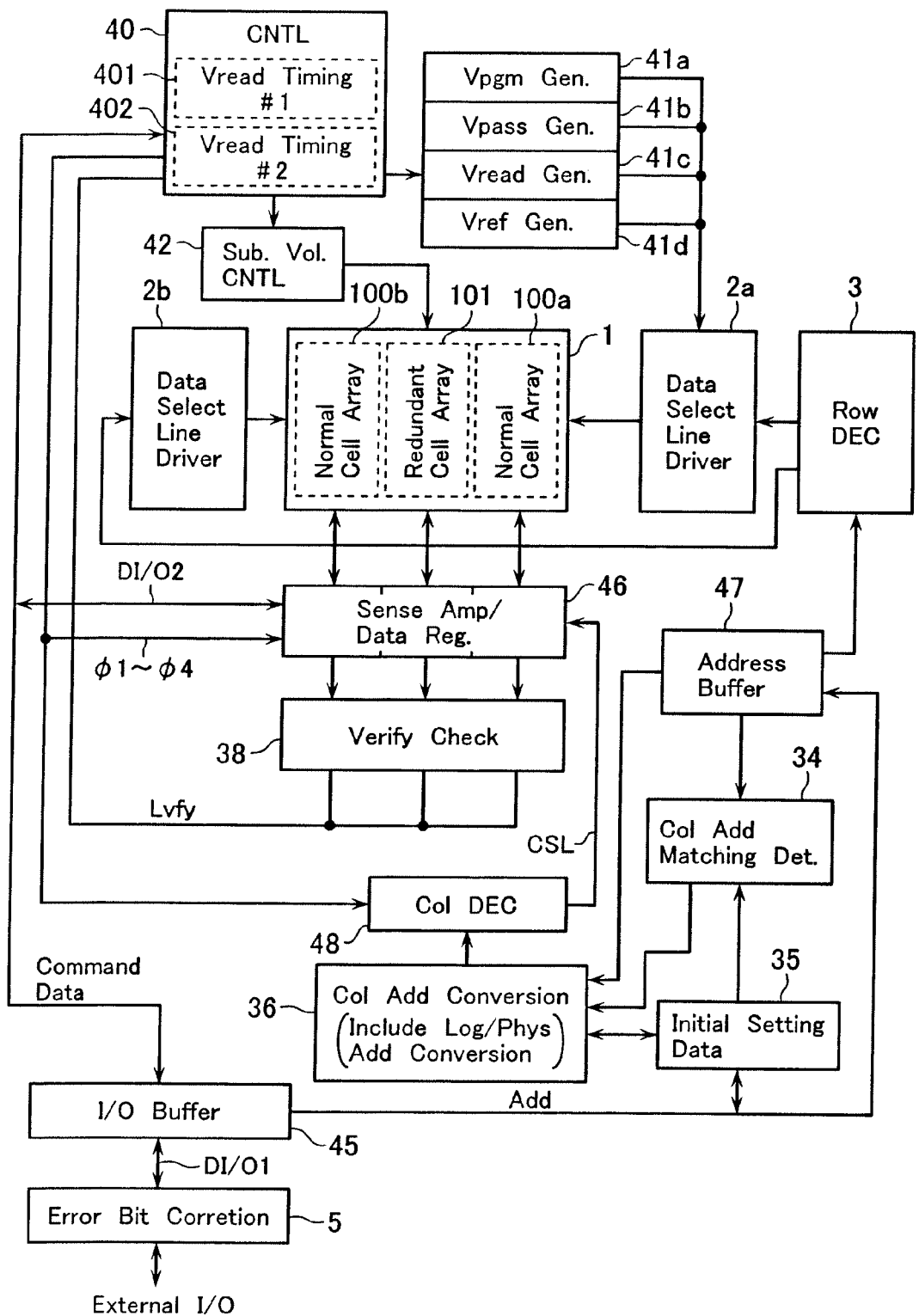
FIG. 13 is a diagram showing in functional block form a configuration of an EEPROM chip in accordance with another embodiment of the invention.

Turning to FIG. 13, an EEPROM chip in accordance with an embodiment 2 of the invention is shown in a functional block form. The same parts or components and the same voltages to those of the embodiment 1 stated supra are denoted by the same reference characters, with detailed explanations thereof eliminated herein. In this embodiment, the column address conversion circuit 36 for performing defective column replacement additionally has therein specific logical/physical column address functionality, which exchanges or "interchanges" the order of sequence of at least part of physical column addresses to be sequentially selected by logical column addresses. With this built-in functionality of the column address converter circuit 36, it becomes possible to finally output the data of a specified storage area which is in the middle of a series of columns, when consecutively outputting data bits of multiple columns within the memory cell array 1. These functions will be explained in detail later.

Figure 14A:
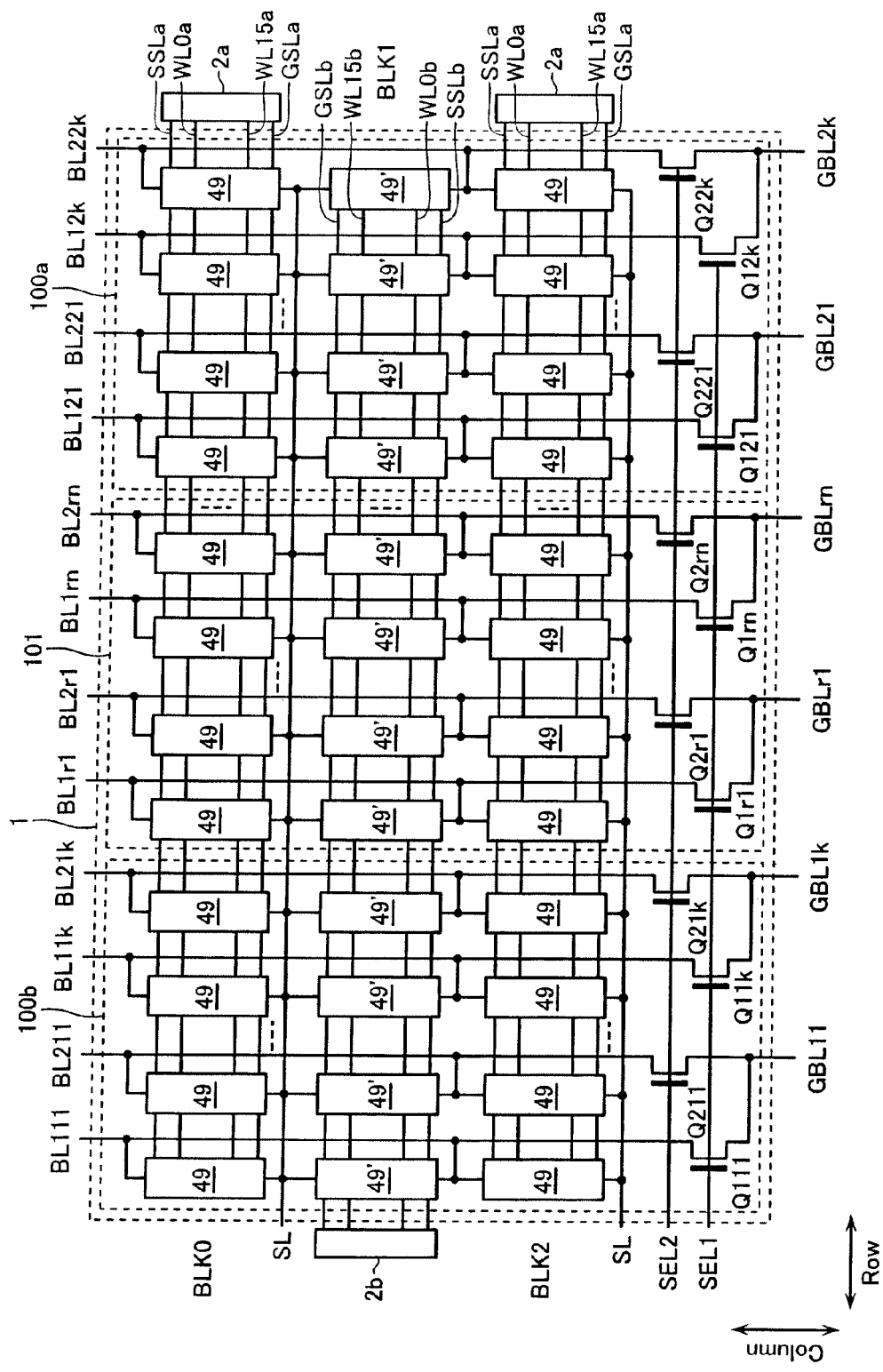
FIG. 14A is a diagram showing a configuration of a memory cell array of the EEPROM.

The embodiment of FIG. 13 is arranged so that the memory cell array 1 has a couple of spaced-apart normal cell arrays 100a and 100b which are disposed in the row direction and a redundant cell array 101 interposed therebetween. Additionally, data select line drivers 2a and 2b are laid out on the opposite side of memory cell array 1. More precisely, as shown in FIG. 14A, a plurality of cell blocks BLK (BLK0, BLK1, BLK2, . . . ) disposed in the direction of data transfer lines consist of even-numbered and odd-numbered cell blocks, wherein the data select line driver 2a operatively associated with the individual even-numbered cell block BLK0, BLK2 is disposed on the right side thereof, whereas the data select line driver 2b associated with odd-numbered cell block BLK1 is on the left side thereof. Alternately disposing the data select line drivers 2a-2b on the opposite sides of the memory cell array 1 in units of cell blocks in this way, it is possible to moderate the pitches—that is, increase the on-chip layout margins—of wiring leads extending from the memory cell array 1 to data select line drivers 2a-b. This makes it possible to facilitate lithography processes of such extension lead portions while at the same time enabling the leads to decrease in length.

Figure 14B:
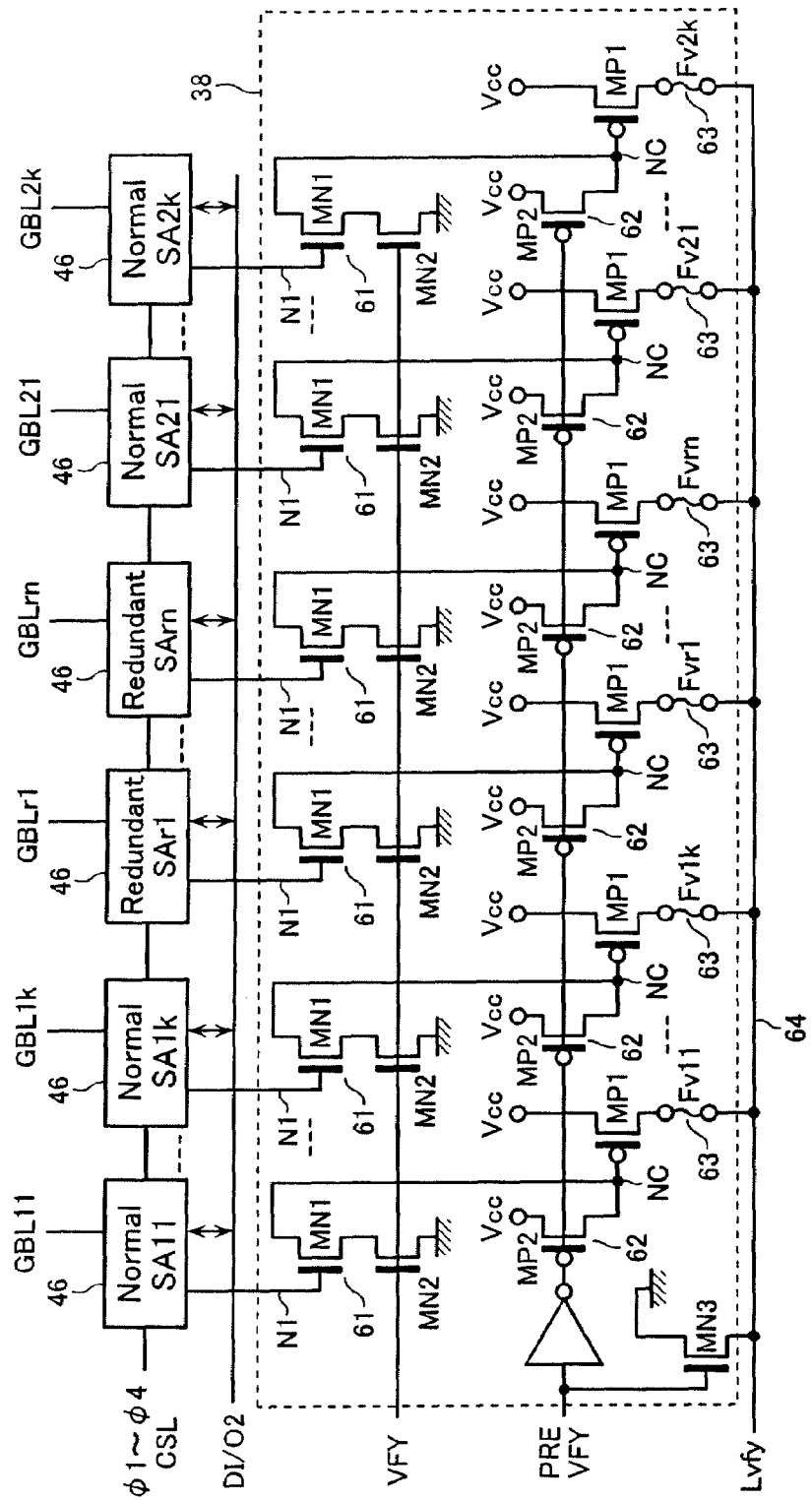
FIG. 14B is a diagram showing a configuration of circuitry including a sense amp circuit and a verify check circuit of the EEPROM of FIG. 13.

FIG. 14A depicts a detailed configuration of the memory cell array 1, while FIG. 14B shows circuitry including sense amplifier circuits 46 and a verify check circuit 38 operatively associated therewith. The bit line number of normal cell array 100a, 100b is "2k", and the bitline number of redundant cell array 101 is "2n". Thus the number of sense amplifiers 46 corresponding to each normal cell array 100a, 100b is "k"; the number of sense amps corresponding to redundant cell array 101 is "n". Letting redundant cell array 101 reside in a central portion of memory cell array 1, it is desirable because the use of this cell array layout makes it possible to almost equally minimize the signal transmission delay on data select lines upon reading of redundant cell array 101 even when either one of the data select line drivers 2a-2b on the both sides is selected.

Note however that this embodiment is effective even in cases where the normal cell arrays 100a and 100b disposed on the right and left sides are not the same in column number as each other.

The embodiment 2 is also similar to the embodiment 1 in that the data of node N1 of sense amplifier 46 is sent forth toward the verify check circuit 38 and then write sequence control is performed. Verify check circuit 38 includes fuse elements (Fv11 to Fv1k, Fv21-Fv2k) 63 corresponding to the normal cell array 100a, 100b and fuses (Fvr1-Fvrn) 63 corresponding to redundant cell array 101, wherein these fuses 63 are commonly connected together to a verify decision output line 64. Unlike the embodiment 1, output line 64 is associated with no switch elements provided therein in this embodiment.

At the time of verify-read, a decision output signal Lvfy is supplied to the output line 64. This signal Lvfy potentially goes high to "H" level in the event that even one write-deficient memory cell is found among those cells which are being sensed by sense amplifiers 46 associated with the fuses Fv11-Fv1k, Fvr1-Fvrn, Fv21-Fv2k being presently set in the conductive state. Appropriately switching these fuses makes it possible to replace a defective column within the normal cell array 100a, 100b with a spare column within redundant cell array 101.

Figure 15:
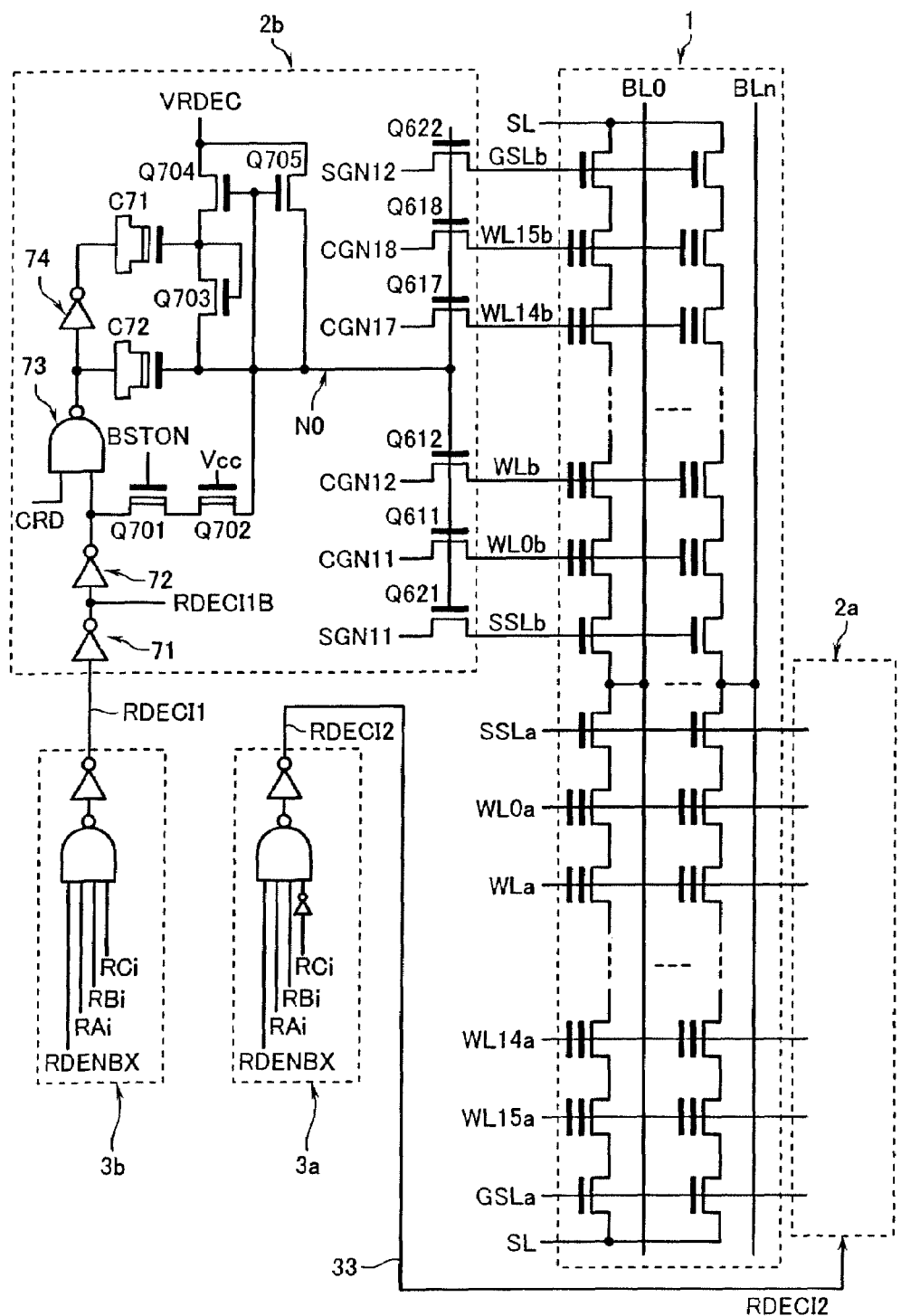
FIG. 15 is a diagram showing a configuration of a data select line driver of the EEPROM.

While the data select line drivers 2a and 2b are alternately disposed at right and left ends of respective cell blocks of the memory cell array 1 on a per-block basis as shown in FIG. 15, a detailed internal configuration of each driver is similar in principle to that of the embodiment 1 shown in FIG. 4.

Regarding block address selector circuits 3a and 3b making up a row decoder 3, these are laid out together on one side of memory cell array 1. The block address selector circuit 3a generates a select signal RDECI2, which is supplied to the data select line driver 2a that is disposed on the other side via a wiring lead 33 which extends to pass through the area of the memory cell array 1.

Two types of timing circuits 401 and 402 are formed in the control circuit 40 of FIG. 13 in a way similar to the previous embodiment 1. Timing circuit 401 is one that is useable for ordinary or "normal" data readout; timing circuit 402 is one for high-speed read use, which generates timing signals at certain time intervals that are shorter than those of timing circuit 401. These timing circuits 401-402 may be principally the same circuits of the embodiment 1 as explained in FIG. 4 or 5.

Regarding the fuse elements, the substitute circuitry shown in FIG. 8 is employable in addition to mechanical fuses formed using polysilicon, silicide, lead metals or the like in a similar way to the embodiment 1.

An explanation will next be given of the column address conversion circuit 36 of FIG. 13, along with an explanation as to its associative defective address storage circuit (fuse set circuit) 35 and column address identity or "matching" detection circuit 34, which is necessary for the explanation of column address converter circuit 36. These fuse set circuit 35 and column address match detector 34 are effective for all the embodiments as disclosed herein. Additionally, the column address converter 36 also is useable in the other embodiments without changes, except for its logical/physical address conversion circuit module.

Figure 16:
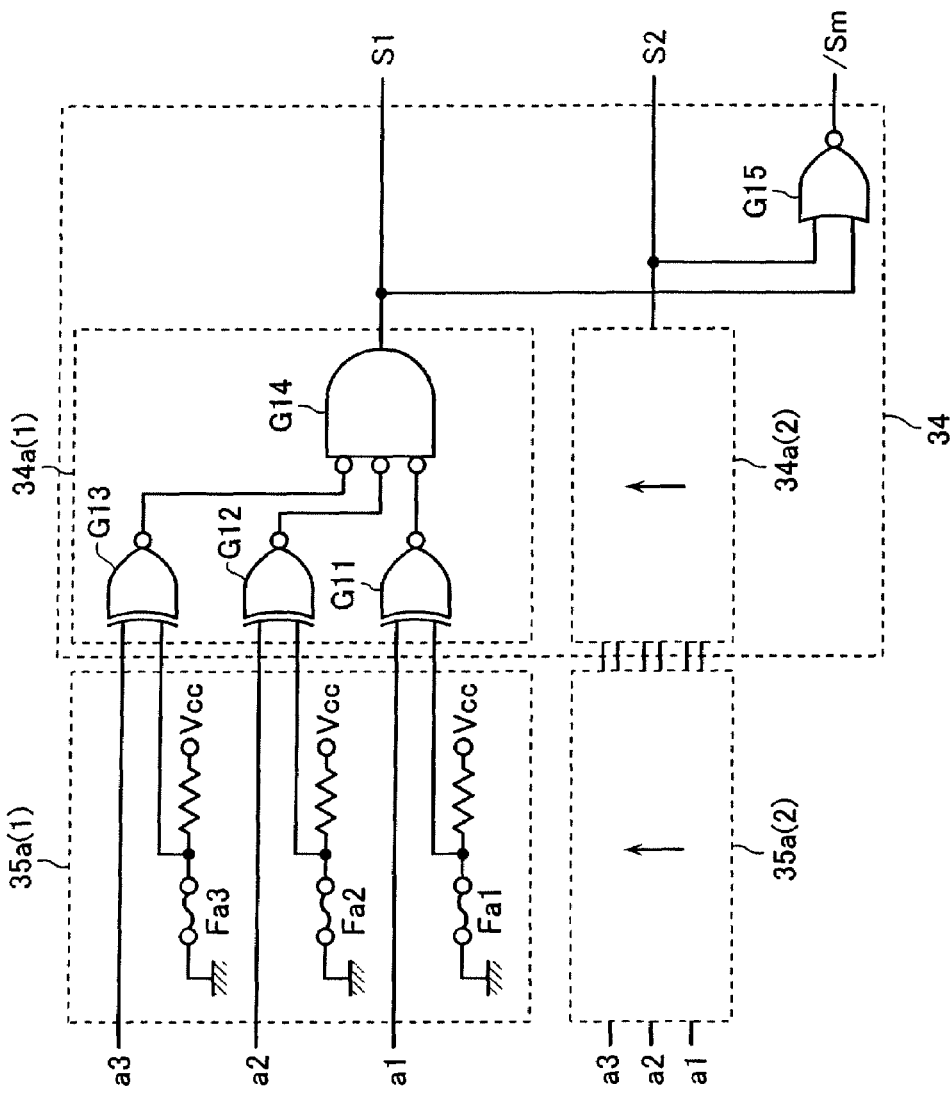
FIG. 16 is a diagram showing a configuration of circuitry of the EEPROM, including an initial setting data storage circuit and a column address match detecting circuit.
Figure 17:
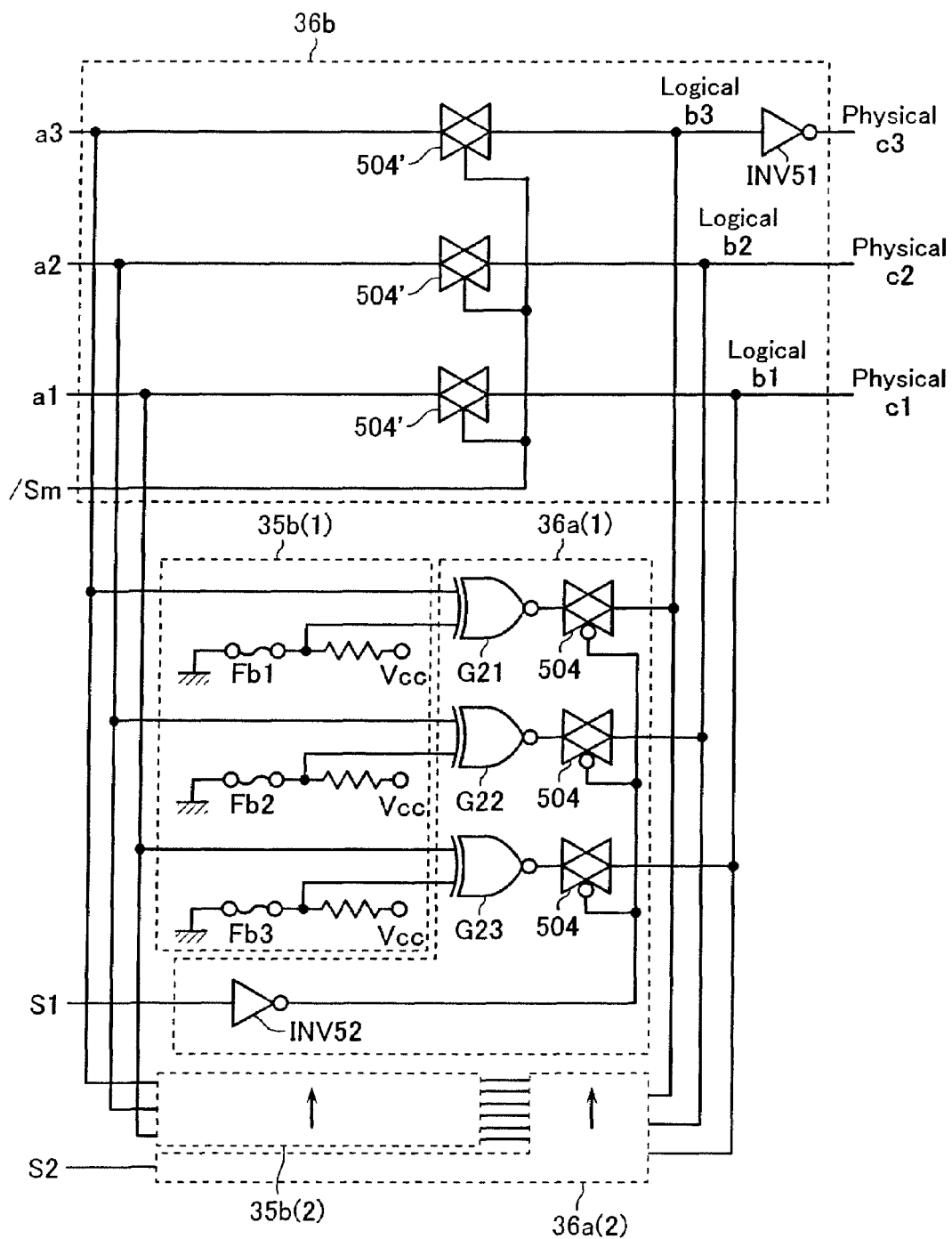
FIG. 17 is a diagram showing a configuration of the EEPROM's circuitry including an initial setting data storage circuit and a column address conversion circuit.

FIGS. 16 and 17 show internal configurations of circuitry including the fuse set circuit 35 (35a(1), 35a(2), 35b(1), 35b(2)) and column address matching detector circuit 34 (34a(1), 34a(2)) plus column address converter circuit 36 (36a(1), 36a(2), 36(b)). Here, to simplify the explanation, suppose that logical column address being designated are six ones of $2^3$=8 column addresses for 3 bits of (a3, a2, a1)—that is, (001), (010), (011), (100), (101) and (110). Regarding physical addresses, the memory cell array 1 of FIG. 14A is assumed as follows: (000), (001) and (010) are assigned to the left-side normal cell array 100b; (011) and (110) are assigned to redundant cell array 101; and (101), (110) and (111) are to the right-side normal cell array 100a.

The fuse set circuit 35a(x), where x is 1 or 2, is such that its fuses are programmed based on a wafer test result to store a defective column address or addresses. This fuse set circuit 35a(x) and the column address match detector circuit 34a(x)—x is 1 or 2—make up circuitry operable to detect whether a presently input column address matches a first logical column address designated by the fuse (Fa1, Fa2, Fa3), by use of Not-Exclusive-OR (NEXOR) gates G11-G13 and an AND gate G14. Upon detection of matching therebetween, that is, when these column addresses are found equal to each other, a match detection signal Sx (where x=1, 2) with "H" level is output. A NOR gate G15 detects that any one of the match detection signals Sx is presently at "H" level and then outputs an enable signal /Sm="L" for performing address replacement.

The fuse set circuit 35b(x) and column address replacing circuit 36a(x) make up circuitry for replacing the first logical column address (a3, a2, a1) with a redundancy column address to obtain a second logical column address (b3, b2, b1). In case the replacement by any redundant columns is not performed, that is, when the enable signal /Sm is at "H" level, bidirectional switches 504' of the column address replace circuit 36b are controlled by this enable signal /Sm to turn, thereby causing the logical column addresses (a3, a2, a1) to directly become logical column addresses (b3, b2, b1).

When performing column address replacement, determine whether the fuse (Fb1, Fb2, Fb3) within fuse set circuit 35b(x) is cut off or rendered conductive, based on the logic of (Fb3, Fb2, Fb1)=(a3. EXOR. b3), (a2. EXOR. b2), (a1. EXOR. b1). Here, fuse cutoff is "1", whereas fuse non-cutoff (conduction) is "0." An expression (A. EXOR. B) indicates Exclusive OR logical processing between parameters "A" and "B", wherein this logical processing is done by Not-Exclusive-OR (NEXOR) gates G21 to G23. Specifically, in the case of performing column replacement, output signals of NEXOR gates G21-G23 are taken out by the bidirectional switches 504 under control of the match detection signal S1, S2, thereby obtaining logical column addresses (b3, b2, b1).

For example in FIG. 17, when replacing a logical column address input of (a3, a2, a1)=(0, 1, 0) by a logical column address output of (b3, b2, b1)=(1, 1, 1), an attempt is made to establish a fuse state of (Fb3, Fb2, Fb1)=(1, 0, 1).

At an output part of such the column address converter circuit 36b, an inverter INV51 is inserted which inverts the uppermost bit a3 (b3) of a logical column address. This inverter INV51 constitutes logical/physical column address conversion circuitry for converting logical column addresses (b3, b2, b1) into physical column addresses (c3, c2, c1). More specifically, this logical/physical column address converter circuit is a conversion circuit for mapping physical addresses at the both ends of a page of the memory cell array 1 to logical addresses of the redundant cell array 101 that exists at the central column part of memory cell array 1, and output address thereof is input to the sense amplifier circuit. In other words, this logical/physical column address converter circuit functions to exchange the order of sequence of at least part of the physical addresses to be sequentially selected by logical column addresses. Although the illustrative converter circuit is designed to use only one inverter INV51, this circuit may be modified to employ other configurations. If this case it is desirable to use circuitry which can assign physical addresses in such a way that these correspond to input logical addresses in at least a one-to-one correspondence fashion.

An example is as follows. Assume that fuse programming of (Fa1, Fa2, Fa3)=(0, 1, 0) and (Fb3, Fb2, Fb1)=(1, 0, 1) is performed. In this case, logical column addresses of (a1, a2, a3)=(001), (010), (011), (100), (101), (110) are converted to physical column addresses of (c1, c2, c3)=(101), (011), (111), (000), (001), (010). It should be noted here that the second address (010) is replaced with a physical address (011) within the redundant cell array 101, rather than a physical address (110) within the normal cell array. Similarly, by appropriately setting the cutoff and non-cutoff (conduction) of fuse elements, any arbitrary six logical column addresses being externally given may be assigned to the physical address (011) of redundant cell array 101.

With such the logical/physical column address conversion scheme, high-speed performance is improved when replacing a defective column of normal cell array 100a, 100b by a spare column of redundant cell array 101. This can be said because when a defective column far from the data select line driver 2a or 2b of normal cell array 100 is replaced with a spare column of redundant cell array 101 at the center of memory cell array 1, it is no longer necessary to provide significant timing margins for such defective column replacement. This also enables improvement in reliability.

The redundant cell array 101 is useable also as either a record area of the error correcting code (ECC) of data or a flag storage area for storing therein the full-erase and write states of memory cells, as in the embodiment 1 stated supra. In particular, in the case of using it as the ECC record area, the above-stated logical/physical address replacement is effective and useful. For example, suppose that the logical column addresses of interest are seven successive logical column addresses of the eight addresses being assigned by (a3, a2, a1), wherein the seven ones are (a3, a2, a1)=(001), (010), (011), (100), (101), (110), (111). Assume that defective column replacement is not performed for simplicity purposes only. If this is the case, the uppermost bit a3 of logical column address is inverted so that their corresponding physical addresses are indicated by (c3, c2, c1)=(101), (110), (111), (000), (001), (010), (011).

With this scheme, the last or final logical column address (111) is converted into a physical column address (011) within the redundant cell array 101, which is accessible at higher speeds. Thus, as in the embodiment 1, it becomes possible to read and write only the redundant cell array 101 with ECC recorded therein at high speeds. Also importantly, in the event that a page of data bits are read consecutively, the logical column addresses are incremented in the order of (a3, a2, a1)=(001), (010), (011), (100), (101), (110), (111). Thus it is possible to force physical access of the redundant cell array 101 to be done lastly in data input/output events.

This is advantageous in the case of using cyclic coding as the coding of the error bit correction circuit 5. More specifically, with cyclic coding schemes, a stream of data bits is input to error bit corrector circuit 5 in the form that ECC data is added as a test bit(s) to the last or "tail" portion thereof. Consequently, execution of the above-stated logical/physical column address conversion results in the redundant cell array 101 for use as the ECC record area being accessed lastly when reading cell data consecutively by standard column address increment. Thus it is possible to perform the intended decoding and coding operations without adding any extra data storage circuitry to the error bit corrector circuit 5. Typical examples of the cyclic coding/decoding circuitry making up the error bit corrector 5 are currently available cyclic Hamming encoder/decoder circuits, cyclic Reed Solomon (RS) coder/decoder circuits, and cyclic redundancy check (CRC) decoder circuits.

As apparent from the discussion above, in accordance with this embodiment, it is possible by providing the logical/physical address converter circuit to speed up, in a similar way to the embodiment 1, the read and write operations of the redundant cell array 101 even in case where redundant cell array 101 is centrally disposed in the memory cell array 1. Although in the above example the functionality of the redundant cell array 101 is explained relative to the case where this array 101 is for use as the spare column area for defective column replacement of the normal cell array 100a, 100b and the case where the array 101 is used as the ECC record area of the data being given to normal cell array 100a, 100b for purposes of convenience in discussion, it is also possible to design redundant cell array 101 to offer the both functions at a time, by disposing therein a plurality of columns.

Also note that in this embodiment, when performing defective column replacement, a certain spare column is selected which is closer to the data select line driver 2a, 2b than the normal column position that is furthest from the data select line driver 2a, 2b. Consequently there are no problems as to the timing delay otherwise occurring due to defective column replacement. Additionally, although in FIGS. 16 and 17 the column address match detector circuit 34a(x) and fuse setter circuits 35a(x)-35b(x) and also address converter circuit 36a(x) are shown in the case of x=2 in order to simplify the explanation, the parameter "x" may generally be any integers greater than 2. The fuses used in these circuits are modifiable to use the fuse substitute circuitry shown in FIG. 8.

Figure 18:
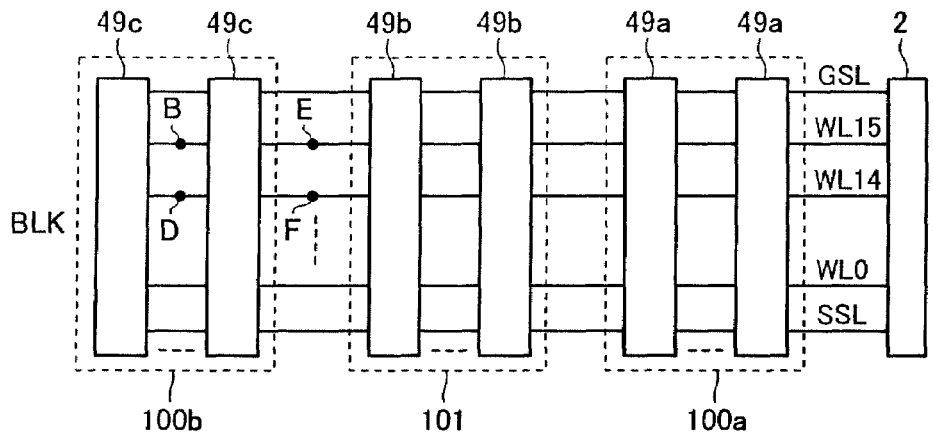
FIG. 18 is a diagram showing a cell block of the memory cell array, for explanation of a write operation of the EEPROM.
Figure 19:
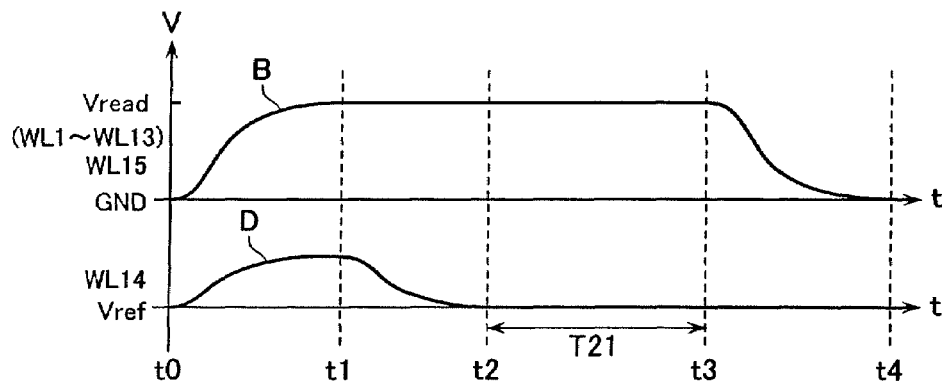
FIG. 19 is a diagram showing data select line voltage changes during a write-verify operation based on ordinary timing control.
Figure 20:
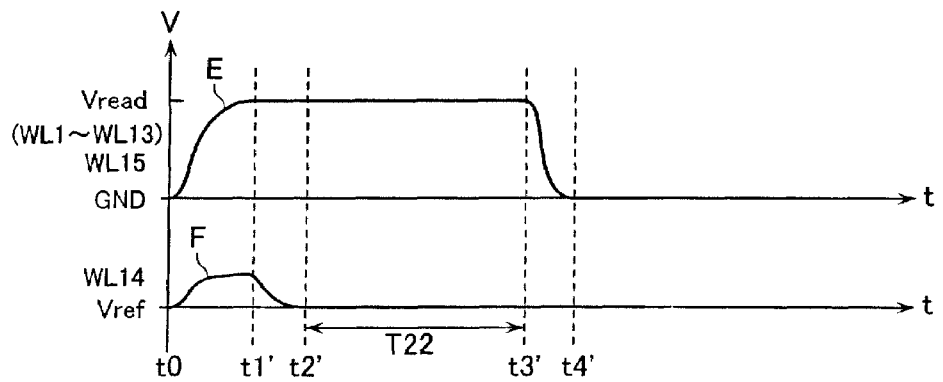
FIG. 20 is a diagram showing data select line voltage changes in a high-speed read mode.

Next, a read operation of the EEPROM of this embodiment will be set forth with reference to FIGS. 18 to 20 below. FIG. 18 shows one cell block BLK within the memory cell array 1 shown in FIG. 13, which is driven by a single data select line driver 2. FIGS. 19 and 20 show voltage waveforms corresponding those of the prior art shown in FIG. 42. More specifically, FIG. 19 is the case where timing control is performed by the Vread timing circuit 401 that is applicable to ordinary or "normal" data reading, while FIG. 20 is the case where timing control is done by the Vread timing circuit 402 applicable to data read operations with the redundant cell array 101 selected.

Both FIG. 19 and FIG. 20 show a case that a data select line WL14 is selected and applied a read voltage Vref, while applying a pass voltage Vread to non-selected data select lines WL0-WL13 and WL15 and show voltage waveforms of the selected data select line WL14 and nonselected data select line WL15. Note here that the voltage waveforms of FIG. 19 are voltage waveforms of the nodes B and D which are on the data select lines WL15 and WL14 within the left-side normal cell array 100b and which are furthest from the data select line driver 2. FIG. 20 shows voltage waveforms of the nodes E and F that are similarly on the data select lines WL15 and WL14 and are at boundary portions between the normal cell array 100b and redundant cell array 101.

Since the node E on the data select line WL15 is closer to the data select line driver 2 than the node B, the pass voltage Vread rapidly rises up in potential from timing t0 and then reaches Vread almost at timing t1'. In contrast, being far from data select line driver 2, node B is more moderate and slower in potential rise-up than the node E. Node B rises up to Vread at timing t1 after elapse of a long time from timing t1'. In case the capacitance between the data select line and the substrate is the most dominant one among all the data select line capacitances, the ratio of (t1'-t0) to (t1-t0) is substantially equal to a ratio of a squared length of a data select line extending from the data select line driver 2 to the node E versus a squared length of a data select line extending from data select line driver 2 to node B. In other words, the longer the data select line, the more the delay time of potential rise-up in a way proportional to the squared value of the data select line length. Hence, in case the redundant cell array 101 is laid out at or near the central portion of the memory cell array 1, the wiring lead delay of the data select line becomes shorter to about ¼ of the wire delay in the case of selecting the memory cell furthest from the data select line driver 2.

On the other hand, while the voltage of data select line WL14 is held by an output of the data select line driver 2 at the read voltage Vref which is lower than the pass voltage Vread within a time period between timings t0 and t1, the voltage rises up due to the presence of capacitive coupling from its neighboring data select lines WL15 and WL13. This voltage rise-up at node D is greater than that at node F adjacent to data select line driver 2. This is because the capacitance and wire resistance of the data select lines WL15 and WL13 capacitively coupled to the node D becomes larger than those relative to the node F.

At timing t1', the data select line WL13 and the node E on data select line WL15 becoming constant in potential, no further potential rise-up occurs at the node F. As data select line WL14 is discharged through the data select line driver 2, it returns almost to Vref at timing t2'. Regarding the node D, the data select lines WL13 and the node B of select line WL15 become constant in potential and no further potential increase takes place, whereby node D discharges through data select line driver 2 so that it returns almost to Vref at timing t2.

In case the capacitance between the data select line and the substrate is the most dominant one among all the data select line capacitances, the ratio of (t2'-t1') to (t2-t1) is substantially equal to a ratio of a squared length of a data select line extending from the data select line driver 2 to the node F versus a squared length of a data select line extending from data select line driver 2 to node D. In other words, the longer the data select line, the more the delay time of potential rise-up in a way proportional to the squared value of the length thereof. In case the redundant cell array 101 is laid out at or near the central portion of the memory cell array 1, the wire delay of the data select line becomes shorter to about ¼ of the wire delay in the case of selecting the memory cell furthest from the data select line driver 2.

As a cell current of a memory cell is determined depending upon a difference between the threshold voltage of the memory cell and the voltage Vref, it is required to measure the memory cell current exactly after the read voltage Vref becomes constant in potential. It is required that readout of cell data within the cell unit 49c of left-side normal cell array 100b shown in FIG. 18 which cell unit is furthest from the data select line driver 2 be done after timing t2. It is also required that memory cell data readout of redundancy cell array 49b be after timing t2'.

In FIGS. 19 and 20, after having reserved certain time ranges or "zones" T21 and T22 necessary for cell current read respectively, let the pass voltage Vread decrease in potential from timings t3 and t3', and then finish a present read operation. Although the node E of data select line WL15 near the data select line driver 2 drops down to ground potential GND at relatively early timing t4' after timing t3', the node B far from data select line driver 2 drops down to ground potential GND at timing t4 with consumption of a longer time from timing t3.

In case the capacitance between the data select line and the substrate is the most dominant one among all the data select line capacitances, the ratio of (t4'-t3') to (t4-t3) is almost equal to a ratio of a squared length of a data select line extending from the data select line driver 2 to the node E versus a squared length of a data select line extending from data select line driver 2 to node B. In other words, the longer the data select line, the more the delay time of potential rise-up in a way proportional to the squared value of the length thereof. In case the redundant cell array 101 is disposed at or near the central portion of the memory cell array 1, the wiring lead delay of the data select line becomes shorter to about ¼ of the wire delay in the case of selecting the memory cell furthest from the data select line driver 2.

As apparent from the foregoing, in the case of reading the cell units 49a to 49c of FIG. 18 simultaneously, a relatively long read cycle time (t4-t0) is required as shown in FIG. 19 due to the fact that resultant read rate is controlled and limited by the pulse delay times (t1-t0), (t2-t1) and (t4-t3) with respect to the cell unit 49c within the left-side normal cell array 100b. On the other hand, in the case of guaranteeing data readout of the cell unit 49b within the redundant cell array 101 without guaranteeing read of any cell unit within the normal cell array 100a, 100b, the read can be done in a shorter cycle time (t4'-t0) than the cycle time (t4-t0) as shown in FIG. 20. More specifically, when performing read of the redundant cell array 101 only, it is possible to reserve within a short cycle time the time zone T22 (=t3−t2) which is the same in length as the cell current-measurable time zone T21 (=t3'−t2') in the case of FIG. 19.

As similar to the embodiment 1, using the timing circuit 410 in order to set up the timings t0 and t1 to t4, while using the timing circuit 402 for setup of the timings t0 and t1'−t4', it is possible to shorten the cycle time in the case of reading the redundant cell array 101. Although in FIGS. 19-20 specific operation waveforms during reading are indicated, the same goes with write events. More specifically, in regard to a pulse falling time after completion of write pulse application, the cell unit 49c far from the data select line driver 2 is longer than the cell unit 49b near data select line driver 2.

In view of this, prepare a write-use timing circuit which generates a write timing signal that is shorter in time than normal write timing signals, and it becomes possible to shorten a write cycle time in the case of writing data into only the redundant cell array 101 when compared to the case of writing data into all the cell arrays.

The above explanation as to the read and write timings is similarly applicable to any one of the data select line drivers 2a and 2b owing to the right-left symmetry of the memory cell array 1.

As discussed above, the redundant cell array 101 is, in this embodiment, laid out at a specified location which is closer to the data select line driver 2 than the memory cell position that is furthest from data select line driver 2 of the normal cell array 100a, 100b. Accordingly, when replacing a defective column within normal cell array 100a, 100b with a spare column within redundant cell array 101, the spare column position is closer to data select line driver 2 than the defective column position furthest from data select line driver 2. This makes it unnecessary to provide significant timing margins for defective column replacement, which in turn enables achievement of enhanced high-speed performance.

Figure 21:
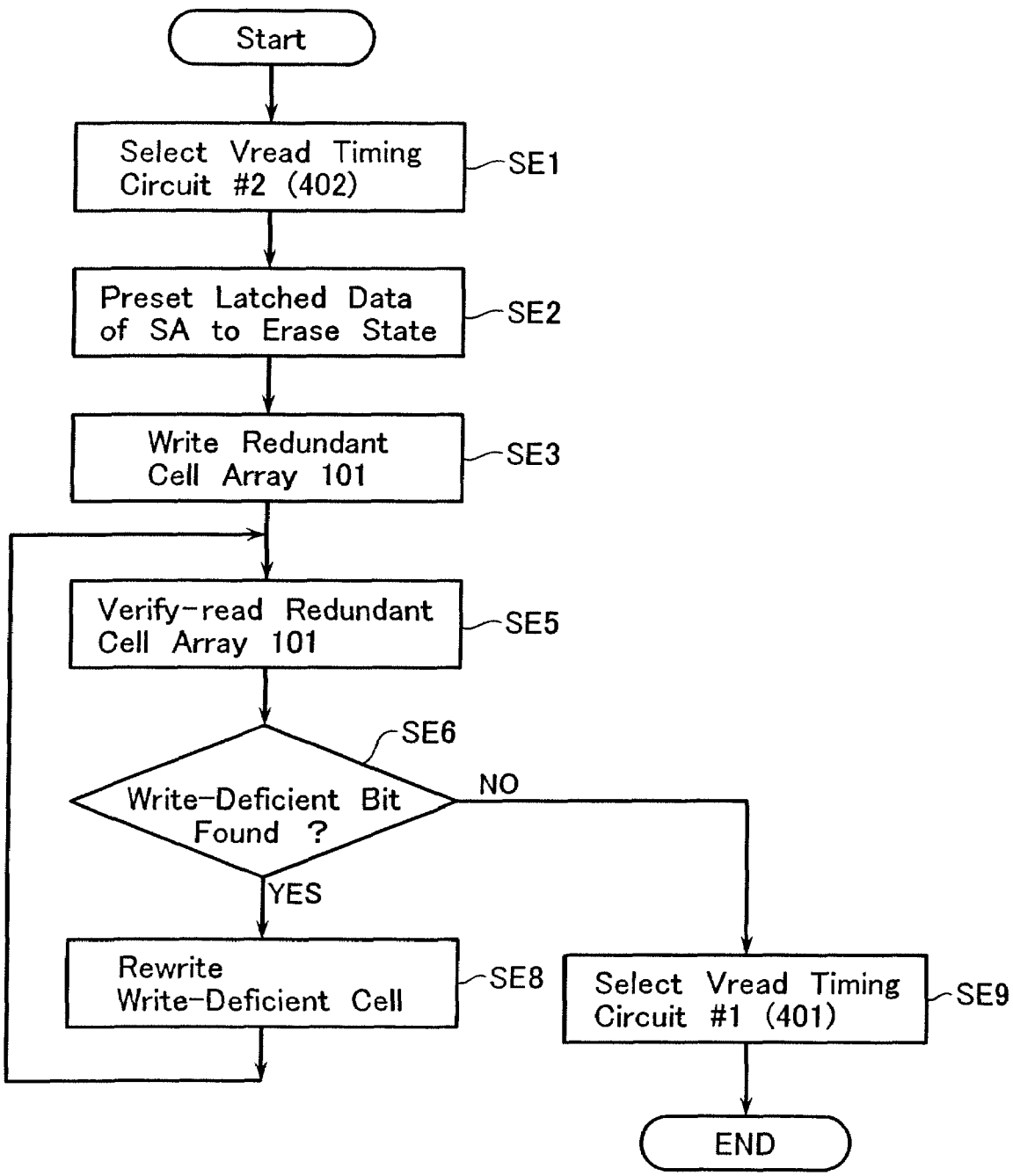
FIG. 21 is a flow chart for explanation of a write operation of the EEPROM.

FIG. 21 shows an operation flow for realization of acceleration of a data write operation relative to the redundant cell array 101, in a way corresponding to the flow diagram of FIG. 12 of the previous embodiment. Upon startup of a write cycle, firstly at step SE1, select the timing circuit 402 and then set at an appropriate timing which permits high-speed readout of the redundant cell array 101. Then at step SE2, setting control signals φ1-φ2 and φ4 at "H" level, the sense amplifier 46 is preset so that the node N2 of data latch 461 is in the "H" state, i.e., an erase state (non-writing state). By commonly forming the control lines of control signals φ1-φ2 and φ4 among all the sense amplifiers, it is possible to allow all of the sense amplifiers to perform this preset operation at a time.

Next at step SE3, perform writing of the redundant cell array 101. More specifically, sequentially set the column select lines CSL at "H" level, and write data given to the data line DI/O2 is sent to each sense amplifier 46. As previously stated, in case the write data is a logic "0", "L" is transferred to the node N2 of sense amplifier 46. Based on the write data being held in sense amplifier 46, write is performed to a selected cell of the redundant cell array 101 in the way stated supra.

Use of this sequence makes it unnecessary to transfer non-write data ("1" data) to any sense amplifiers corresponding to the normal cell arrays 100a and 100b; thus, it becomes possible to load the write data at high speeds. Then, after having discharged the output line 64 of verify check circuit 38 to ground potential GND, perform verify-read with respect to the write data of the redundant cell array 101 (at step SE5).

Then, based on an output Lvfy of the verify read check circuit 38, determine whether a write-deficient cell or cells is/are present among selected cells of the redundant cell array 101 (at step SE6). Specifically, the control circuit 40 determines absence of any write-deficient cells if the verify check output Lvfy is at "L" level; alternatively, when this output Lvfy is at "H" level, the controller 40 judges at least one bit of write-deficient cell is present.

In case a write-deficient bit is found, perform rewrite of such write-deficient bit (at step SE8). Thereafter, the write pulse application and verify-read operation will be repeated until any write-deficient cells are absent as discussed previously. In case no write-deficient cells are found, select the timing circuit 401 to thereby return to the normal read timing, that is, the timing which permits reading of the data of normal cell array 100a, 100b (step SE9), followed by termination of the verify operation.

As stated above, this embodiment also is specifically arranged so that any sense amplifiers corresponding to the normal cell array 100a, 100b are rendered inoperative or "inactive" whenever performing data writing of the redundant cell array 101. Thus it is possible to lessen or minimize any possible delays in write and read events, which in turn makes it possible to perform the required data writing at higher speeds than the prior art. Further, power consumption and noise generated on the power supply line based on the operation of the normal cell array 100 are reduced. In addition, it is no longer necessary to modify the memory cell structure and the multilayer structure of wiring layers, thus enabling achievement of high manufacturing yields and increased process reliability. Furthermore, even when a defective column within the normal cell array 100a, 100b is replaced by a spare column within the redundant cell array 101, it becomes possible to perform the intended read and write operations at high speeds.

Another feature unique to this embodiment is that the column address converter circuit as used therein has logical/physical address conversion functionality for changing or modifying the accessing order of physical addresses, in addition to the column address conversion for ordinary defective column replacement purposes. This address conversion function is achievable by merely adding a single inverter without accompanying risks as to significant increase in on-chip area. Additionally in the column address match detector circuit 34 and fuse setter circuit 35 plus column address converter circuit 36 shown in FIGS. 16-17, a difference in gate delay time between when address replacement is present and when this replacement is absent is equivalent to a difference between the gate delay time of the NOR gate G15 in FIG. 16 and that of the inverter INV52 of FIG. 17. This difference is extremely less. For instance, in case the inverter INV52 is configured from a two-input NOR gate similar to NOR gate G15 with one of two inputs coupled to ground, the above-noted gate delay time difference becomes almost zero. Thus, the delay times at the presence and absence of the address replacement are made equal in length to each other, which in turn enables achievement of an access time with increased uniformity.

It should be noted that in FIG. 13 of this embodiment 2, the control circuit 40 is designed to include two types of read timing circuits 401 and 402 in a similar way to the embodiment 1, thereby enabling realization of selectable high-speed read cycles of the redundant cell array 101. However, this embodiment 2 has a specific effect even if controller 40 does not have such two types of timing circuits 401-402. In other words, the logical/physical address conversion function owned by the column address converter circuit of this embodiment makes it possible to force physical access of the redundant cell array 101 to be done lastly at the time of data input/output in case a page of data bits are read out consecutively. This makes it possible to perform the intended error bit correction with the redundant cell array 101 used as an ECC record area, while eliminating the need to add any extra address converting functions to the error bit corrector circuit.

It should be appreciated that it is possible to widen the embodiment to dispose more normal cell arrays and redundant cell arrays, while keeping such a fashion that two normal cell arrays and a redundant cell array disposed between them constitute a cell unit.

Embodiment 3

Figure 22:
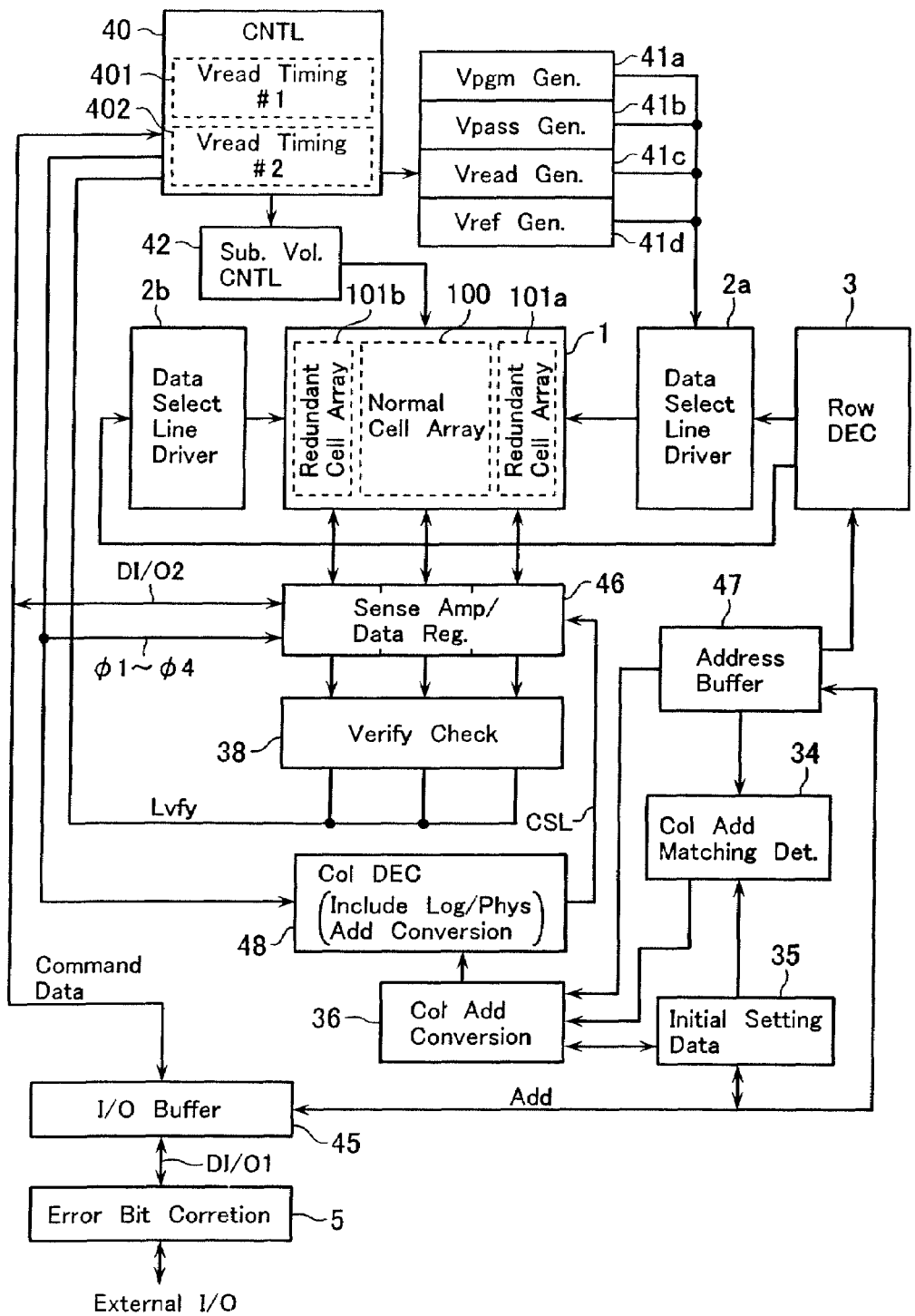
FIG. 22 is a diagram showing in function block form a configuration of an EEPROM chip in accordance with yet another embodiment of the invention.
Figure 23A:
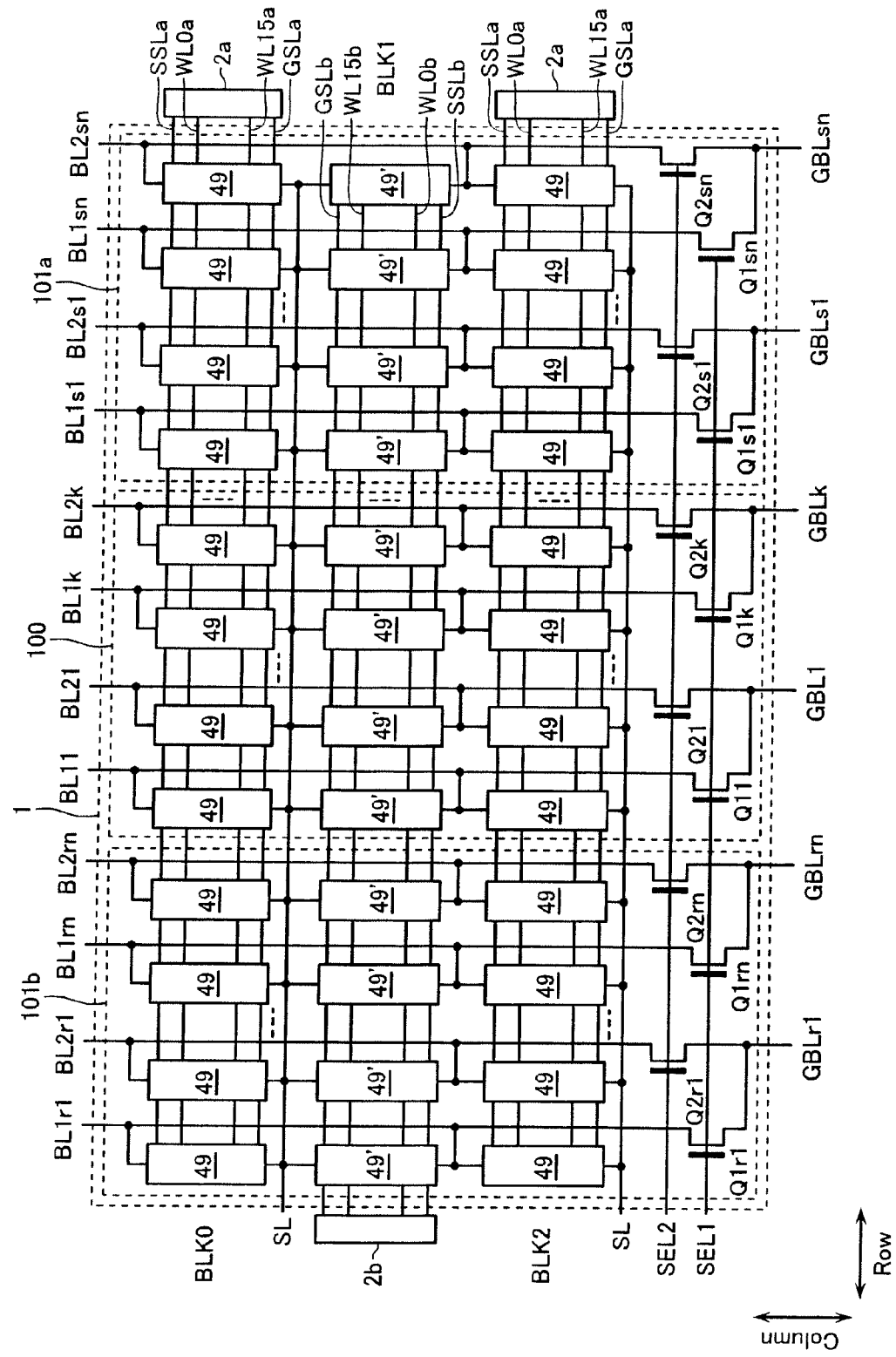
FIG. 23A is a diagram showing a configuration of a memory cell array of the EEPROM.
Figure 23B:
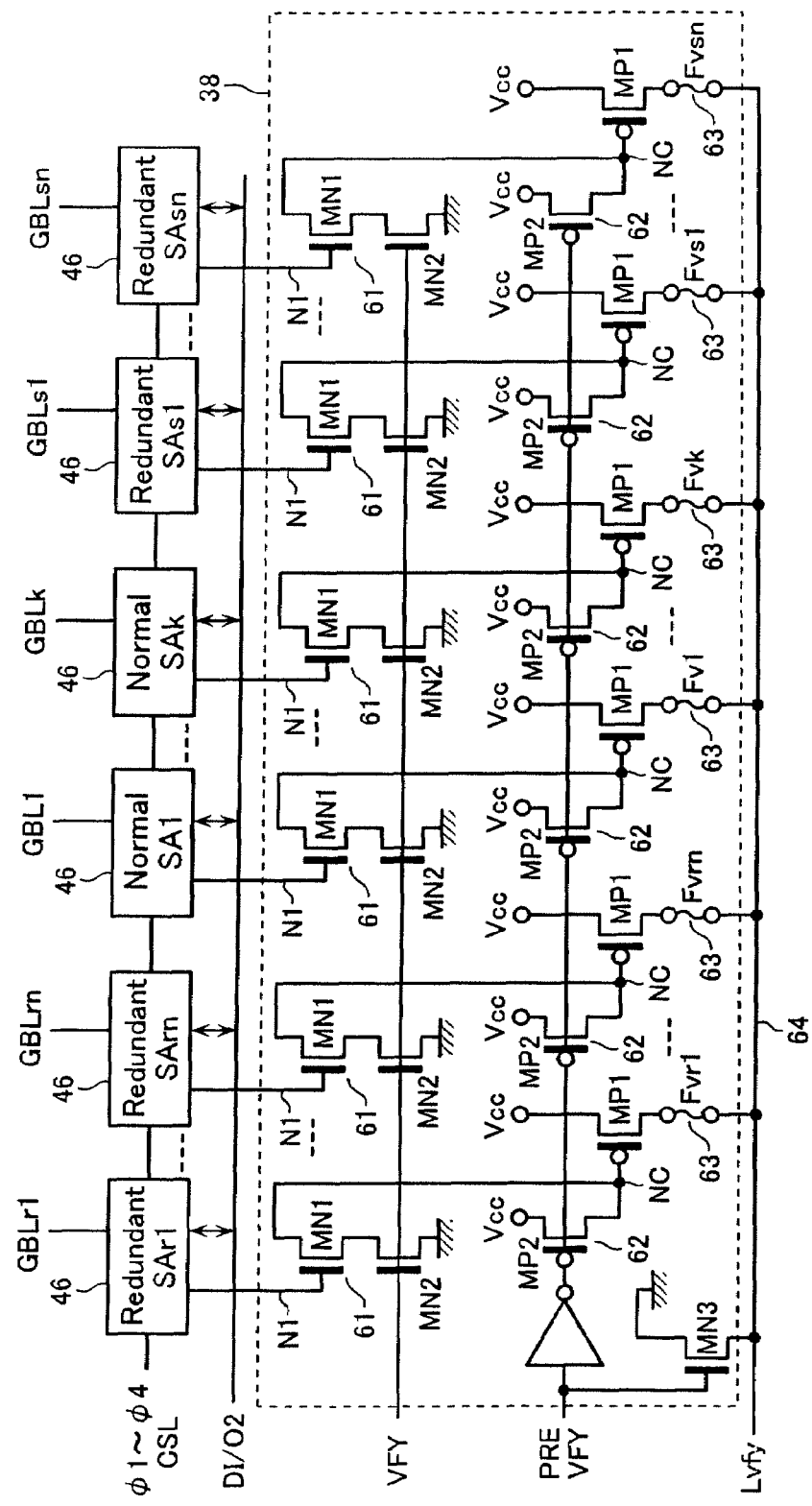
FIG. 23B depicts a configuration of the EEPROM's circuitry including a sense amp circuit and a verify check circuit.

FIG. 22 shows a functional block configuration of an EEPROM in accordance with an embodiment 3 of the invention. FIG. 23A shows a configuration of a memory cell array 1, while FIG. 23B shows internal configurations of a sense amplifier circuit 46 and verify check circuit 38. Parts or components corresponding to those of the embodiments 1-2 stated supra are designated by the same reference characters with detailed explanations thereof eliminated herein. In this embodiment a column decoder circuit 48 is arranged to include therein a logical/physical column address conversion circuit added thereto. The logical/physical column address conversion function as used herein is for causing a certain redundancy cell array adjacent to data select line driver 2a, 2b to be last selected under a condition determined by the relationship in layout between a memory cell array 1 and data select line driver 2a, 2b. In brief, the logical/physical column address conversion function added to column decoder circuit 48 makes it possible to perform high-speed reading of redundant cell array 101 and data input/output of redundant cell array 101 exactly after completion of data input/output of normal cell array 100.

In this embodiment, the memory cell array 1 has a layout with redundancy cell arrays 101a and 101b disposed on the opposite sides of normal cell array 100 in the row direction. In addition, data select line drivers 2a and 2b are laid out on the both sides of memory cell array 1. More specifically, as shown in FIG. 23A, a plurality of cell blocks BLK (BLK0, BLK1, BLK2, . . . ) disposed in the direction of data transfer lines consist of even-numbered and odd-numbered cell blocks, wherein the data select line driver 2a operatively associated with the individual even-numbered cell block BLK0, BLK2 is disposed on the right side thereof, whereas the data select line driver 2b associated with odd-numbered cell block BLK1 is on the left side thereof. Alternately disposing the data select line drivers 2a-2b on the opposite sides of the memory cell array 1 in this way, it is possible to moderate the pitches of wiring leads extending from the memory cell array 1 to data select line drivers 2a-b. This makes it possible to facilitate lithography processes of such extension lead portions while enabling the leads to decrease in length.

In FIG. 23A, the normal cell array 100 is "2k" in bit-line number, whereas each of the redundant cell array 101a, 101b is "2n" in bit-line number. Accordingly as shown in FIG. 23B, the number of sense amplifiers corresponding to normal cell array 100 is "k", while the number of sense amps corresponding to each redundancy cell array is "n". With such cell array layout and also with the logical/physical column address conversion function of column address decode circuit 48 to be later described, it is guaranteed that certain one of the redundancy cell arrays 101a-101b closer to a presently selected one of the data select line drivers 2a-2b is accessed. This makes it possible to provide high-speed access to the redundancy cell arrays.

Note here that this embodiment is effective even when the laterally disposed right and left redundancy cell arrays 101a and 101b are not the same as each other in column number.

This embodiment 3 is similar to the embodiments 1-2 in that the data at node N1 of sense amplifier 46 is sent to the verify check circuit 38 and then write sequence control is performed. Verify check circuit 38 includes fuses (Fv11 to Fv1k) 63 corresponding to the normal cell array 100 and fuses (Fvr1-Fvrn, Fvs1-Fvsn) 63 corresponding to the redundant cell array 101b, 100a, all of which fuses are commonly coupled together to a verify decision output line 64 as shown in FIG. 23B. Unlike the embodiment 1, output line 64 is associated with no switches.

At the time of verify-read, a decision output signal Lvfy is supplied to the output line 64. This signal Lvfy potentially goes high to "H" level in the event that even one write-deficient memory cell is found among those cells which are being sensed by sense amplifiers 46 associated with the fuses Fv11-Fv1k, Fvr1-Fvrn, Fv21-Fv2k being presently set in the conductive state. Appropriately switching these fuses, it becomes possible to replace a defective column within the normal cell array 100 with a spare column within redundant cell array 101a, 101b, by way of example.

While the data select line drivers 2a-2b are alternately disposed at right and left ends of respective cell blocks of the memory cell array 1 on a per-block basis as shown in FIG. 23A, a detailed internal configuration of each driver is similar to that of the embodiment 1 shown in FIG. 4. Driver layout is similar to that of the embodiment 2 stated previously.

Two types of read timing circuits 401 and 402 are formed in the control circuit 40 of FIG. 13 in a way similar to the previous embodiments 1-2. Timing circuit 401 is the one that is useable for ordinary or "normal" data readout; timing circuit 402 is one for high-speed read use, which generates timing signals at certain time intervals that are shorter than those of timing circuit 401. These timing circuits 401-402 may be principally the same circuits of the embodiment 1 as explained in FIG. 4 or 5.

Regarding the fuse elements, the alternative circuitry shown in FIG. 8 is employable in addition to mechanical fuses formed using polysilicon, silicide, lead metals or the like in a similar way to the embodiment 1.

Figure 24:
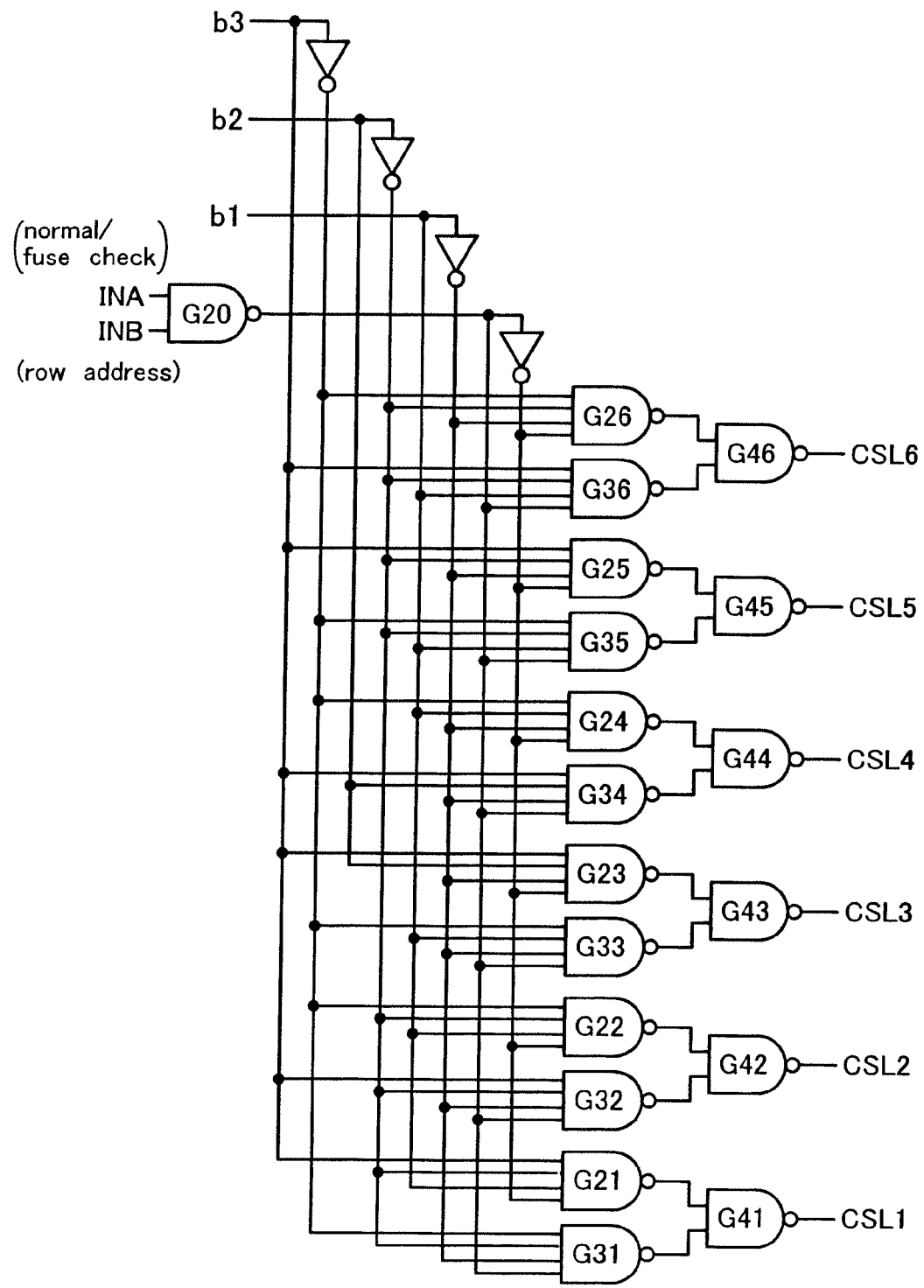
FIG. 24 is a diagram showing a configuration of a column decoder of the EEPROM.

FIG. 24 shows a detailed configuration of the column decoder 48 including a logical/physical column address conversion circuit. In this embodiment, a specific one of the two redundancy cell arrays 101a-101b which is less in wire delay of data select line is selected in a way pursuant to which one of the data select line drivers 2a-2b is used (in other words, in accordance with which one of the cell blocks is presently selected). To do this, a special function is required which performs conversion between physical and logical column addresses in a way depending upon a row address (i.e., block address). This function is added to the column decoder circuit 38.

For purposes of simplification of explanation, assume here that logical column addresses for data assignment are such that six ones are designated from 3-bit eight addresses of (b3, b2, b1); for example, (000), (001), (010), (011), (100) and (101). Also suppose that physical column addresses (c3, c2, c1) are as follows: (000) is assigned to a column select signal line CSL1 which is for selection of the left-side redundant cell array 101b of FIG. 23; (001), (010), (011) and (100) are assigned to column select signal lines CSL2 to CSL5 for selection of the normal cell array 100; (101) is to a column select signal line CSL6 for selection of the right-side redundant cell array 101a.

In FIG. 24, a group of NAND gates G21, G22, ..., G26 is provided to perform decoding of (b3, b2, b1)=(c3, c2, c1) for converting presently input logical column addresses directly into physical addresses. These NAND gates are operatively associated with NAND gates G31, G32, ..., G36, which are prepared as a decode gate group for performing different logical/physical column address conversion under prespecified conditions. An output of NAND gate G21, G22, ..., G26 and an output of its associated NAND gate G31, G32, ..., G36 are selected by a corresponding one of NAND gates G41, G42, ..., G46 so that "H" is selectively output to the column select signal lines CSL1 to CSL6. These column select signals are to be input to the gates of column select transistors MN13 of the sense amplifier circuits 46, one of which is shown in FIG. 3.

An AND gate G20 having its inputs for receipt of two input signals INA and INB is provided for selectively activating either one of the group of NAND gates G21 to G26 and the group of NAND gates G31-G36. One input signal INB is a row address signal, which is at "H" or "L" level in responding to which one of the data select line drivers 2a and 2b is selected. The other input signal INA is a control signal, which is set at "H" during normal operations and at "L" in fuse check events for performing defective column replacement.

During normal operations with INA="H", when a cell block is selected and INB="L", the group of NAND gates G21-G26 is made active. At this time, the physical column addresses (c3, c2, c1) become equal to the logical column addresses (b3, b2, b1) as stated previously. And, in a column address correspondence way, one of the column select signal lines CSL1-CSL6 becomes "H" level. For example, suppose that INB="L" is the row address corresponding to a cell block that is connected to the data select line driver 2a. In this case the logical column address being (c3, c2, c1)=(1, 0, 1), the right-side redundant cell array 101a is selected by the column select signal line CSL6.

On the other hand, when another cell block is selected resulting in INB="H" during normal operations with INA="H", the group of NAND gates G21-G26 is made inactive; and the group of NAND gates G31-36 is activated instead. As a result, the logical column addresses (b3, b2, b1)=(000), (001), (010), (011), (100), (101) are converted sequentially into physical column addresses (c3, c2, c1)= (101), (100), (011), (010), (001), (000). More specifically, the column select signal lines CSL1-CSL6 to be selected by the logical column addresses become reverse in order to the above-stated example. INB="L" is the row address that corresponds to a cell block as connected to the data select line driver 2b. In this case, the logical column address is (c3, c2, c1)=(1, 0, 1) in the same way as the above example so that the left-side redundant cell array 101b is selected by the column select signal line CSL1.

To be brief, when assigning the logical column address (c3, c2, c1)=(1, 0, 1) as a column address required for high-speed access, entry of this column address makes certain that an appropriate one of the redundant cell arrays 101a or 101b adjacent to a presently selected data select line driver 2a, 2b is selected irrespective of which one of these drivers 2a and 2b is selected. Thus it becomes possible to perform high-speed read and write operations of the redundancy cell array.

It is noted that although specific examples are shown herein which cause all the column addresses to be converted in the reverse order, part of the column addresses for the normal cell array 100 is not always be inverted so that its corresponding logical/physical column address conversion circuitry may be eliminated.

Next, in a test mode (fuse check mode) with the input INA being set at "L" level, the group of NAND gates G21-G26 is activated to cause the physical column addresses (c3, c2, c1) to become equal to the logical column addresses (b3, b2, b1). If any input with INA="L" is absent, in the column decoder circuit of FIG. 24, the column address of a presently selected cell block differs in response to which one of the data select line drivers 2a-2b is selected in the event for testing a column in which a defective bit is present. Accordingly, when performing column replacement with respect to a plurality of defective memory cells existing at the same physical column address, a failure to output as the same logical column address can occur in some cases; thus, address replacement becomes necessary for determination or "judgment" of the column replacement, which in turn requires use of an extra test-use memory and circuitry. Fortunately in this embodiment, owing to inputting of INA="L", any address replacement is no longer required for judgment in the case of performing such column replacement. This eliminates the need for any extra test-use memory and circuitry.

Figure 25:
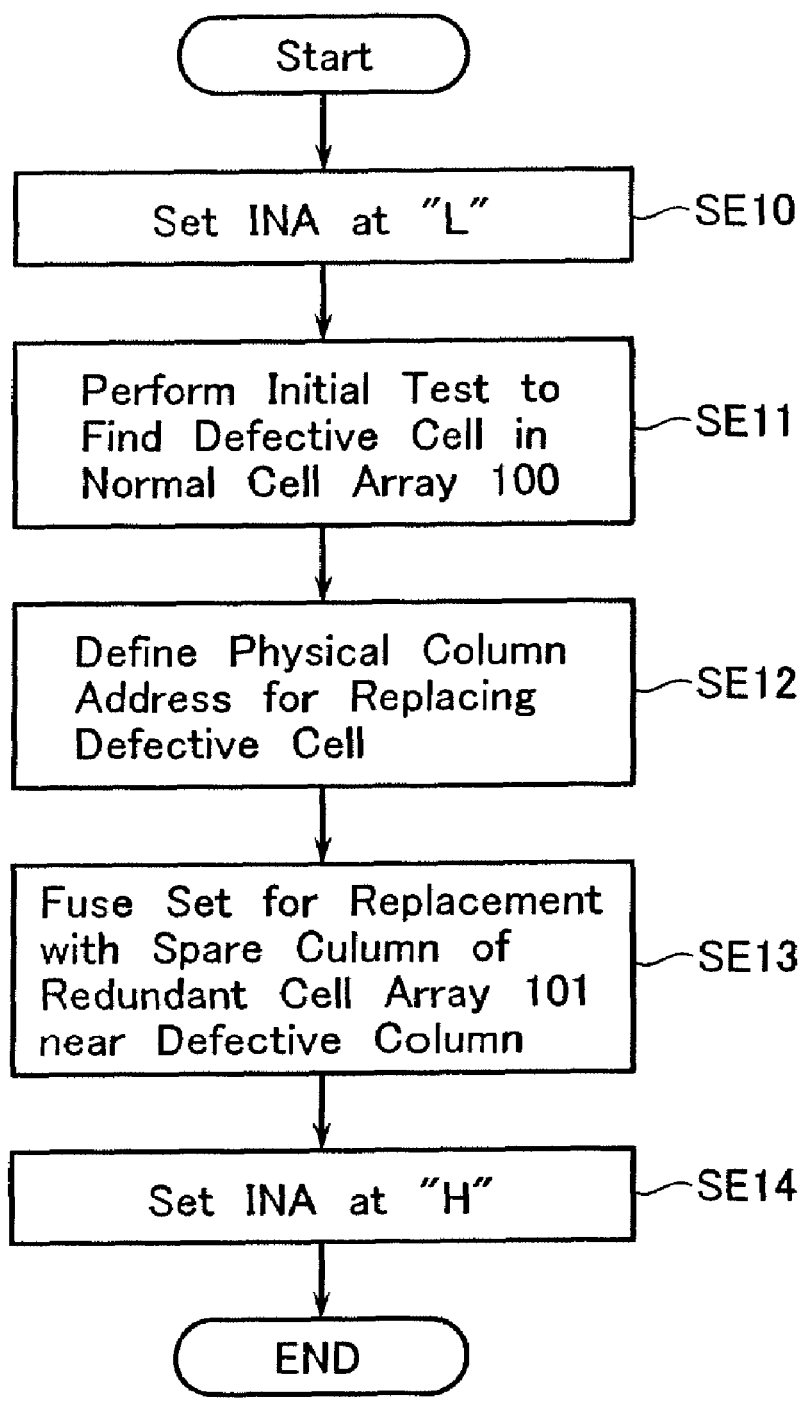
FIG. 25 is a flow chart for explanation of a defective column replacing operation of the EEPROM.

FIG. 25 shows an operation flow in the case of performing defective column replacement in this embodiment. Firstly at step SE10, set the input signal INA at "L" level, and the physical column addresses (c3, c2, c1) become equal to logical column addresses (b3, b2, b1) during defective memory cell testing in the way stated above. Then at step SE11, perform initial tests of write, erase and read with respect to the normal cell array 100, thereby detecting the address of a defective memory cell, if any, within normal cell array 100.

Next, at step SE12, determine whether the defective memory cell thus detected is replaced by column replacement or not. In the case of performing the column replacement, determine a physical column address including the defective memory cell. Then at step SE13, program the fuse set circuit in such a way as to perform replacement with a spare column in certain redundancy cell array on the side near the physical column containing the defective memory cell. The fuses as used herein may be mechanical fuses or alternative circuitry as has been stated in conjunction with the embodiments 1 and 2. When replacing the defective column with a spare column in adjacent thereto, the difference in delay time between data select lines in association with the column replacement gets smaller, resulting in any appreciable timing deviation or offset being hardly occurrable.

Then at step SE14, set the input INA at "H" level. In other words, set up specific conditions which change the mapping of the logical and physical column addresses in response to receipt of a row address. With this setup, it is possible to suppress the delay occurring during reading and writing of the redundancy cell array 101a, 101b to less than the delay occurring during read and write of the normal cell array 100. In particular, use of the column decoder circuit 48 including its built-in physical/logical column address converter circuit, and it becomes possible to permit the logical addresses of redundancy cell array 101*a*, 101*b* with high-speed read/write capabilities to remain identical without regard to row addresses.

For example, suppose that when reading a row of data bits consecutively, these are read out in the order of (b1, b2, b3)=(000), (001), (010), (011), (100) and (101). In accordance with this embodiment, it is possible to force the physical access of a redundancy cell array in data input/output events to be done lastly, without regard to which cell block is presently selected. As previously stated in the embodiment 2, in case cyclic coding techniques are used as the coding scheme of the error bit corrector circuit 5, a specific form is employed which causes ECC data to be added as a test bit at the last or "tail" portion of a train of information data bits. With this embodiment, it is possible to store the ECC data in the redundant cell array with physical access being last done. This in turn makes it possible to achieve the intended decoding and encoding operations without adding any extra data storage circuitry to the error bit corrector circuit 5. Examples of the cyclic coding/decoding circuitry making up the error bit corrector 5 are currently known cyclic Hamming encoder/decoder circuits, cyclic Reed Solomon (RS) coder/decoder circuits, and cyclic redundancy check (CRC) decoder circuits.

As apparent from the foregoing, it becomes possible, by providing the logical/physical column address conversion function in the column decoder as in this embodiment, to read and write at least the intended redundancy cell array at high speeds in a similar way to the embodiments 1 and 2 even when redundancy cell arrays 101*a* and 101*b* are provided on the opposite sides of the normal cell array 100. So far, there have been explained specific examples which make use of the redundancy cell array as the spare column area for defective column replacement purposes and also as the ECC record area of the data being given to the normal cell array. However, it may also be designed to have a function that these are combined together. In this embodiment also, it is no longer required to modify the memory cell structure and/or the multilayer structure of wiring lead layers. Thus it is possible to attain increased production yields and high process reliability.

Figure 26:
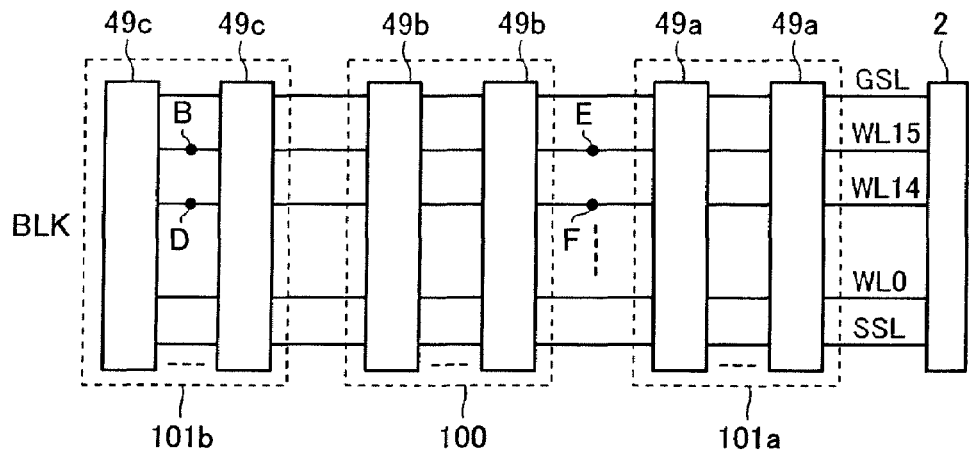
FIG. 26 is a diagram showing a cell block of the memory cell array, for explanation of a write operation of the EEPROM.
Figure 27:
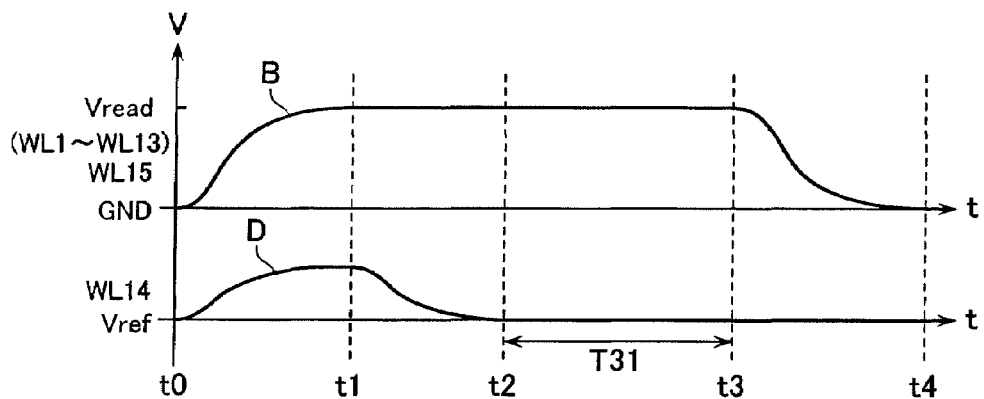
FIG. 27 is a diagram showing data select line voltage changes during a write-verify operation based on ordinary timing control.
Figure 28:
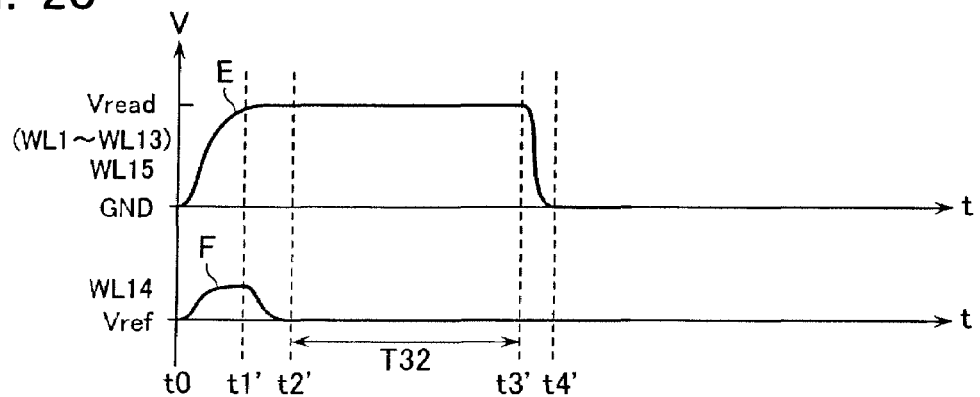
FIG. 28 is a diagram showing data select line voltage changes in a high-speed read mode.

An explanation will next be given of a read operation of the EEPROM of this embodiment with reference to FIGS. 26 to 28 below. FIG. 26 shows one cell block BLK among those of the memory cell array 1 shown in FIG. 22, which is driven by a single data select line driver 2. FIGS. 27 and 28 show voltage waveforms corresponding to that of the prior art shown in FIG. 42. Specifically, FIG. 27 is the case where timing control is performed by the Vread timing circuit 401 that is applicable to ordinary or "normal" data reading, while FIG. 28 is the case where timing control is done by the Vread timing circuit 402 applicable to data read operations selecting the redundant cell array 101*a* adjacent to the data select line driver 2.

Both FIG. 27 and FIG. 28 assume that a data select line WL14 is selected and is applied a read voltage Vref while applying a pass voltage Vread to non-selected data select lines WL0-WL13 and WL15 and show voltage waveforms of the selected data select line WL14 and nonselected data select line WL15. Note here that FIG. 27 shows voltage waveforms of the nodes B and D which are on the data select lines WL15 and WL14 within the left-side normal cell array 100*b* and which are furthest from the data select line driver 2, while FIG. 28 shows voltage waveforms of the nodes E and F that are similarly on the data select lines WL15 and WL14 and are at boundary part between the normal cell array 100 and redundant cell array 101*a*.

Since the node E on the data select line WL15 is closer to the data select line driver 2 than the node B, the pass voltage Vread rapidly rises up in potential from timing t0 and then reaches Vread almost at timing t1'. In contrast, being far from data select line driver 2, node B is more moderate and slower in potential rise-up than the node E. Node B rises up to Vread at timing t1 after elapse of a long time from timing t1'. In case the capacitance between the data select line and the substrate is the most dominant one among all the data select line capacitances, the ratio of (t1'–t0) to (t1–t0) is substantially equal to a ratio of a squared length of a data select line extending from the data select line driver 2 to the node E versus a squared length of a data select line extending from data select line driver 2 to node B. In other words, the longer the data select line, the more the delay time of potential rise-up in a way proportional to the squared value of the data select line length. Hence, in case the redundant cell array 101*a* near the data select line driver 2 is selected, the wiring lead delay—i.e. online signal transmission delay—of data select line is suppressed to less than or equal to $[i/(2i+j)]^2 \times 100[\%]$ when compared to the case of memory cells within the normal cell array 100 that is furthest from the data select line driver 2, where "i" is the total number of columns of redundancy cell array 101*a*, 101*b*, and "j" is the total column number of normal cell array 100.

On the other hand, while the voltage of data select line WL14 is held by an output of the data select line driver 2 at the read voltage Vref which is lower than the pass voltage Vread within a time period between timings t0 and t1, the voltage rises up due to the presence of capacitive coupling from its neighboring data select lines WL15 and WL13. The voltage rise-up of the node D is greater than that of the node F adjacent to data select line driver 2. This is true because the capacitance and wire resistance of the data select lines WL15 and WL13 capacitively coupled to the node D becomes larger than those relative to the node F.

At timing t1', the data select line WL13 and the node E on data select line WL15 are constant in potential so that no further potential rise-up occurs at the node F. As data select line WL14 is discharged through the data select line driver 2, it returns almost to Vref at timing t2'. Regarding the Node D, the data select lines WL13 the node B of select line WL15 become constant in potential and no further potential increase takes place. Whereby node D is discharged through data select line driver 2, and it returns almost to Vref at timing t2.

In case the capacitance between the data select line and the substrate is the most dominant one among all the data select line capacitances, the ratio of (t2'–t1') to (t2–t1) is almost equal to a ratio of a squared length of a data select line extending from the data select line driver 2 to the node F versus a squared length of a data select line extending from data select line driver 2 to node D. In other words, the longer the data select line, the more the delay time of potential rise-up in a way proportional to the squared value of the length thereof. Upon selection of the redundant cell array 101*a* near the data select line driver 2, the wire delay of data select line is reduced to less than or equal to $[i/(2i+j)]^2 \times 100$ [%] when compared to the case of memory cells within the redundant cell array 101*b* that is furthest from data select line driver 2, where "i" is the total column number of the redundant cell array 101*a*, 101*b*, and "j" is the total column number of the normal cell array 100.

As a cell current of a memory cell is determined depending upon a difference between the threshold voltage of the memory cell and the voltage Vref, a need is felt to measure the memory cell current exactly after the read voltage Vref becomes constant in potential. It is required that readout of cell data within the cell unit 49c of left-side normal cell array 100b shown in FIG. 26 which cell unit is furthest from the data select line driver 2 be done after timing t2. It is also required that memory cell data readout of the redundancy cell array 49b near data select line driver 2 be done after timing t2'.

In FIGS. 27 and 28, after having reserved certain time ranges or "zones" T31 and T32 necessary for cell current read respectively, let the pass voltage Vread decrease in potential from timings t3 and t3', and then terminate a present read operation. Although the node E of data select line WL15 near the data select line driver 2 drops down to ground potential GND at relatively early timing t4' after timing t3', the node B far from data select line driver 2 drops down to ground potential GND at timing t4 with consumption of a longer time from timing t3.

In case the capacitance between the data select line and the substrate is the most dominant one among all the data select line capacitances, the ratio of (t4'−t3') to (t4−t3) is almost equal to a ratio of a squared length of a data select line extending from the data select line driver 2 to the node E versus a squared length of a data select line extending from data select line driver 2 to node B. In other words, the longer the data select line, the more the delay time of potential rise-up in a way proportional to the squared value of the length thereof. Upon selecting of the redundant cell array 101a near the data select line driver 2, the wire delay of data select line is reduced to less than or equal to $[i/(2i+j)]^2 \times 100[\%]$ when compared to the case of the memory cells within the redundant cell array 101b that is furthest from data select line driver 2, where "i" is the total column number of redundant cell array 101a, 101b, and "j" is the total column number of normal cell array 100.

As apparent from the foregoing, in the case of reading the cell units 49a to 49c of FIG. 26 simultaneously, a relatively long read cycle time (t4−t0) is required as shown in FIG. 27 due to the fact that resultant read rate is controlled and limited by the pulse delay times (t1−t0), (t2−t1) and (t4−t3) with respect to the cell unit 49c within the left-side redundant cell array 101b. On the other hand, in the case of guaranteeing data readout of the cell unit 49a within the right-side redundant cell array 101a without guaranteeing read of any cell units within the normal cell array 100 and redundant cell array 101b, the read can be done in a shorter cycle time (t4'−t0) than the cycle time (t4−t0) as shown in FIG. 28. In the case of performing read of the redundant cell array 101a adjacent to the data select line driver 2, it is possible to reserve within a short cycle time the time zone T32 (=t3−t2) which is the same in length as the cell current-measurable time zone T31 (=t3'−t2') in the case of FIG. 27.

As in the embodiment 1, using the timing circuit 410 in order to set up the timings t0 and t1 to t4, while using the timing circuit 402 for setup of the timings t0 and t1'-t4', it is possible to shorten the cycle time in the case of reading the redundant cell array 101a near the data select line driver. Although in FIGS. 27-28 specific operation waveforms during reading are indicated, the same goes with write events. More specifically, in regard to a pulse falling time after completion of write pulse application, the cell unit 49c far from the data select line driver 2 is longer than the cell unit 49a near data select line driver 2.

In view of this, prepare a write-use timing circuit which generates a write timing signal that is shorter in time than normal write timing signals. Using this timing circuit makes it possible to shorten a write cycle time in the case of writing data into only the redundant cell array 101a near the data select line driver 2 when compared to the case of writing data into all the cell arrays.

The above explanation as to the read and write timings is similarly applicable to any one of the data select line drivers 2a and 2b owing to the right-left symmetry of the memory cell array.

Another feature of this embodiment is as follows: when looking at the data select line driver 2a, the redundant cell array 101a is disposed on the side closer to the driver 2a than the memory cell of normal cell array 100 which cell is furthest from driver 2a. Similarly, regarding the data select line driver 2b, the redundant cell array 101b is laid out on the side closer to the driver 2b than the memory cell of normal cell array 100 that is furthest from driver 2b. Accordingly, whenever replacing a defective column within the normal cell array 100 by a spare column within redundant cell array 101a, 101b, it is possible to select a suitable spare column that is closer to the data select line driver 2a or 2b than such defective column. It is apparent from the foregoing discussion that it is unnecessary to provide any significant timing margins for defective column replacement. This makes it possible to achieve the intended memory cell array with enhanced high-speed performance and improved reliability.

It should be appreciated that it is possible to widen the embodiment to dispose more normal cell arrays and redundant cell arrays with keeping a fashion that two redundant cell arrays and a normal cell array disposed between them constitute a cell unit.

Embodiment 4

Figure 38:
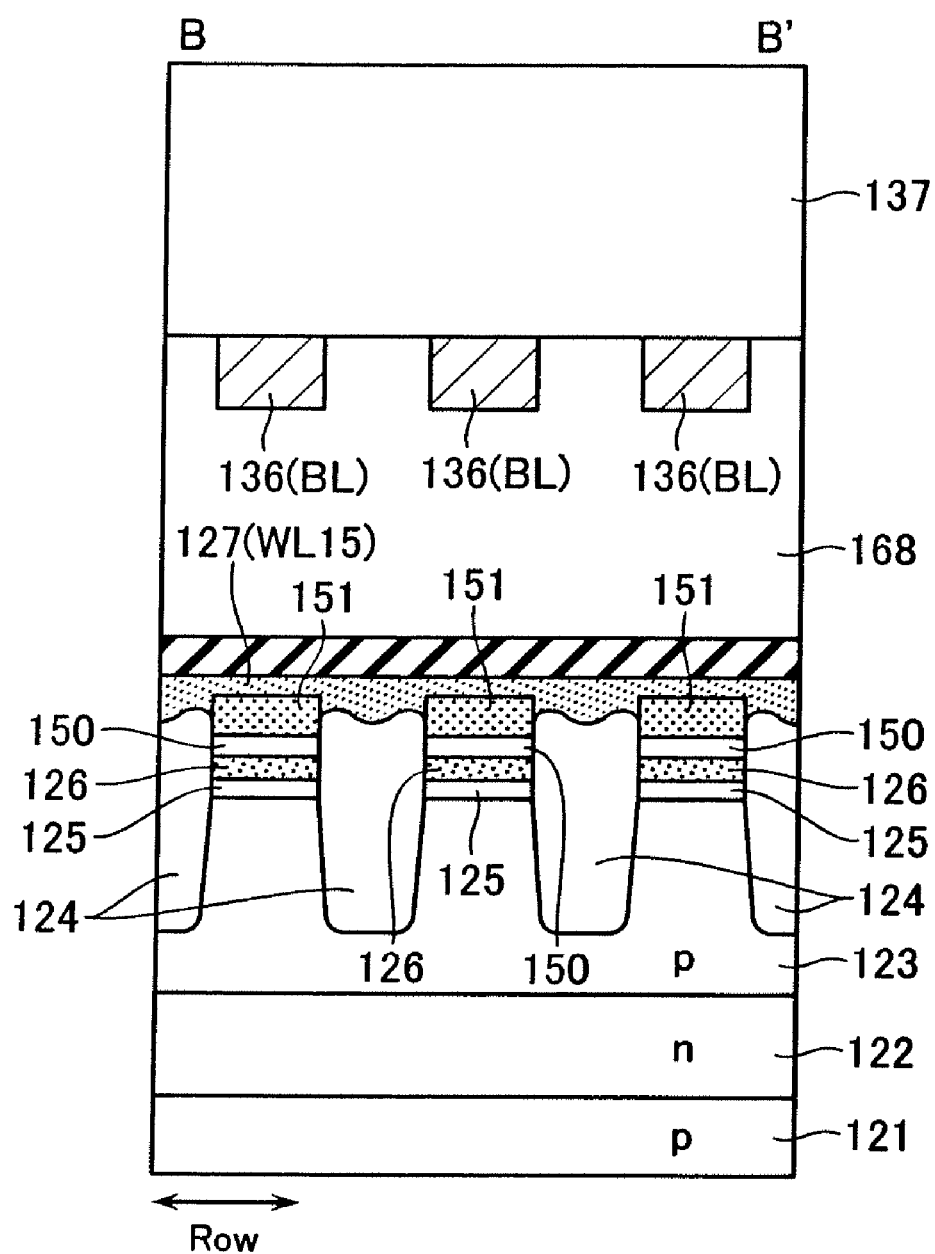
FIG. 38 is a sectional view of the FIG. 35 cell unit as taken along line B-B' in the case of using MONOS type memory cells.
Figure 39:
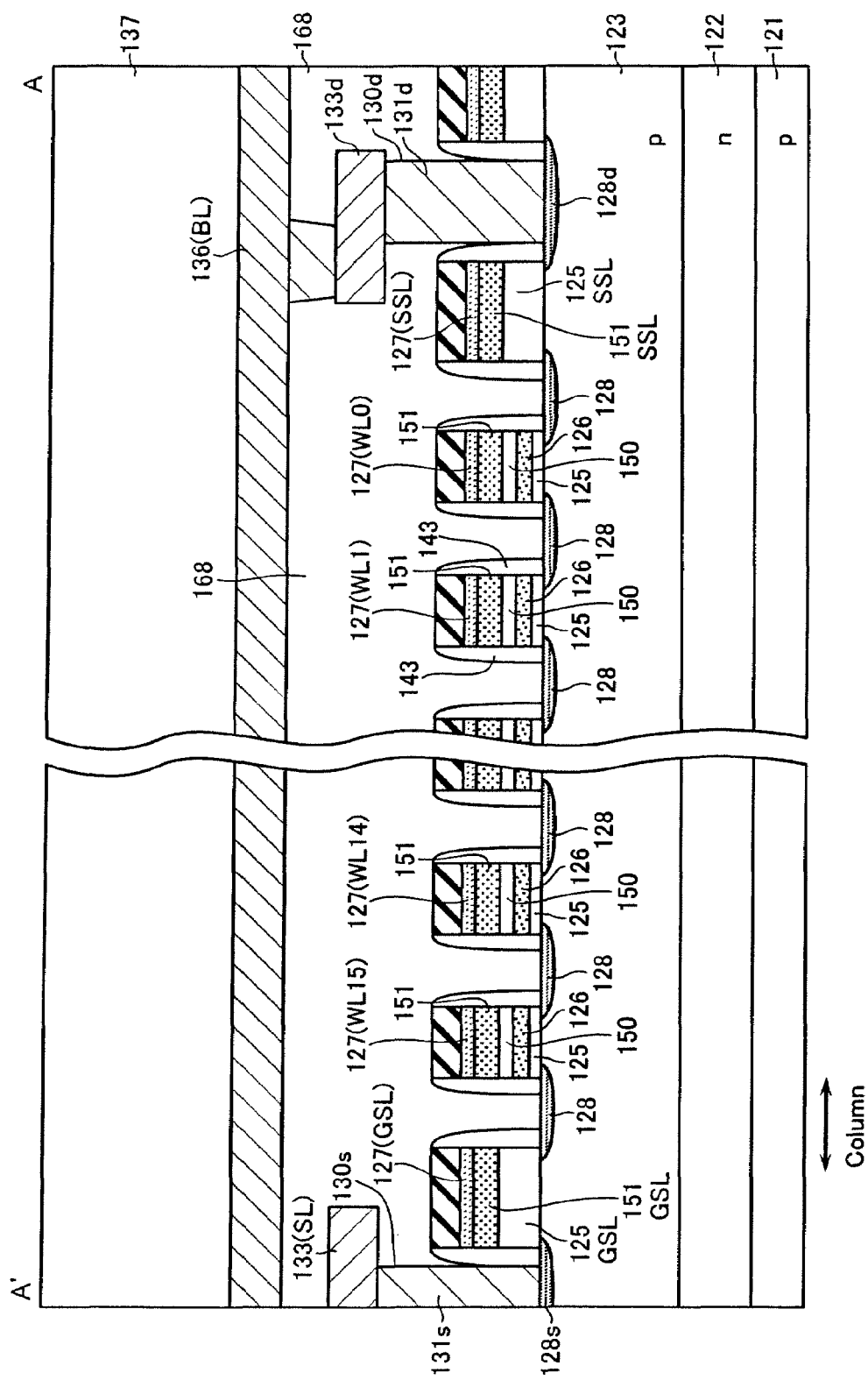
FIG. 39 is a sectional view of the FIG. 35 cell unit as taken along line A-A' in the case of using the MONOS memory cells.

Although the embodiments stated above are arranged to use NAND type cell arrays with memory cells each having a floating gate as its charge storage layer, such floating gate type memory cells may be replaced with metal-oxide-nitride-oxide-silicon (MONOS) type memory cells. Cross-sectional views of a NAND cell unit in such embodiment corresponding to FIGS. 36 and 37 are shown in FIGS. 38 and 39, respectively. Its plan view is the same as that of FIG. 35. Also note that in FIGS. 38-39, components corresponding to those of FIGS. 36-37 are denoted by the same reference characters with a detailed explanation omitted herein.

Each of non-volatile MONOS memory cells M0 to M15 has a charge storage layer 126 made of SiN or SiON or $Al_2O_3$. These memory cells M0-M15 are connected in series to have one end which is connected to a bit line BL through a select transistor S1 and the other end which is connected to a common source line SL via a select transistor S2. These memory cells and select transistors are formed on the same well region. More specifically, charge storage layers 126 made of SiN, SiON or $Al_2O_3$ are formed to a thickness of 3 to 50 nm, above a p-type silicon region (well) 123 with a tunnel gate dielectric film 124 interposed between p-type silicon well 123 and each layer 126. The p-well 123 is doped with boron to an impurity concentration of $10^{14}$ to $10^{19}$ $cm^{-3}$. The tunnelling gate insulator film 124 may be a silicon oxide or oxynitride film with a thickness of 1 to 10 nm.

A control gate 127 is formed above the charge storage layers 126 with an interlayer dielectric film 150 sandwiched therebetween. This film 150 is made of silicon oxide, $Al_2O_3$, HfSiO, ZrSiO, HfSiON or ZrSiON, with a thickness of 2 to 10 nm. The control gate 127 is formed of polysilicon, a stacked structure of tungsten silicide (WSi) and polysilicon or a stacked structure of NiSi, MoSi, TiSi or CoSi and polysilicon. Its thickness is 10 to 500 nm.

The control gate 127 is continuously formed to extend up to a cell block boundary in such a manner as to be shared by cell units which are laterally laid out in FIG. 35, thereby constituting data select lines WL0-WL15 and select gate control lines SSL and GSL. The p-type well region 123 is electrically isolated by an n-type silicon region 122 from a p-type semiconductor substrate 121 so that p-well 123 is applied a voltage in a way independent of the substrate 121. Using this structure design, it is desirable in order to reduce booster circuit loads during erasing to thereby suppress electrical power consumption.

The gate structure of this embodiment is such that sidewalls of the semiconductor region 123 are covered with an element isolation dielectric film 124. This ensures that the substrate surface is hardly exposed during etching processes prior to formation of the charge storage layers 126. Thus it is possible to prevent the control gate 127 from underlying the semiconductor region 123. Hence, the concentration or "localization" of gate electric fields and creation of parasitic transistors with decreased threshold voltages hardly occur at the boundary or interface between the semiconductor region 123 and dielectric film 124. Furthermore, write threshold level reduction phenomena (so called the "sidewalk" phenomena) due to electric field localization becomes less occurrable. Thus it is possible to fabricate transistors with increased reliability.

On both sides of the individual one of these gate electrodes, n-type diffusion layers 128 are formed with sidewall dielectric films 143 interposed. Each n-type diffusion layer 128 is for use as a source or drain. The sidewall insulator films 143 are made of silicon nitride or silicon oxide with a thickness of 5 to 200 nm. These diffusions 128 and charge storage layer 126 plus control gate 127 make up a nonvolatile EEPROM cell of the MONOS type. Preferably the gate length of charge storage layer 126 falls within a range of from 0.5 to 0.01 μm. The n-type source/drain diffusion layers 128 are formed by diffusion techniques to have a depth ranging from 10 to 500 nm, with a chosen impurity such as phosphorus, arsenic or antimony doped so that its surface concentration is $10^{17}$ to $10^{21}$ cm$^{-3}$. Each n-type diffusions 128 is shared by neighboring memory cells, resulting in realization of a string of NAND cells, also known as NAND string.

Select gate transistors have their gates 127SSL and 127GSL, which are formed of the same layer as control gates 127 of MONOS memory cells and which are formed by patterning as to continuously extend as select gate lines (block select lines) SSL and GSL. The gate electrodes 127SSL and 127GSL are greater in gate length than the memory cell gate electrodes; desirably, the gate length of the former is less than or equal to 1 μm and yet greater than or equal to 0.02 μm by way of example. With this gate length setting, it is possible to attain significant turn-on/off ratios at the time of block selection and at the time of nonselection. This in turn makes it possible to preclude or at least greatly suppress write failures and read errors.

An n-type diffusion layer 128d which is formed on one side of the gate 127SSL at one end of the illustrative NAND cell unit is connected through an electrical contact 131d to a bit line (BL) 136 for use as a data transfer line. The bit line BL is made of tungsten, tungsten silicide, titanium, titanium nitride, or aluminum. The data transfer line 136 is formed to continuously extend to reach the memory cell array boundary so as to be shared by neighboring memory cell units in the lengthwise direction of FIG. 35. An n-type diffusion layer 128s that is formed on one side of the other gate 127GSL is connected via a contact 131s to a source line (SL) 133. The source line SL is formed continuously to extend up to a cell block boundary so that this line is shared by a plurality of cell units as laid out in the lateral direction of FIG. 35.

The contacts 131d and 131s are conductors such as for example n-type or p-type doped polysilicon, tungsten, tungsten silicide, Al, TiN, Ti, or other similar suitable conductive materials. The bit line BL and source line SL are electrically isolated from each other by an interlayer dielectric film 168 which is made of $SiO_2$ or SiN or else. At upper part of the bitline BL, a protective dielectric film 137 is formed. This film is made of, for example, $SiO_2$, SiN, polyimide or equivalents thereto. This protective insulator 137 is covered or coated with its overlying wiring leads made of W, Al or Cu, although not depicted in FIGS. 38-39.

In the case of using the cell array structure of this embodiment also, similar effects and advantages to those of the embodiments 1 to 3 are obtainable while employing a circuit scheme similar to that of any one of the embodiments 1-3. In addition, as this embodiment is arranged to make use of MONOS-EEPROM cells, the following effects are obtainable.

(a) It is possible to potentially lower the write and read voltages when compared to floating gate type EEPROM cells. This makes it possible to retain the required withstanding or breakdown voltage even when narrowing the element isolation distance and making gate dielectric films thinner. Furthermore, it is possible to lessen the on-chip area of circuitry with high voltages applied thereto, which in turn makes it possible to reduce or "shrink" the resultant chip area.

(b) The charge storage layer 126 may be reduced in thickness to 20 nm or less, thereby enabling reduction of aspect ratios at the time of gate fabrication. This results in improvements in gate electrode micro-patterning capabilities and also in burying ability or "buriability" of the interlayer dielectric film 168.

(c) Any processes for forming floating gate electrodes and for making slits are no longer required. Thus the resulting processes become simpler.

(d) The charge storage layer 126 is excellent in charge holding properties since this layer is an electrical insulator and thus captures charge carriers at charge traps. A typical advantage thereof lies in an ability to obtain strong radiation resistivity, which permits charge carriers to hardly go away and thus continue staying even upon receipt of radiation rays. Additionally even when the sidewall insulator films 143 are made thinner, it will no longer happen that all of the charge carriers as captured at charge storage layer 126 escape together. Thus it is possible to maintain good charge retaining/holding characteristics.

(e) It is possible to form the charge storage layer 126 without accompanying the risk of misalignment with its associative semiconductor region 123. This in turn makes it possible to achieve uniform capacitance between the charge storage layer 126 and semiconductor region 123. Thus it is possible to reduce or minimize any possible deviation in memory cell capacitance while at the same time lessening unwanted variability in capacitance between memory cells.

Figure 33:
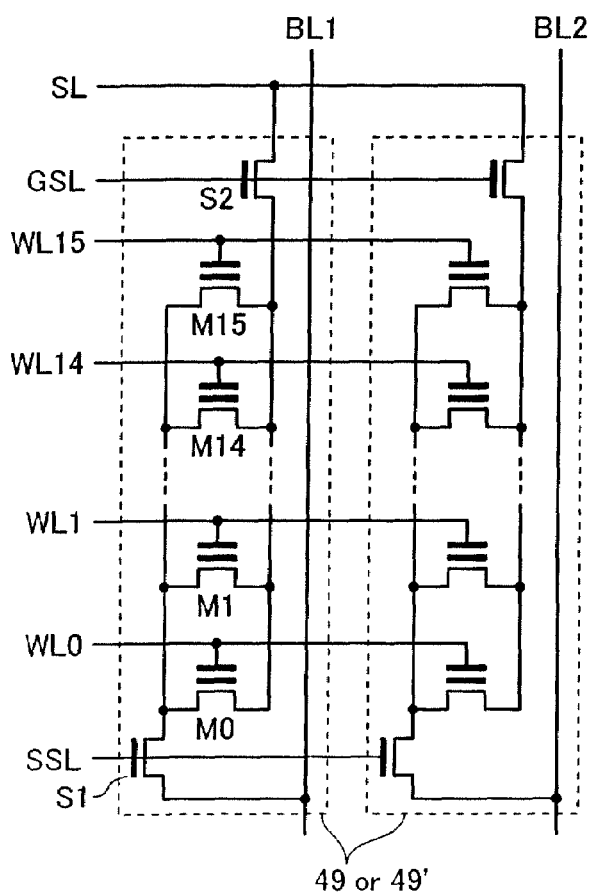
FIG. 33 shows an equivalent circuit of a cell unit of the AND type, which is used in the respective embodiments above.
Figure 34:
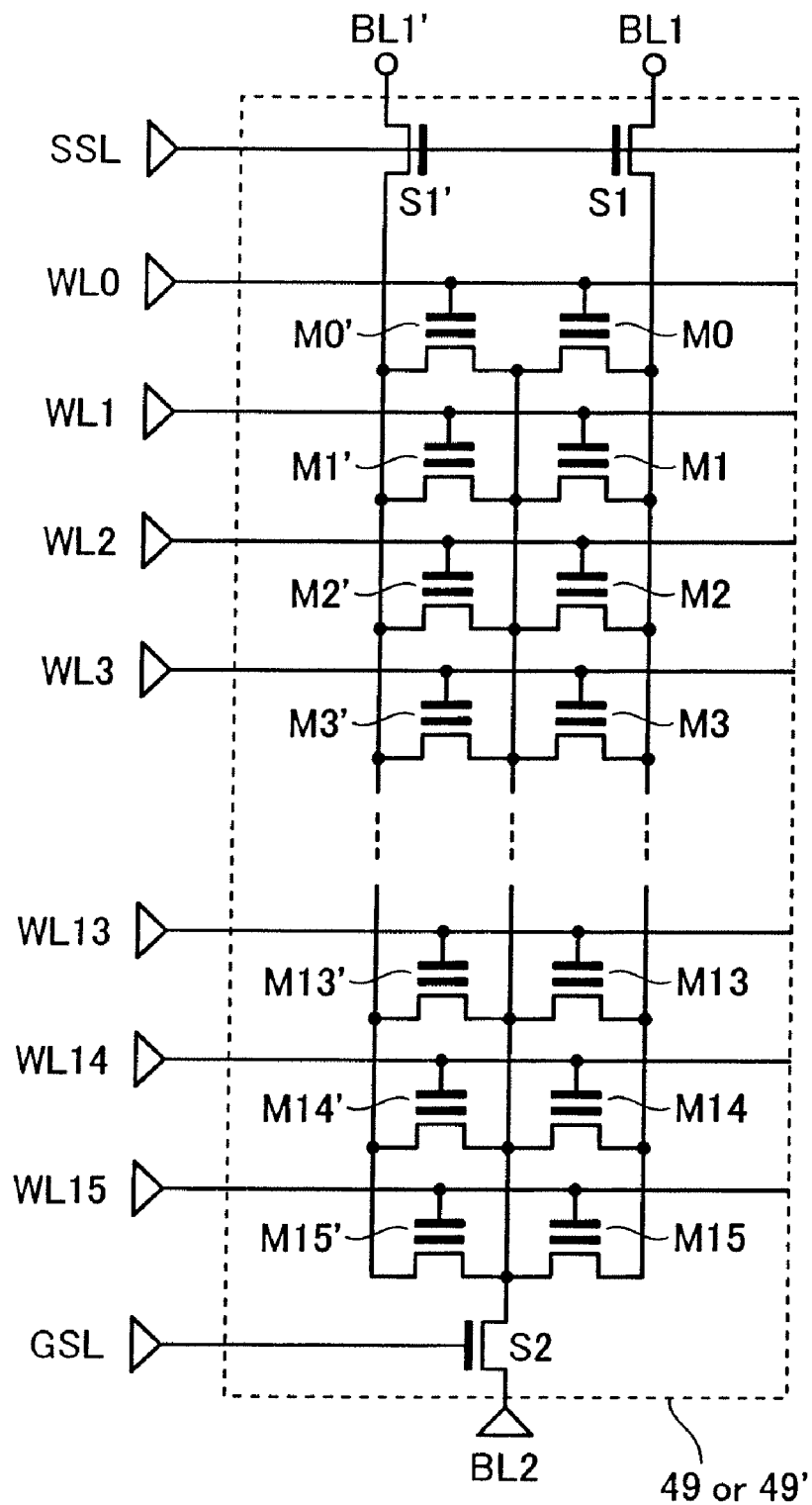
FIG. 34 shows an equivalent circuit of a cell unit of the so-called "virtual ground" type for use in the respective embodiments.

Although the embodiments 1-4 stated above are arranged to make use of the cell units 49 and 49' having NAND cell unit structures, other types of cell units are alternatively employable such as an AND cell unit structure shown in FIG. 33, or a virtual ground type cell unit structure shown in FIG. 34. In the AND type cell unit of FIG. 33, a plurality of memory cells M0-M15 are connected in parallel to have a one end which is connected through a select transistor S1 to a data transfer line BL and a remaining end which is coupled to a source line SL via a select transistor S2. The memory cell structure may be of the floating gate type or the MONOS type. This AND cell unit is less in channel resistance than NAND cell units and, for the very reason, is excellent in threshold voltage stability especially when used for one-cell/multiple-value data storage applications.

The virtual ground type cell unit of FIG. 34 is similar to the AND cell unit, except that memory cells M0-M15 and their associated memory cells M0'-M15' neighboring thereupon in the data select line direction are designed to share sources or drains therebetween. One terminate end of the group of memory cells M0-M15 is connected via a select transistor S1 to a data transfer line BL1; similarly, one end of cells M0'-M15' is coupled by select transistor S1' to a data transfer line BL'. The remaining ends of cells M1-15 and cells M1'-15' are coupled together at a common terminal or node, which is connected via select transistor S2 to a data transfer line BL2. The structure of these memory cells may be of the floating gate type or of MONOS type. With this vertical-ground cell unit, no element isolation region is required between the neighboring memory cells M0-15 and M0'-15', thus enabling achievement of memory cells with higher integration densities. Using this unit cell array arrangement makes it possible to permit two memory cells sharing a source or drain to make a pair for storage of two bits of data per memory cell. Thus a highly integrated EEPROM is obtainable.

These cell unit arrangements of FIGS. 33 and 34 also are similar to NAND cell units in that multiple cell units are laid out along the data select lines WL0-WL15 with wire delay being different in a way depending upon the positions of such cell units. Consequently even in the case of using these cell unit designs, similar effects and advantages to those of the previous embodiments 1 to 3 are obtainable while employing a circuit scheme similar to that of any one of the embodiments 1-3.

Embodiment 5

Figure 29:
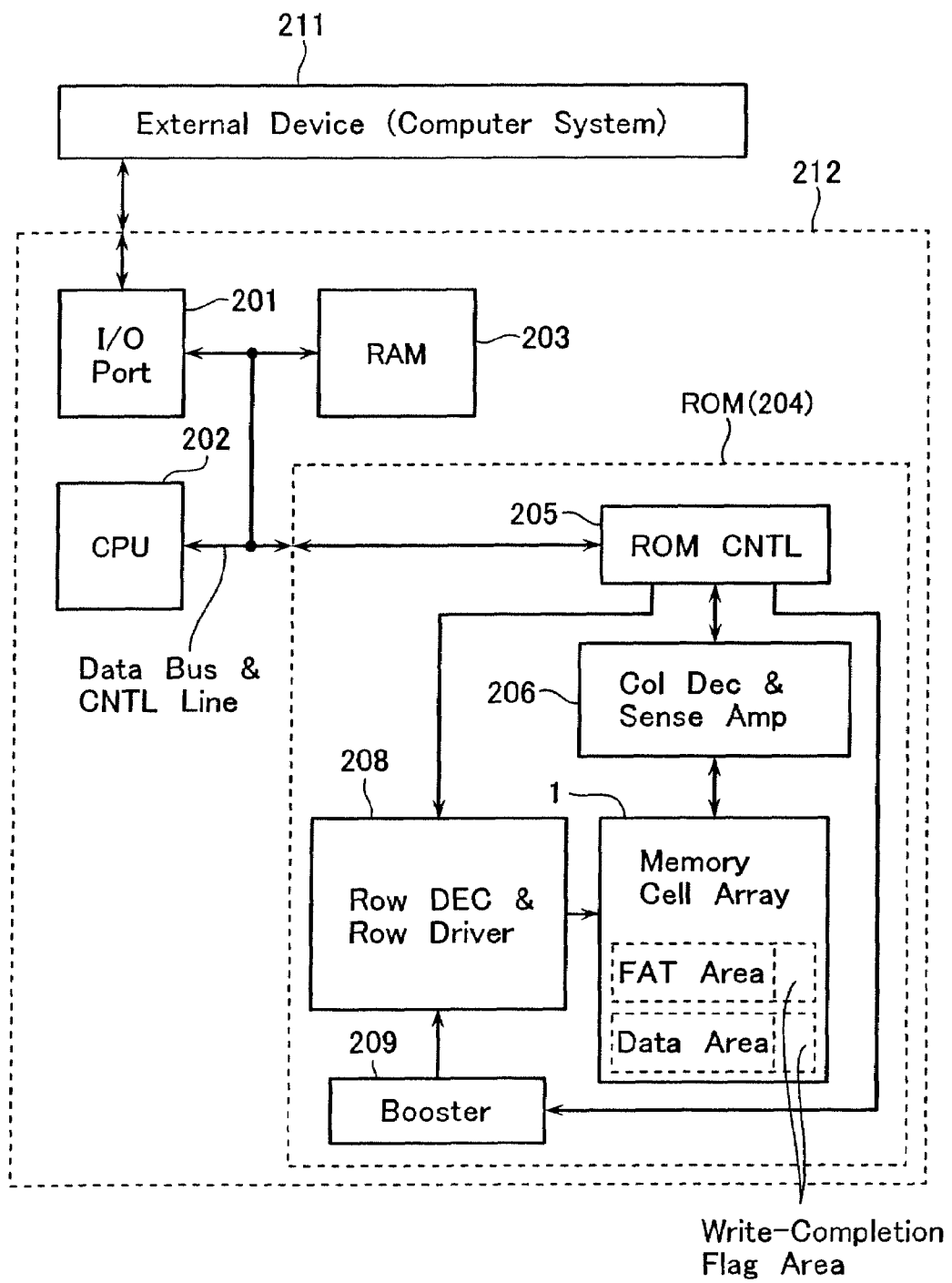
FIG. 29 is a diagram showing a configuration of a file system in accordance with still another embodiment of the invention.

FIG. 29 shows a file system 212, which is an application example of the EEPROM devices of the embodiments stated supra. Practically the file system 212 is, for example, IC card or memory card, which is electrically connectable via an input/output port 201 to an external electronic equipment (input/output system device) 211, such as for example a computer, so that electrical signals are sent and received therebetween for data read/write and erase purposes. This file system 212 includes, in addition to the input/output port 201, a random access memory (RAM) 201 for use as a temporary data storage device, a central processing unit (CPU) 202 for execution of information processing, and a read-only memory (ROM) 204. These components are interconnected together by intra-system control lines to thereby enable data transfer and receipt therebetween.

The ROM 204 is a storage area for storing therein more than one software program as executed by the CPU 202 and also for storing the individual system's identification (ID) number and data, by way of example. In this respect, ROM 204 corresponds to the EEPROM chip as has been described in the embodiments 1-4. ROM 204 has a built-in ROM control circuit 205 which is connected to data buses. This control circuit 205 is a logic circuit operable to receive an instruction as to read, write or erase operations of ROM 204 as given through a data bus or intra-system control line and then perform a presently instructed read, write or erase operation at a specific address(es) designated by the instruction. This ROM control circuit 205 is connected to a column decoder/sense amplifier circuit 206, for decoding an address (es) of a presently designated column and for sending write data of such column or receiving read data thereof. Control circuit 205 may further include therein the error bit correction circuit 5 as explained in the embodiments 1-3. Alternatively, the functionality of error bit corrector circuit 5 is realized by a software program that is stored in CPU 202, RAM 203 or ROM 204. The column decoder/sense amp circuit 206 is connected to a memory cell array 1 via respective data transfer lines.

The ROM control circuit 205 is connected to a row decoder/driver circuit 208. This row decoder/driver 208 is a circuit which decodes a presently designated row address and then applies to a data select line corresponding to the row a potentially raised or "boosted" voltage that is given from a booster circuit 209 at the time of writing, for example. An example of booster circuit 209 has, for example, a charge pump circuit and applies a high voltage to the memory cell array 1. The high voltage is higher in potential than or equal to the power supply voltage and yet lower than or equal to 30V, by way of example. Row decoder/driver 208 is connected to memory cell array 1 via data select lines. Memory cell array 1 has a configuration similar to that of any one of the previously discussed embodiments 1-3, and includes both a file allocation table (FAT) storage area and a data storage area. The FAT area is an area for storage of a table indicative of storage locations (allocations) of the data of file system 212. The data area is for storage of ordinary data. These FAT and data areas each include a flag area for storage of a flag indicative of write completion, which is present within the redundancy cell array area 101 that has been set forth in the embodiments 1-3. Typically the FAT and data areas may be prepared in the area of the normal cell array 100 within the memory cell array 1.

The file system 212 is required to have a small capacity of storage area capable of storing therein at least one sector address, which is for use as an area for storage of a sector counter value and a final sector index as will be described later. Desirably these storage areas are set in either RAM 201 or CPU 202 in view of the need for high-speed read/write operations at shortened intervals while offering enhanced address increment and decrement capabilities. Although not specifically depicted in FIG. 29, the file system 212 is associated with a power supply unit connected thereto, which is under risks of accidental interruption or failure of electrical power supply during file writing. This power shutdown can occur not only when the power supply unit is deficient in supplying ability but also when the file system 212 designed as an IC card or memory card is unplugged while data is being written thereinto.

Figure 30:
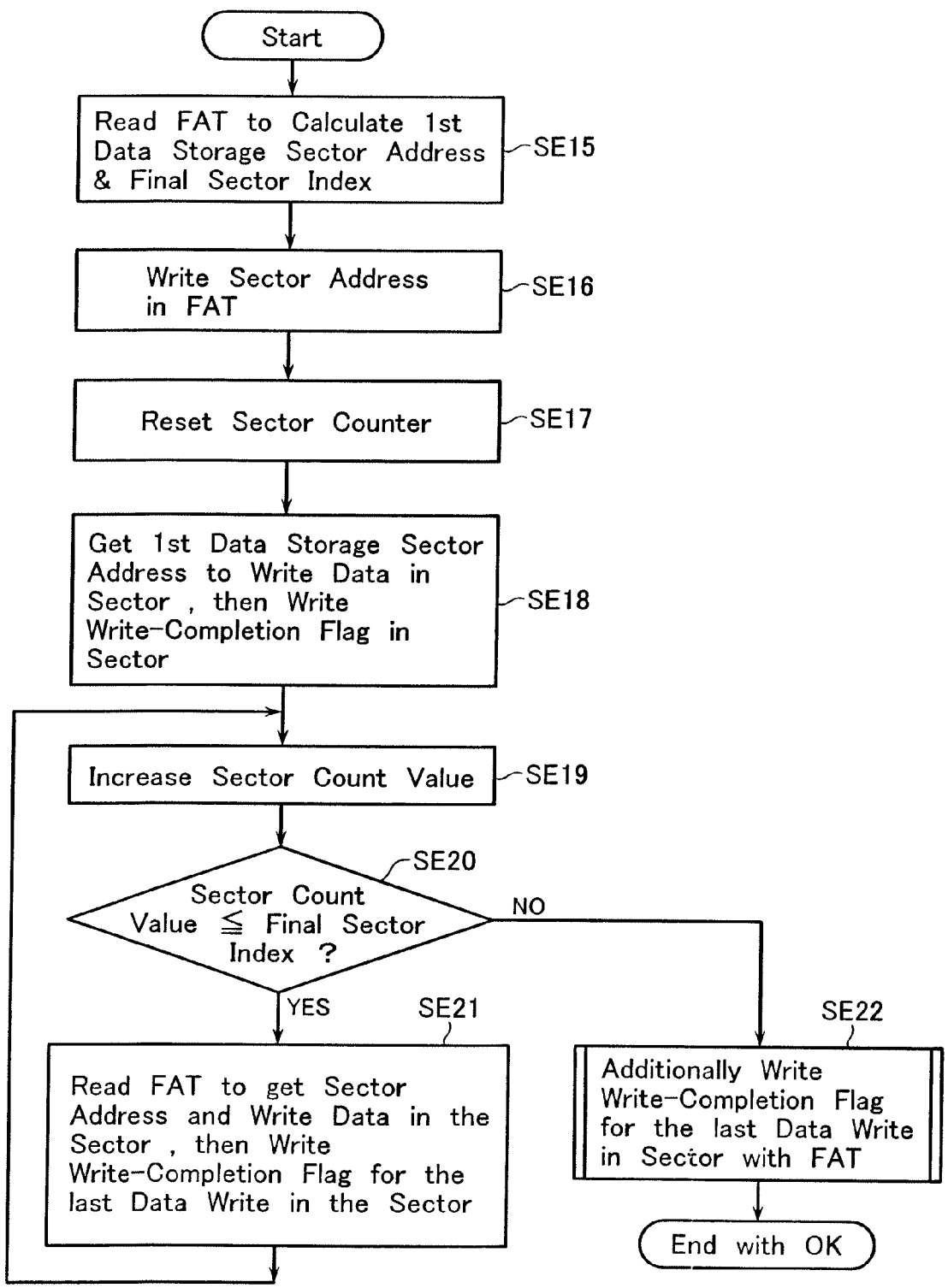
FIG. 30 is a flow chart for explanation of a data write operation of the file system.
Figure 31:
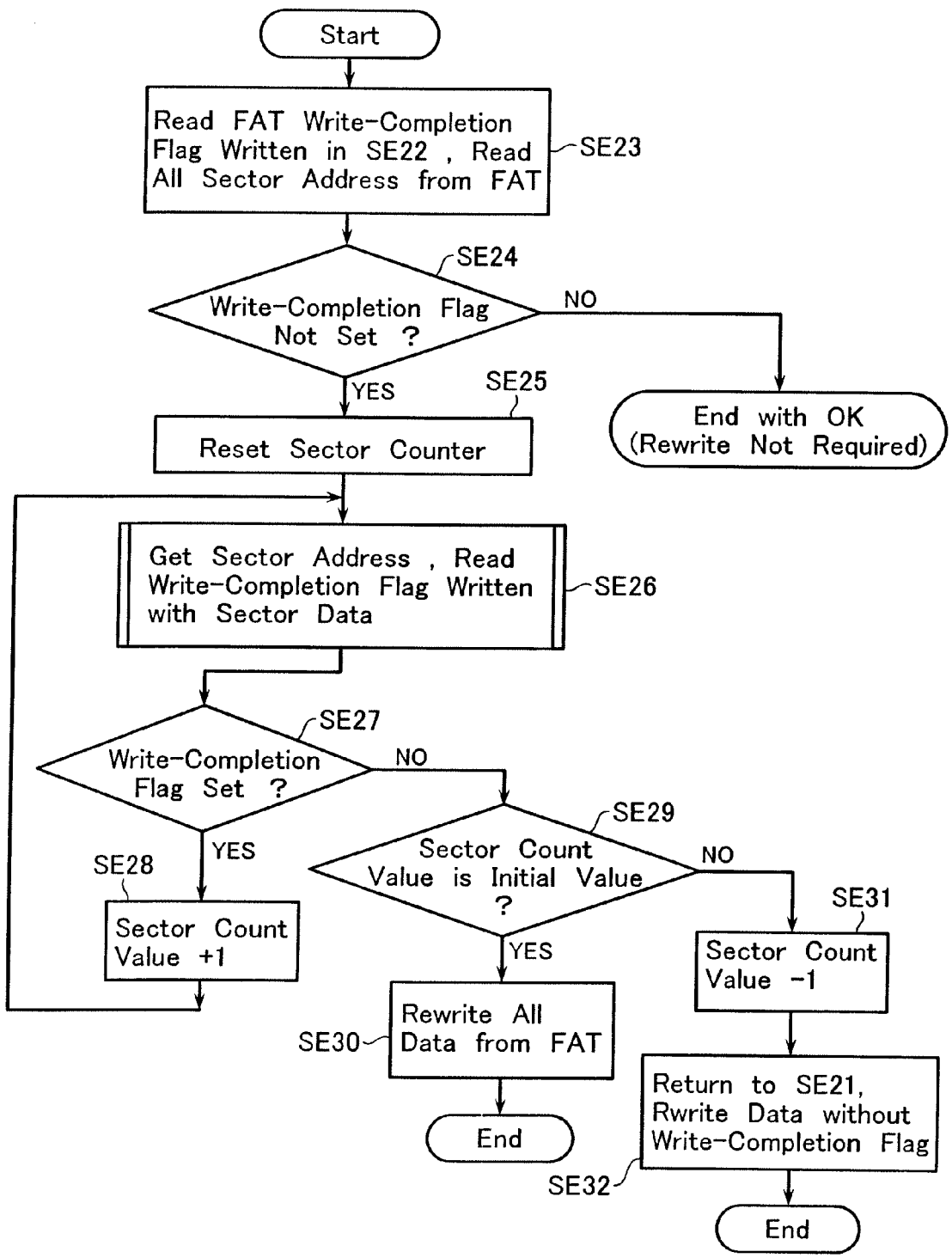
FIG. 31 is a flowchart for explanation of a data rewrite operation of the file system.

Preferably the file system 212 includes a system which enables recovery of a write operation at high speeds even upon occurrence of such power shutdown without accompanying risks of loosing all the data thus written. FIGS. 30 and 31 are flow diagrams showing a data write operation flow including such recovery system. Although these flow charts assume that power supply is shut down resulting in data write being interrupted in mid course, the same goes with other possible events that a presently executed write operation is accidentally interrupted not only due to power loss but also due to accidental runaway or "excursion" of the system software by way of example. It is also assumed here that the data being written has its capacity or size large enough to span a plurality of memory cells to be selected by multiple data select lines, wherein one sector refers to a page of memory cells, that is, certain range of memory cells associated with a single data select line, while the sector counter is a device for storing more than one index indicating that the data of interest is to be written into exactly which one of sectors via which one of the multiple data select lines.

A method for writing or "programming" a large size of data will be explained with reference to FIG. 30. Firstly at step SE15, read the FAT to determine whether a sufficient numbers of additional data writable sectors are present. If the number of sectors is sufficient, then obtain the address of a sector for storage of the first or "head" part of data. In addition, divide a write data amount by a per-page memory cell capacity to thereby calculate a final sector index. Further, here, perform calculations to obtain the addresses of a plurality of sectors used to store all of the data.

Then, at step SE16, write into the FAT all the addresses of the data-written sectors calculated at step SE15. At this time, let the write completion flag area in the same sector as FAT maintain a state that it does not hoist any flag indicative of write completion. Thereafter, at step SE17, reset the sector counter at its initial value. Then at step SE18, perform data write at the sector address that is specified to store the first data as obtained at step SE15.

Simultaneously write a write completion flag concerning the FAT writing as done at step SE16 into the flag area of a page to be selected in this data write event. In this way, by writing the flag indicative of write completion of an immediately previous FAT writing simultaneously at the time of writing into the data area, it is possible to shorten the write time required. In case where a power shut down occurs prior to successful completion of the process at this step SE18, simply perform re-writing from step SE15—that is, return to step SE15 and then repeat the write procedure stated above—because of the absence of any flags indicative of write completion. A detailed process flow of such rewrite procedure will be later described with reference to FIG. 31.

Then, increase the sector counter by one in value (at step SE19), and determine whether the sector counter value is less than or equal to the final sector index (step SE20). If YES then read the FAT and next write the data of a corresponding sector into a sector address which stores the data that the sector counter indicates (step SE21). Simultaneously at the time of this data writing, write into the flag area of a selected page a flag indicative of write completion in the last data write event. Whereby, it is possible to shorten a time taken to write the flag area and the data area. The FAT area readout at this step SE21 is modifiable so that the FAT data as has been read at step SE15 is temporarily stored for example in the RAM 203 or in a register within the CPU 202, and thereafter such FAT data is read. Whereby the read time is shortened.

After completion of step SE21, return to step SE19. In case the power supply is shut down within a time period of from the completion of step SE18 to the end of step SE21, simply perform rewriting of certain part of the data without associating a write completion flag, because writing of the FAT per se is completed. A detailed flow of this rewrite routine will be explained later with reference to FIG. 31. If NO at step SE20, that is, when it is determined that the sector counter exceeds the final sector index, go to step SE22 which writes a write complete flag concerning the last data write into the write completion flag storage area in the same sector as the FAT. This sequence of step SE22 is one that selectively writes data in the write completion flag area within the redundancy cell array area 101; thus, it is possible to achieve high-speed write as has been explained in the embodiments 1-3. When step SE22 is ended successfully, determine that the write is completed successfully.

As apparent from the foregoing, in the data write method of FIG. 30, an increase in write time and in write execution number is merely equivalent to that of a single sector of the sequence of step SE22 when compared to the case of writing no write completion flags. Thus it is possible to significantly reduce the entire write time period in comparison with the case of writing the write completion flag and the data separately. In other words, according to the embodiment, the data rewrite operation after power stopping is done in a shorter time in comparison with that after the normal data erasure.

An explanation will next be given of what is called the "verify check" method is shown in FIG. 31. This verify-check method is for making an examination to determine whether rewrite is necessary or not after having written the above-noted large size of data and then performing rewriting if necessary. Firstly at step SE23, read the FAT to thereby read out the addresses of a plurality of sectors for storage of the entirety of the data being written. Simultaneously, read the write completion flag which is present at the same sector as FAT and which has been written at step SE22. Next at step SE24, determine whether the write completion flag of step SE23 is set. When this flag is set, it indicates that all the sectors are written successfully. Thus, let the procedure end with success. On the contrary, when no flag is set, this indicates that abnormal interruption occurred in the middle of the write sequence of FIG. 30. If this is the case, go to step SE25 which resets the sector counter at its initial value.

Next at step SE26, acquire the address of a sector for storage of the first data which was obtained at step SE23 and then read this sector's write completion flag. This write completion flag is one as set at step SE18. This step SE26 sequence is selective readout with respect to the write completion flag storage area that is present within the redundant cell array area 101, and there is no need to read the normal cell array 100. Thus, as explained in the embodiments 1-3, it is possible to read at high speeds, which in turn makes it possible to shorten the read time. In addition, the sector address acquisition in the FAT as required at step SE26 is achievable by letting the FAT data that was read out at step SE23 be temporarily stored for example in RAM 203 or the register within CPU 202 and then reading such FAT data at a later stage. Thus it is possible to shorten the FAT read time.

Next at step SE27, determine whether the write completion flag at step SE26 is presently set or not. When the flag is set, it indicates that writing of the corresponding sector is completed. If this is the case, go to step SE28 which increases the sector counter by one (1) in value. Then return to step SE26 which reads the write completion flag of a sector for storage of the next data. If at step SE27 it is determined that any write completion flag is not set yet, this suggests that abnormal interruption occurs in mid course of the write sequence of FIG. 30. In this case, go to step SE29 to determine whether the sector counter is at the initial value thereof. In case the sector counter is at the initial value, this indicates that the FAT data write is not completed and abnormal interruption occurs in the process up to step SE18. Accordingly, perform rewriting of all data from FAT in accordance with the flow of FIG. 30. When the sector counter is not at the initial value, proceed to step SE31 which reduces the sector counter by one (1), and then set it at the index of a sector which experienced abnormal interruption of data write. Then at step SE32, return to step SE21 of FIG.

30 for performing data rewrite from the sector at which the intended data write is abnormally ended.

Additionally in flash EEPROM chips which are designed to write data into the memory cells of a sector in parallel after all of these cells having been erased at a time, when an abnormal end occurs in the middle of a write cycle of such sector, at least one or some of the cells to be written with logic "0" data stay in write deficient states, whereas erased cells ("1" data) remain in the erased state. In view of this, it is no longer required to again erase the sector that experienced the interruption of a write operation. What is need here is to simply perform an additional write operation from such sector. This enables data recovery at high speeds. Especially this feature is effective in cases where the erase time is longer than the write time of memory cells as connected to a single data select line.

In this embodiment, the IC card file system 212 is modifiable into the form of a mixed-mount or "hybrid" integrated circuit, which permits the CPU 202 and RAM 203 also to be integrated together on the same semiconductor substrate of the integrated internal circuitry of ROM 204 indicated by broken lines in FIG. 29, by way of example. Even when low voltage operable CPU 202 and RAM 203 are laid out adjacent to the row decoder/driver circuit 208 and column decoder/sense amp circuit 206, there are no risks of punch-through phenomena. Accordingly the use of such hybrid IC architecture makes it possible to realize IC chips with ultra-high integration densities.

Embodiment 6

Figure 40:
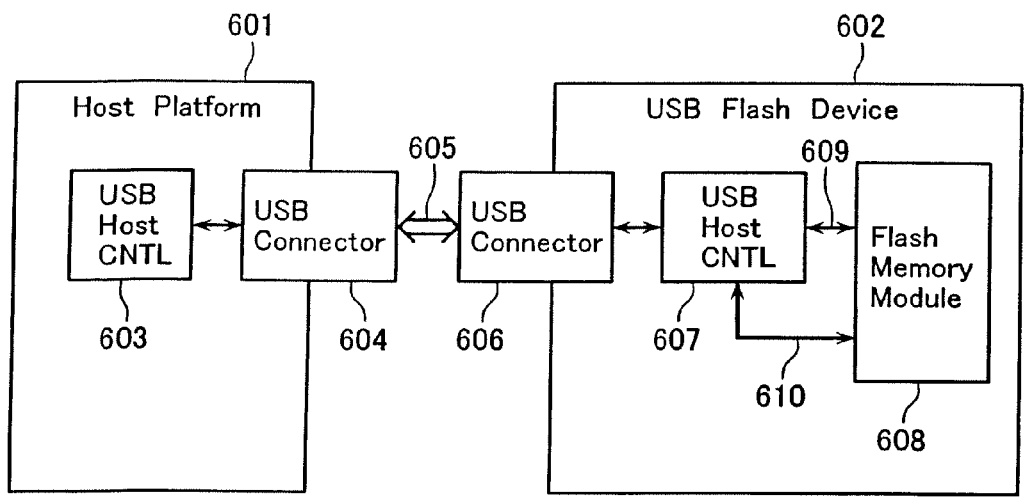
FIG. 40 is a diagram showing a configuration of a flash memory system in accordance with a further embodiment of the invention.
Figure 41:
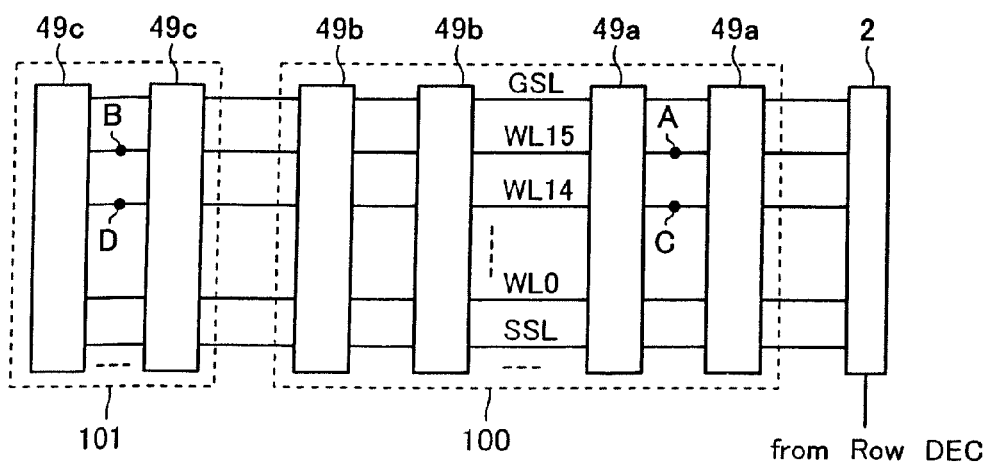
FIG. 41 is a diagram showing an arrangement of a cell block for explanation of an operation of one prior known EEPROM chip.

FIG. 40 shows a flash memory system, which is another application example of the EEPROM chip incorporating the principles of any one of the embodiments 1-4 stated supra. This flash memory system is generally made up of a host platform 601 and its associated universal serial bus (USB) flash device 602. The host platform 601 is connected to the USB flash device 602 through a USB cable 605. Host platform 601 is connected by a USB host connector 604 to USB cable 605. USB flash device 602 is connected to USB cable 605 via a USB flash device connector 606.

The host platform 601 has a USB host controller 603 for controlling packet data transmission over a USB bus(es). The USB flash device 602 has at least one flash memory module 608 and a USB flash device controller 607 which controls this module 608 and also controls an interface relative to the USB bus of USB flash device 602. It is the flash memory module 608 that includes the EEPROM chip as has been explained in the embodiments 1-4.

When the USB flash device 602 is plugged and connected to the host platform 601, standard USB enumeration or "list-up" processing gets started. In this processing, host platform 601 recognizes USB flash device 602 and selects an appropriate mode for communication with USB flash device 602 and then performs data transfer/receive operations between itself and USB flash device 602 via a first-in/first-out (FIFO) buffer for storage of transfer data, called "endpoint". Host platform 601 recognizes via another endpoint a change in physical and electrical states, such as plugging or unplugging of USB flash device 602, and receives a packet or packets relevant thereto, if any.

The host platform 601 generates and sends a request packet toward the USB host controller 603 to request services from the USB flash device 602. USB host controller 603 sends forth the packet onto USB cable 605. If USB flash device 602 is a device which has the endpoint that accepted this request packet, then these requests are to be received and accepted by USB flash device controller 607.

The USB flash device controller 607 performs various operations which include reading data out of the flash memory module 608, writing data into flash memory module 608, and erasing the data. In addition, flash device controller 607 supports basic USB functions such as USB address acquisition or else. Controller 607 controls flash memory module 608 by sending several signals—including control signals such as chip enable/CE and others, a read enable signal, and a write enable signal—via a control line 609 for control of an output of flash memory module 608.

The flash memory module 608 is connected to the USB flash device controller 607 via an address/data bus 610 also. The address/data bus 610 is used to transfer a read, write or erase command with respect to flash memory module 608 and also addresses and data of this module 608.

In order to notify the host platform 601 of a result and state with respect to various operations as requested from host platform 601, the USB flash device 602 transfers thereto a status packet by using a status endpoint (endpoint 0). In this processing, host platform 601 checks whether the status packet is present or not (poling), while USB flash device 602 returns a vacant packet(s) or alternatively the status packet per se in cases where any new state message packets are absent.

It is apparent from the description above that in accordance with this embodiment, it is possible to implement various kinds of functions of the USB flash device, which is one application example of the EEPROM chip embodying the invention. Optionally it is also possible to eliminate use of the USB cable 605 so that the connectors 604 and 606 are directly connected together.

This invention should not exclusively be limited to the illustrative embodiments 1-6 stated above, and may be modified and altered in a variety of different forms as will be exemplified below.

For fabrication of element isolation dielectric films and interlayer dielectric films, it is possible to employ, in addition to methods for converting silicon into either silicon oxide films or silicon nitride films, methods for doping or injecting oxygen ions into deposited silicon or alternatively methods for oxidizing deposited silicon, by way of example.

In the case of the MONOS type memory cells, the charge storage layer 126 may be formed of $TiO_2$, $Al_2O_3$ or tantalum oxide film, a strontium titanate film, a barium titanate film, a zirconium titanate lead film, or a multilayer film using a mixture of more than two of these materials. The charge storage layer 126 is modifiable so that it is separated between the source and drain or alternatively is formed to have a dot-like pattern.

Although in the above embodiments the semiconductor substrate 121 is a p-type silicon (Si) substrate, the substrate 121 may be replaced with any other silicon-containing single-crystal semiconductor substrates, such as an n-type Si substrate, silicon-on-insulator (SOI) substrate, SiGe mixed-crystal substrate, SiGeC mixed-crystal substrate, or any equivalents thereto.

Although in the above-noted embodiments the floating gate type memory cells and MONOS type memory cells are both designed to have the n-channel type, p-channel type memory cells on an n-type well region are alternatively employable. In such case, their source and drain are of the p conductivity type, with the doping impurity or "dopant" of As, P or Sb being replaced by either one of In and B.

For the gates 126 and 127, it is possible to use, in addition to the polysilicon (poly-Si), other materials including but not limited to SiGe mixed-crystal, SiGeC mix-crystal materials or alternatively a multilayer structure of a mixture of more than two of them. It is also possible to make use of amorphous Si, amorphous SiGe mix-crystal, or amorphous SiGeC mix-crystal materials or a multilayer structure thereof. Note however that these gates are desirably made of semiconductor materials or Si-contained semiconductors in view of the fact that if so then excellent sidewall dielectric films are manufacturable by oxidation or oxi-nitriding techniques. Optionally a silicide film may be formed on or above gate electrode surfaces by chemical reaction with a chosen metal such as Ti, Co, Ni, Mo, Pd, Pt or else.

Although the respective embodiments are drawn to specific examples which read and write the redundancy cell array area 101 at high speeds, similar high-speed read and write schemes are also applicable to any storage areas or memory regions that require high-speed read and write, such as the file allocation table (FAT) area that is set within the normal cell array 100.

The memory cells should not be limited only to two-value storage cells, and this invention is also effective in cases where multiple-value storable cells are used for storing in each cell more than three values of digital data while using a plurality of threshold voltage levels. In the case of such per-cell multivalue storage, a distance or interval between adjacent ones of the plurality of data threshold levels becomes narrower than two-value storage cells, resulting in the stability of a read voltage for threshold voltage measurement becoming more severe. If this is the case, the present invention may offer maximized advantages more demonstrably. In this respect, note that the multiple threshold voltages per memory cell are generally defined as $2^n$ values. This is desirable because the resultant information data decoding procedure is simplified.

What is claimed is:

1. A semiconductor memory device comprising:
   a memory cell array having a plurality of data select lines disposed in parallel with each other, a plurality of data transfer lines disposed in parallel with each other to intersect said data select lines, and electrically rewritable non-volatile memory cells laid out at cross portions between said data select lines and data transfer lines;
   a data select line driver for driving said data select lines of said memory cell array;
   a sense amplifier circuit connected to said data transfer lines of said memory cell array, for performing data read of memory cells selected by one of said data select lines; and
   a control circuit used for timing control of data read of said memory cell array, for outputting at least two types of timing signals,
   wherein said device has a data write mode for writing data into selected memory cells, said data write mode including a verify-read operation for verifying a write state,
   said memory cell array is divided into at least one first area and at least one second area in the direction of said data select lines in such a way that these areas are simultaneously selected by one of said data select lines,
   said control circuit has a first timing circuit for outputting a timing signal necessary for performing data read of said first and second areas simultaneously selected by one of said data select lines within a first cycle time and a second timing circuit for outputting a timing signal necessary for performing data read of at least said second area within a second cycle time shorter than said first cycle time,
   said data select line driver is disposed at an end portion of said data select lines in close proximity to said second area, and
   each of said first and second areas in said memory cell array includes a NAND type cell unit including a plurality of said memory cells connected in series and a select gate transistor connected to said data transfer line, the number of said memory cells in said NAND cell unit in said first area being equal to that in said second area.

2. The semiconductor memory device according to claim 1, wherein
   said device has at least two data read modes with different minimum cycle times necessary for continuously reading out plural columns of said memory cell array.

3. The semiconductor memory device according to claim 1, wherein
   said second area serves as at least one of a memory cell area for replacement of a memory cell in said first area, an ECC record area for recording an error correction code of data to be written into said first area, and a flag area for storing a full erase state and/or a write state of said first area.

4. The semiconductor memory device according to claim 1, wherein
   the number of data bits "n" to be read or written via an input/output port satisfy a relationship of $2^{m-1}-m<n\leq 2^m-m-1$ (where, "m" is a natural number), at least (n+m) memory cells being laid out in the direction of said data select lines.

5. The semiconductor memory device according to claim 1, wherein
   a period necessary for charging or discharging said data select lines in said second cycle time is shorter than that in said first cycle time.

6. The semiconductor memory device according to claim 5, wherein
   said NAND type cell units are driven by different data select lines respectively.

7. The semiconductor memory device according to claim 5, wherein
   said device has at least two data read modes with different minimum cycle times necessary for continuously reading out plural columns of said memory cell array.

8. The semiconductor memory device according to claim 5, wherein
   said second area serves as at least one of a memory cell area for replacement of a memory cell in said first area, an ECC record area for recording an error correction code of data to be written into said first area, and a flag area for storing a full erase state and/or a write state of said first area.

9. The semiconductor memory device according to claim 5, wherein
   the number of data bits "n" to be read or written via an input/output port satisfy a relationship of $2^{m-1}-m<n\leq 2^m-m-1$ (where, "m" is a natural number), at least (n+m) memory cells being laid out in the direction of said data select lines.

10. A semiconductor memory device comprising:
    a memory cell array having a plurality of data select lines disposed in parallel with each other, a plurality of data transfer lines disposed in parallel with each other to intersect said data select lines, and electrically rewritable non-volatile memory cells laid out at cross portions between said data select lines and data transfer lines;

a data select line driver for driving said data select lines of said memory cell array;

a sense amplifier circuit connected to said data transfer lines of said memory cell array, for performing data read of memory cells selected by one of said data select lines; and a control circuit used for timing control of data read of said memory cell array, for outputting at least two types of timing signals, wherein said device has a data write mode for writing data into selected memory cells, said data write mode including a verify-read operation for verifying a write state, said memory cell array is divided into at least two first areas and at least one second area interposed between said first areas in the direction of said data select lines in a way that these areas are simultaneously selected by one of said data select lines, said data select line driver includes parts alternately disposed at opposite end portions of said data select lines in units of said cell blocks, said control circuit has a first timing circuit for outputting a timing signal necessary for performing data read of said first and second areas simultaneously selected by one of said data select lines within a first cycle time and a second timing circuit for outputting a timing signal necessary for performing data read of at least said second area within a second cycle time shorter than said first cycle time, and each of said first and second areas in said memory cell array includes a NAND type cell unit including a plurality of said memory cells connected in series and a select gate transistor connected to said data transfer line, the number of said memory cells in said NAND cell unit in said first area being equal to that in said second area.

11. The semiconductor memory device according to claim 10, wherein
said device has at least two data read modes with different minimum cycle times necessary for continuously reading out plural columns of said memory cell array.

12. The semiconductor memory device according to claim 10, wherein
said second area serves as at least one of a memory cell area for replacement of a memory cell in said first area, an ECC record area for recording an error correction code of data to be written into said first area, and a flag area for storing a full erase state and/or a write state of said first area.

13. The semiconductor memory device according to claim 10, wherein
the number of data bits "n" to be read or written via an input/output port satisfy a relationship of $2^{m-1}-m<n\leq2^{m}-m-1$ (where, "m" is a natural number), at least (n+m) memory cells being laid out in the direction of said data select lines.

14. The semiconductor memory device according to claim 10, wherein
a period necessary for charging or discharging said data select lines in said second cycle time is shorter than that in said first cycle time.

15. The semiconductor memory device according to claim 14, wherein
said device has at least two data read modes with different minimum cycle times necessary for continuously reading out plural columns of said memory cell array.

16. The semiconductor memory device according to claim 14, wherein
said second area serves as at least one of a memory cell area for replacement of a memory cell in said first area, an ECC record area for recording an error correction code of data to be written into said first area, and a flag area for storing a full erase state and/or a write state of said first area.

17. The semiconductor memory device according to claim 14, wherein the number of data bits "n" to be read or written via an input/output port satisfy a relationship of $2^{m-1}-m<n\leq2^{m}-m-1$ (where, "m" is a natural number), at least (n+m) memory cells being laid out in the direction of said data select lines.

* * * * *